United States Patent
Taguchi

(10) Patent No.: US 11,776,977 B2
(45) Date of Patent: Oct. 3, 2023

(54) LAMINATE AND SOLID-STATE IMAGING ELEMENT

(71) Applicant: FUJIFILM Corporation, Tokyo (JP)

(72) Inventor: Yoshinori Taguchi, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 658 days.

(21) Appl. No.: 16/794,365

(22) Filed: Feb. 19, 2020

(65) Prior Publication Data

US 2020/0183051 A1    Jun. 11, 2020

Related U.S. Application Data

(63) Continuation of application No. PCT/JP2018/033005, filed on Sep. 6, 2018.

(30) Foreign Application Priority Data

Sep. 26, 2017  (JP) ................. 2017-184683

(51) Int. Cl.
*H01L 27/146* (2006.01)
*C08J 7/04* (2020.01)
*G02B 5/20* (2006.01)

(52) U.S. Cl.
CPC ...... *H01L 27/14621* (2013.01); *C08J 7/0423* (2020.01); *G02B 5/201* (2013.01)

(58) Field of Classification Search
CPC ......... H01L 27/14621; H01L 27/14623; H01L 27/14627; C08J 7/0423; G02B 1/04; G02B 3/00; G02B 5/00; G02B 5/20; G02B 5/201; B32B 7/02; H04N 9/07
See application file for complete search history.

(56) References Cited

U.S. PATENT DOCUMENTS

| 2012/0104529 | A1* | 5/2012 | Tanaka | ................ C09B 67/0033 |
| | | | | 430/7 |
| 2014/0339523 | A1* | 11/2014 | Fukagawa | ............... H10K 50/84 |
| | | | | 257/40 |
| 2015/0009552 | A1* | 1/2015 | Kitazawa | ............... G02B 5/201 |
| | | | | 359/296 |
| 2016/0343753 | A1* | 11/2016 | Asatsuma | ......... H01L 27/14685 |
| 2017/0317132 | A1* | 11/2017 | Hatakeyama | .......... G02B 5/223 |
| 2018/0120485 | A1 | 5/2018 | Oota et al. | |

(Continued)

FOREIGN PATENT DOCUMENTS

| JP | 61-77007 A | 4/1986 |
| JP | 9-090118 A | 4/1997 |

(Continued)

OTHER PUBLICATIONS

Communication dated Sep. 8, 2020, from the Japanese Patent Office in Application No. 2019-544500.

(Continued)

*Primary Examiner* — Kyoung Lee
*Assistant Examiner* — Christina A Sylvia
(74) *Attorney, Agent, or Firm* — Sughrue Mion, PLLC

(57) ABSTRACT

A laminate includes a colored layer and a light attenuating layer, in which the colored layer and the light attenuating layer are laminated, and a difference $\Delta T_1$ between a maximum value and a minimum value of light transmittance of the light attenuating layer in a wavelength range of 400 to 700 nm is 10% or less.

28 Claims, 7 Drawing Sheets

(56) References Cited

U.S. PATENT DOCUMENTS

| | | | |
|---|---|---|---|
| 2018/0308883 A1* | 10/2018 | Yanagita | ........... H01L 27/14645 |
| 2019/0041559 A1 | 2/2019 | Higashitani et al. | |
| 2021/0233947 A1* | 7/2021 | Zang | ................. H01L 27/14605 |

FOREIGN PATENT DOCUMENTS

| | | | |
|---|---|---|---|
| JP | 2001-267543 A | 9/2001 | |
| JP | 2002-189238 A | 7/2002 | |
| JP | 2003-309857 A | 10/2003 | |
| JP | 2004-145054 A | 5/2004 | |
| JP | 2006-017832 A | 1/2006 | |
| JP | 2009-055273 A | 3/2009 | |
| JP | 2009-157273 A | 7/2009 | |
| JP | 2010-204154 A | 9/2010 | |
| JP | 2013-145405 A | 7/2013 | |
| JP | 2014-111734 A | 6/2014 | |
| JP | 2015-87409 A | 5/2015 | |
| JP | 2017-084892 A | 5/2017 | |
| TW | 201727267 A | 8/2017 | |
| WO | 2014/069544 A1 | 5/2014 | |
| WO | 2015/146253 A1 | 10/2015 | |
| WO | 2016/186050 A1 | 11/2016 | |
| WO | 2017/138370 A1 | 8/2017 | |

OTHER PUBLICATIONS

Communication dated Apr. 13, 2021 in Japanese Application No. 2019-544500.

Office Action dated Jun. 28, 2022 in Taiwanese Application No. 107132658.

International Search Report dated Nov. 13, 2018 from the International Searching Authority in International Application No. PCT/JP2018/033005.

International Preliminary Report on Patentability dated Mar. 31, 2020 from the International Bureau in International Application No. PCT/JP2018/033005.

Written Opinion dated Nov. 13, 2018 from the International Bureau in International Application No. PCT/JP2018/033005.

Office Action dated Nov. 29, 2022 in Japanese Application No. 2021-179514.

Notification of Reasons for Refusal dated Apr. 25, 2023 from the Japanese Patent Office in application No. 2021-179514.

* cited by examiner

LAMINATE AND SOLID-STATE IMAGING ELEMENT

CROSS-REFERENCE TO RELATED APPLICATIONS

This application is a Continuation of PCT International Application No. PCT/JP2018/033005 filed on Sep. 6, 2018, which claims priority under 35 U.S.C § 119(a) to Japanese Patent Application No. 2017-184683 filed on Sep. 26, 2017. Each of the above application(s) is hereby expressly incorporated by reference, in its entirety, into the present application.

BACKGROUND OF THE INVENTION

1. Field of the Invention

The present invention relates to a laminate and a solid-state imaging element.

2. Description of the Related Art

A charge-coupled device (CCD) image sensor, a complementary metal-oxide semiconductor (CMOS) image sensor, or the like is a solid-state imaging element in which a plurality of pixels each having a photoelectric converter portion are two-dimensionally arranged. As a solid-state imaging element having a wide dynamic range, it is disclosed in JP2017-084892A that "an image pick-up apparatus includes: a pixel array unit, a plurality of unit pixels being disposed in the pixel array unit, the unit pixels including a first opto-electronic converter, and a second opto-electronic converter having a sensitivity lower than a sensitivity of the first opto-electronic converter, the second opto-electronic converter including a light-blocking film formed on a side of the second opto-electronic converter from which light enters the second opto-electronic converter.".

SUMMARY OF THE INVENTION

The present inventors have studied the image pick-up apparatus described in JP2017-084892A, and found and clarified that there is a problem in which color reproducibility of an obtained image is not sufficient.

For this reason, an object of the present invention is to provide a laminate from which an image having excellent color reproducibility is obtained in a case of applying the laminate to a solid-state imaging element. Another object of the present invention is to provide a solid-state imaging element.

As a result of intensive studies to solve the above described problems, the present inventors have found that the above described problems can be solved by the following constitution.

[1] A laminate comprising: a colored layer and a light attenuating layer laminated to each other, in which a difference $\Delta T_1$ between a maximum value and a minimum value of light transmittance of the light attenuating layer is 10% or less in a wavelength range of 400 to 700 nm.

[2] A laminate comprising: a colored layer and a light attenuating layer laminated to each other, the colored layer is at least one selected from the group consisting of a green colored layer, a red colored layer, a blue colored layer, a cyan colored layer, a magenta colored layer, and a yellow colored layer; and the light attenuating layer contains an inorganic pigment and a colorant different from the inorganic pigment.

[3] The laminate according to [2], in which a difference $\Delta T_1$ between a maximum value and a minimum value of light transmittance of the light attenuating layer in a wavelength range of 400 to 700 nm is 10% or less.

[4] The laminate according to [1] or [3], in which the difference $\Delta T_1$ is 6.0% or less.

[5] The laminate according to any one of [1] to [4], in which a difference $\Delta T_2$ between a maximum value and a minimum value of light transmittance of the light attenuating layer in a wavelength range of 700 to 1000 nm is 10% or less.

[6] The laminate according to [5], in which the difference $\Delta T_2$ is 6.0% or less.

[7] The laminate according to any one of [1] to [6], in which light transmittance of the light attenuating layer at a wavelength of 550 nm is 5.0% to 75%.

[8] The laminate according to [7], in which light transmittance of the light attenuating layer at a wavelength of 550 nm is 5.0% to 20%.

[9] The laminate according to any one of [1] to [8], in which the light attenuating layer contains an inorganic pigment and a colorant different from the inorganic pigment.

[10] The laminate according to [9], in which the inorganic pigment is at least one selected from the group consisting of nitride containing at least one of metal selected from the group consisting of Ti, Zr, Hf, V, Nb, and Ta; oxide containing the metal; and oxynitride containing the metal.

[11] The laminate according to [10], in which the inorganic pigment is at least one selected from the group consisting of titanium nitride, titanium oxynitride, and zirconium oxynitride.

[12] The laminate according to [10] or [11], in which the colorant is a carbon black or an organic pigment, and the organic pigment is at least one selected from the group consisting of a yellow pigment, a violet pigment, an orange pigment, and a red pigment.

[13] The laminate according to [12], in which the organic pigment is a yellow pigment and a violet pigment.

[14] A solid-state imaging element comprising: a plurality of disposed unit pixels, in which each of the unit pixels has a first photoelectric converter portion and a second photoelectric converter portion, and the laminate according to any one of [1] to [13] is disposed on a side of the first photoelectric converter portion to which light is incident.

[15] The solid-state imaging element according to [14], in which the first photoelectric converter portion is less sensitive than the second photoelectric converter portion.

[16] The solid-state imaging element according to [15], in which a lens for condensing incident light is not formed on the first photoelectric converter portion.

[17] The solid-state imaging element according to any one of [14] to [16], further comprising: a second laminate in which a colored layer and a transparent layer are laminated, in which the second laminate is disposed on a side of the second photoelectric converter portion to which light is incident.

[18] The solid-state imaging element according to [17], in which each of the light attenuating layer and the transparent layer contains the same resin selected from the group consisting of a methacrylic resin, an acrylic resin, a phenol resin, a melamine resin, an epoxy resin, a urea resin, an unsaturated polyester resin, and an alkyd resin.

[19] The solid-state imaging element according to any one of [14] to [18], in which an area of the unit pixels having the second photoelectric converter portion is larger than an area of the unit pixels having the first photoelectric converter portion.

[20] The solid-state imaging element according to any one of [14] to [19], in which a ratio of a total area of the unit pixels in which the laminate is disposed to a total area of the unit pixels included in the solid-state imaging element is in a range of 5.0% to 30%.

[21] The solid-state imaging element according to any one of [14] to [20], in which each of the colored layer and the light attenuating layer contains the same resin selected from the group consisting of a methacrylic resin, an acrylic resin, a phenol resin, a melamine resin, an epoxy resin, a urea resin, an unsaturated polyester resin, and an alkyd resin.

[22] The solid-state imaging element according to [14] to [15], in which a lens for condensing incident light is formed on the first photoelectric converter portion.

[23] The solid-state imaging element according to [22], in which the lens contains at least one of resin selected from the group consisting of a methacrylic resin, an acrylic resin, a phenol resin, a melamine resin, an epoxy resin, a urea resin, an unsaturated polyester resin, and an alkyd resin.

[24] The solid-state imaging element according to [23], in which the light attenuating layer further contains the same resin as the lens.

[25] The solid-state imaging element according to [23] or [24], in which the colored layer further contains the same resin as the lens.

[26] The solid-state imaging element according to any one of [22] to [25], in which the colored layer, the light attenuating layer, and the lens contain the same resin selected from the group consisting of a methacrylic resin, an acrylic resin, a phenol resin, a melamine resin, an epoxy resin, a urea resin, an unsaturated polyester resin, and an alkyd resin.

[27] The solid-state imaging element according to [22], in which the lens is a glass lens.

[28] The solid-state imaging element according to any one of [14] to [27], in which the unit pixel includes at least one selected from the group consisting of a red pixel, a green pixel, and a blue pixel.

[29] The solid-state imaging element according to [28], in which the red pixel contains at least one of pigment selected from the group consisting of PR254, PR264, PR177, and PY139, the green pixel contains at least one of pigment selected from the group consisting of PG58, PG59, PG36, PG7, PY139, PY185, and PY150, and the blue pixel contains at least one of pigment selected from the group consisting of PB15:6, PB16, and PV23.

According to the present invention, a laminate from which an image having excellent color reproducibility is obtained can be provided in a case of applying the laminate to a solid-state imaging element. In addition, according to the present invention, a laminated structure and a solid-state imaging element can also be provided.

DESCRIPTION OF THE PREFERRED EMBODIMENTS

Hereinafter, the present invention will be described in detail.

The description of the constituent elements described below may be formed based on a representative embodiment of the present invention, but the present invention is not limited to such an embodiment.

In the present specification, numerical ranges represented by "to" include numerical values disclosed before and after "to" as a lower limit value and an upper limit value.

In the present specification, unless specified as a substituted group or as an unsubstituted group, a group (atomic group) denotes not only a group (atomic group) containing no substituent but also a group (atomic group) containing a substituent. For example, "alkyl group" denotes not only an alkyl group containing no substituent (unsubstituted alkyl group) but also an alkyl group containing a substituent (substituted alkyl group).

In addition, an "actinic ray" or "radiation" in the present specification means, for example, a far ultraviolet ray, an extreme ultraviolet (EUV) ray, an X-ray, and an electron beam. In the present specification, light means an actinic ray and radiation. Unless otherwise specified, "exposure" in the present specification denotes exposure by a far ultraviolet ray, an x-ray and an EUV ray, and drawing by a corpuscular beam such as an electron beam and an ion beam.

In the present specification, "(meth)acrylate" denotes acrylate and methacrylate. In the present specification, "(meth)acryl" denotes acryl and methacryl. In the present specification, "(meth)acryloyl" denotes acryloyl and methacryloyl. In the present specification, "(meth)acrylamide" denotes acrylamide and methacrylamide. In the present specification, "monomer" and "monomer" are synonymous. A monomer is distinguished from an oligomer and a polymer, and refers to a compound having a weight-average molecular weight of 2,000 or less. In the present specification, a polymerizable compound refers to a compound containing a polymerizable group, and may be a monomer or a polymer. The polymerizable group refers to a group that participates in a polymerization reaction.

[Solid-State Imaging Element]

Regarding a constitution of a laminate according to the embodiment of the present invention, first, a structure of a solid-state imaging element having the laminate will be described, and materials and the like of each layer constituting the laminate will be described.

Figure 1:
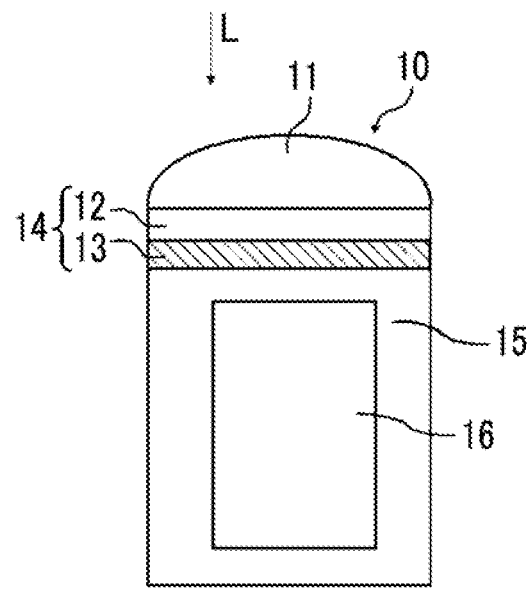
FIG. 1 is a schematic cross-sectional view of a unit pixel in a typical solid-state imaging element having a laminate according to an embodiment of the present invention.

FIG. 1 is a schematic cross-sectional view of a unit pixel 10 in a typical solid-state imaging element having a laminate according to an embodiment of the present invention.

The unit pixel 10 includes a first laminate 14 in which a colored layer 12 and a light attenuating layer 13 having predetermined optical characteristics to be described later are laminated. In the unit pixel 10, a lens 11 and the first laminate 14 are disposed on a substrate 15 in order from a light incident direction (arrow L in the figure). A first photoelectric converter portion 16 is formed on the substrate 15. Although not shown, a cover glass or the like is laminated on the upper side of the lens 11, and a wiring layer and a support substrate are laminated on the lower side of the substrate 15. In the following description, necessary portions are illustrated as appropriate, explanations are added, and illustrations or descriptions of other portions are omitted as appropriate.

A difference $\Delta T_1$ between a maximum value and a minimum value of light transmittance of the light attenuating layer 13 in a wavelength range of 400 to 700 nm is 10% or less. Therefore, intensity of light incident on the first photoelectric converter portion uniformly decreases in the wavelength range of 400 to 700 nm, and before and after passing through the light attenuating layer 13, an optical spectrum hardly changes at the wavelength of 400 to 700 nm. Therefore, an image obtained by the solid-state imaging element having the unit pixel 10 has excellent color reproducibility.

In addition, as $\Delta T_1$, 6% or less is preferable in the viewpoint that a laminate having a more excellent effect of the present invention can be obtained. In addition, a lower limit of $\Delta T_1$ is not limited, but preferably generally 0% or more.

Figure 2:
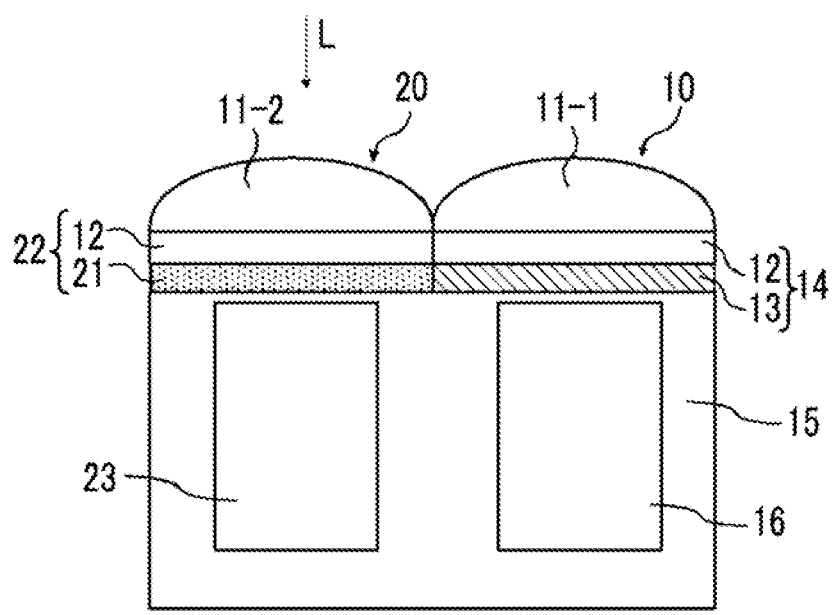
FIG. 2 is a schematic cross-sectional view of an example of a combination of unit pixels in a solid-state imaging element having a laminate according to an embodiment of the present invention.

FIG. 2 is a schematic cross-sectional view of the other example of the combination of unit pixels in the solid-state imaging element having the laminate according to the embodiment of the present invention.

The unit pixel 20 includes the unit pixel 10, a second laminate 22, and a lens 11-2 formed on the common substrate 15. The second laminate 22 is a laminate in which the colored layer 12 and the transparent layer 21 are laminated. A second photoelectric converter portion 23 is formed below the second laminate 22 in the substrate 15.

In FIG. 2, an amount of light incident on the second photoelectric converter portion 23 is larger than an amount of light incident on the first photoelectric converter portion 16. Therefore, the dynamic range of the solid-state imaging element having a combination of unit pixels in FIG. 2 is expanded.

In FIG. 2, although light receiving areas of the first photoelectric converter portion 16 and the second photoelectric converter portion 23 are the same, the solid-state imaging element according to the embodiment of the present invention is not limited thereto. An area of the unit pixels 10 having the first photoelectric converter portion may be smaller than an area of the unit pixels 20 having the second photoelectric converter portion. In this case, since an amount of light incident on the first photoelectric converter portion 16 is smaller than an amount of light incident on the second photoelectric converter portion 23, the dynamic range of the solid-state imaging element having such a combination of unit pixels is expanded.

In FIG. 2, although a lens 11-1 is disposed on the first photoelectric converter portion 16, the solid-state imaging element according to the embodiment of the present invention is not limited thereto. The unit pixel 10 having the first photoelectric converter portion may not have the lens 11-1. In this case, the light incident on the first photoelectric converter portion 16 is not condensed by the lens, and as a result, the amount of light incident on the first photoelectric converter portion 16 further smaller than the amount of light incident on the second photoelectric converter portion 23. Therefore, the dynamic range of the solid-state imaging element having such a combination of unit pixels is further expanded.

Figure 3:
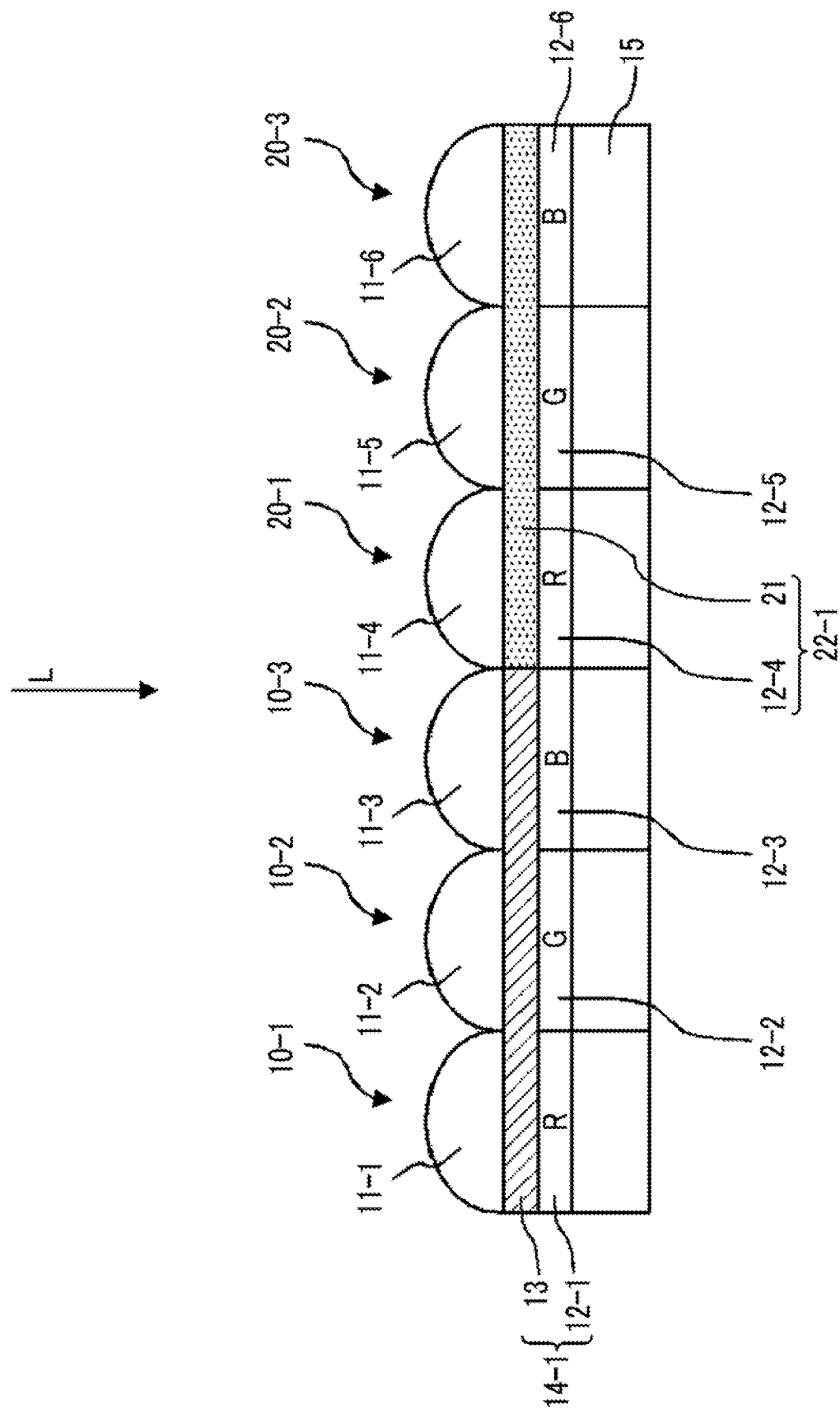
FIG. 3 is a schematic cross-sectional view of the other example of a combination of unit pixels in the solid-state imaging element having the laminate according to the embodiment of the present invention.

FIG. 3 is a schematic cross-sectional view of the other example of a combination of unit pixels in the solid-state imaging element having the laminate according to the embodiment of the present invention.

In FIG. 3, a total six unit pixels including three unit pixels 10-1 to 10-3 having the same constitution as the unit pixel 10 illustrated in FIG. 1 and three unit pixels 20-1 to 20-3 having the same constitution as the unit pixel 20 illustrated in FIG. 2 are disposed in parallel.

The colored layer 12-1 in the unit pixel 10-1 is a red colored layer (in other words, the unit pixel 10-1 is a red pixel). That is, a first laminate 14-1 in the unit pixel 10-1 is formed by laminating the red colored layer 12-1 and the light attenuating layer 13.

In addition, the colored layer 12-2 in the unit pixel 10-2 is a green colored layer (the unit pixel 10-2 is a green pixel). That is, a first laminate 14-2 in the unit pixel 10-2 is formed by laminating the green colored layer 12-2 and the light attenuating layer 13.

In addition, the colored layer 12-3 in the unit pixel 10-3 is a blue colored layer (the unit pixel 10-3 is a blue pixel). That is, a first laminate 14-3 in the unit pixel 10-3 is formed by laminating the blue colored layer 12-3 and the light attenuating layer 13.

The colored layer 12-4 in the unit pixel 20-1 is a red colored layer. That is, a second laminate 22-1 in the unit pixel 20-1 is formed by laminating the red colored layer 12-4 and the transparent layer 21.

In addition, the colored layer 12-5 in the unit pixel 20-2 is a green colored layer. That is, a second laminate 22-2 in the unit pixel 20-2 is formed by laminating the green colored layer 12-5 and the transparent layer 21.

In addition, the colored layer 12-6 in the unit pixel 20-3 is a blue colored layer. That is, a second laminate 22-3 in the unit pixel 20-3 is formed by laminating the blue colored layer 12-6 and the transparent layer 21.

The red colored layer 12-1 and the red colored layer 12-4 are the same each other, the green colored layer 12-2 and the green colored layer 12-5 are the same each other, and the blue colored layer 12-3 and the blue colored layer 12-6 are the same each other.

The first laminate 14 and the second laminate 22 are disposed on a common substrate 15, and the lens 11 is laminated in the light incident direction (arrow L in the figure). Although not shown, the first photoelectric converter portion is disposed on the substrate 15 below the first laminate 14 of the unit pixel 10. In addition, the second photoelectric converter portion is disposed on the substrate 15 below the second laminate 22 of the unit pixel 20.

According to the disposition of the unit pixels, since the light incident on the first photoelectric converter portion is attenuated by the light attenuating layer 13, the dynamic range of the solid-state imaging element is expanded.

In addition, since the light attenuating layer 13 has $\Delta T_1$ of 10% or less, intensity of light incident on the first photoelectric converter portion uniformly decreases at each wavelength and before and after passing through the light attenuating layer 13, an optical spectrum of the light incident on the first photoelectric converter portion hardly changes at the wavelength of 400 to 700 nm. Therefore, an image obtained by the solid-state imaging element having a combination of the unit pixels 10-1 to 10-3 and the unit pixels 20-1 to 20-3 has excellent color reproducibility.

Figure 4:
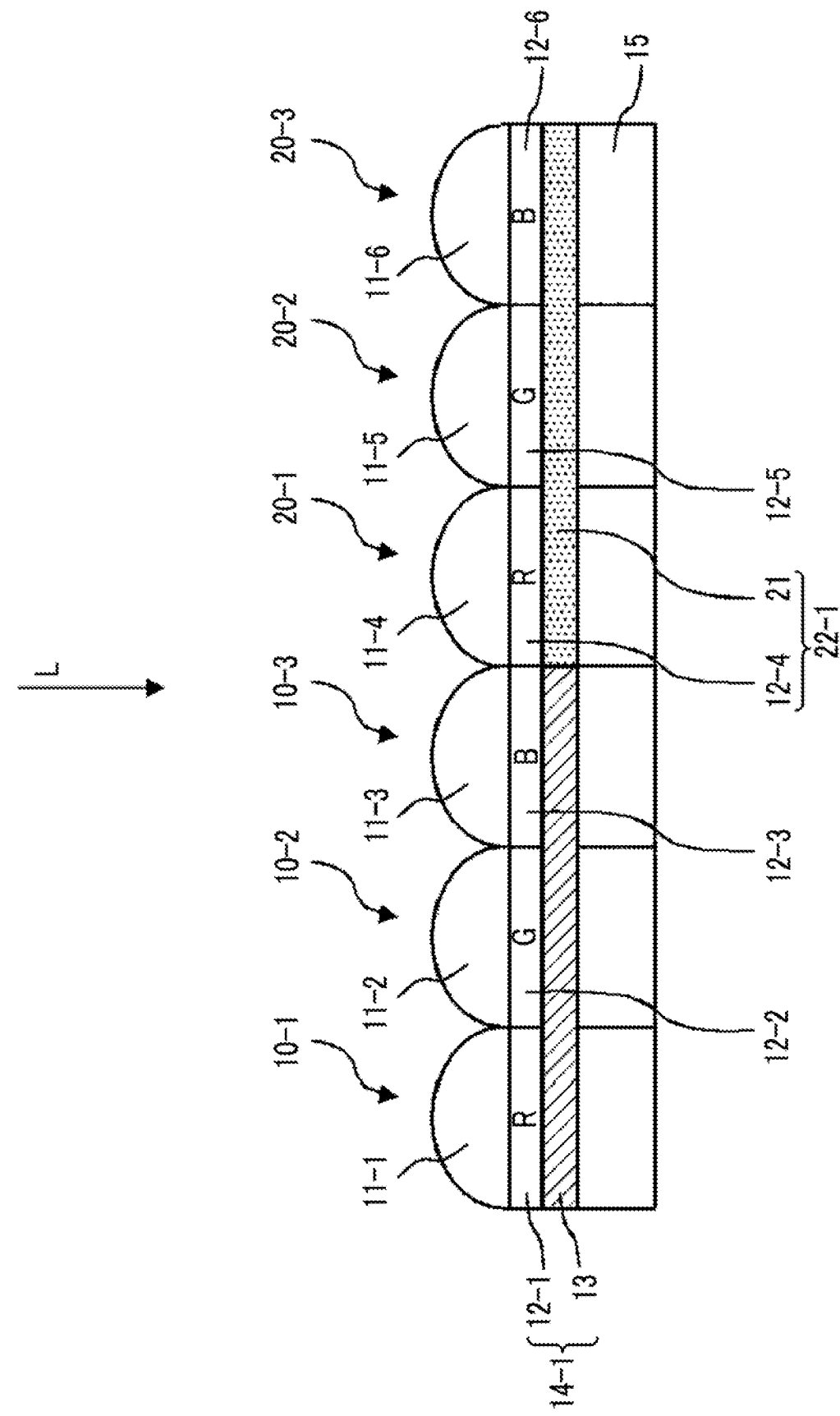
FIG. 4 is a schematic cross-sectional view showing a modification example of the combination of unit pixels in FIG. 3.

FIG. 4 is a schematic cross-sectional view showing a modification example of the combination of unit pixels in FIG. 3. That is, the solid-state imaging element shown in FIG. 4 is the same as in FIG. 3 except that the laminating order of the colored layers 12-1 to 12-3 and the light attenuating layer 13 in the first laminate 14, and the laminating order of the colored layers 12-4 to 12-6 and the transparent layer 21 in the second laminate 22. The same effect can be obtained in a solid-state imaging element having a combination of unit pixels described above.

Figure 5:
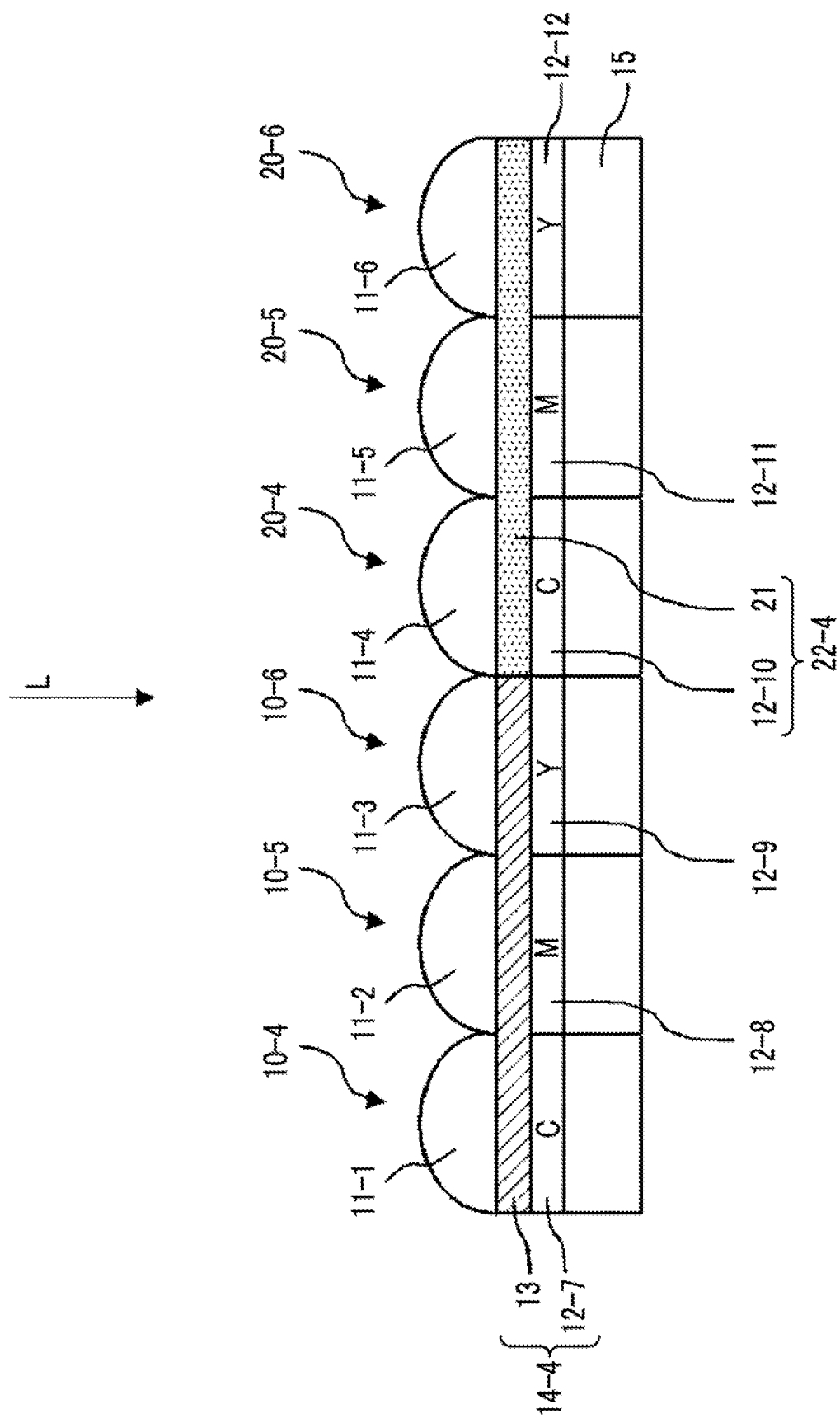
FIG. 5 is a schematic cross-sectional view of the other example of the combination of unit pixels in the solid-state imaging element having the laminate according to the embodiment of the present invention.

FIG. 5 is a schematic cross-sectional view of the other example of a combination of unit pixels in the solid-state imaging element having the laminate according to the embodiment of the present invention.

In FIG. 5, a total six unit pixels including three unit pixels 10-4 to 10-6 having the same constitution as the unit pixel 10 illustrated in FIG. 1 and three unit pixels 20-4 to 20-6 having the same constitution as the unit pixel 20 illustrated in FIG. 2 are disposed in parallel.

A colored layer 12-7 in the unit pixel 10-4 is a cyan colored layer (the unit pixel 10-4 is a cyan pixel). That is, a first laminate 14-4 in the unit pixel 10-4 is formed by laminating the cyan colored layer 12-7 and the light attenuating layer 13.

In addition, a colored layer 12-8 in a unit pixel 10-5 is a magenta colored layer (the unit pixel 10-5 is a magenta pixel). That is, a first laminate 14-5 in the unit pixel 10-5 is formed by laminating the magenta colored layer 12-8 and the light attenuating layer 13.

In the unit pixel 10-6, a colored layer 12-9 is a yellow colored layer (the unit pixel 10-6 is a yellow pixel). That is, a first laminate 14-6 in the unit pixel 10-6 is obtained by laminating the yellow colored layer 12-9 and the light attenuating layer 13.

A colored layer 12-10 in the unit pixel 20-4 is a cyan colored layer. That is, a second laminate 22-4 in the unit pixel 20-4 is formed by laminating the cyan colored layer 12-10 and the transparent layer 21.

A colored layer 12-11 in the unit pixel 20-5 is a magenta colored layer. That is, a second laminate 22-5 in the unit pixel 20-5 is formed by laminating the magenta colored layer 12-11 and the transparent layer 21.

A colored layer 12-12 in the unit pixel 20-6 is a yellow colored layer. That is, a second laminate 22-6 in the unit pixel 20-6 is formed by laminating the yellow colored layer 12-12 and the transparent layer 21.

The cyan colored layer 12-7 and the cyan colored layer 12-10 are the same each other, the magenta colored layer 12-8 and the magenta colored layer 12-11 are the same each other, and the yellow colored layer 12-9 and the yellow colored layer 12-12 are the same each other.

The first laminate 14 and the second laminate 22 are disposed on a common substrate 15, and the lens 11 is laminated in the light incident direction (arrow L in the figure). Although not shown, the first photoelectric converter portion is disposed on the substrate 15 below the first laminate 14 of the unit pixel 10. In addition, the second photoelectric converter portion is disposed on the substrate 15 below the second laminate 22 of the unit pixel 20.

According to the disposition of the unit pixels, since the light incident on the first photoelectric converter portion is attenuated by the light attenuating layer 13, the dynamic range of the solid-state imaging element is expanded.

In addition, since the light attenuating layer 13 has $\Delta T_1$ of 10% or less, intensity of light incident on the first photoelectric converter portion uniformly decreases at each wavelength and before and after passing through the light attenuating layer 13, an optical spectrum of the light incident on the first photoelectric converter portion hardly changes at the wavelength of 400 to 700 nm. Therefore, an image obtained by the solid-state imaging element having a combination of the unit pixels 10-4 to 10-6 and the unit pixels 20-4 to 20-6 has excellent color reproducibility.

Figure 6:
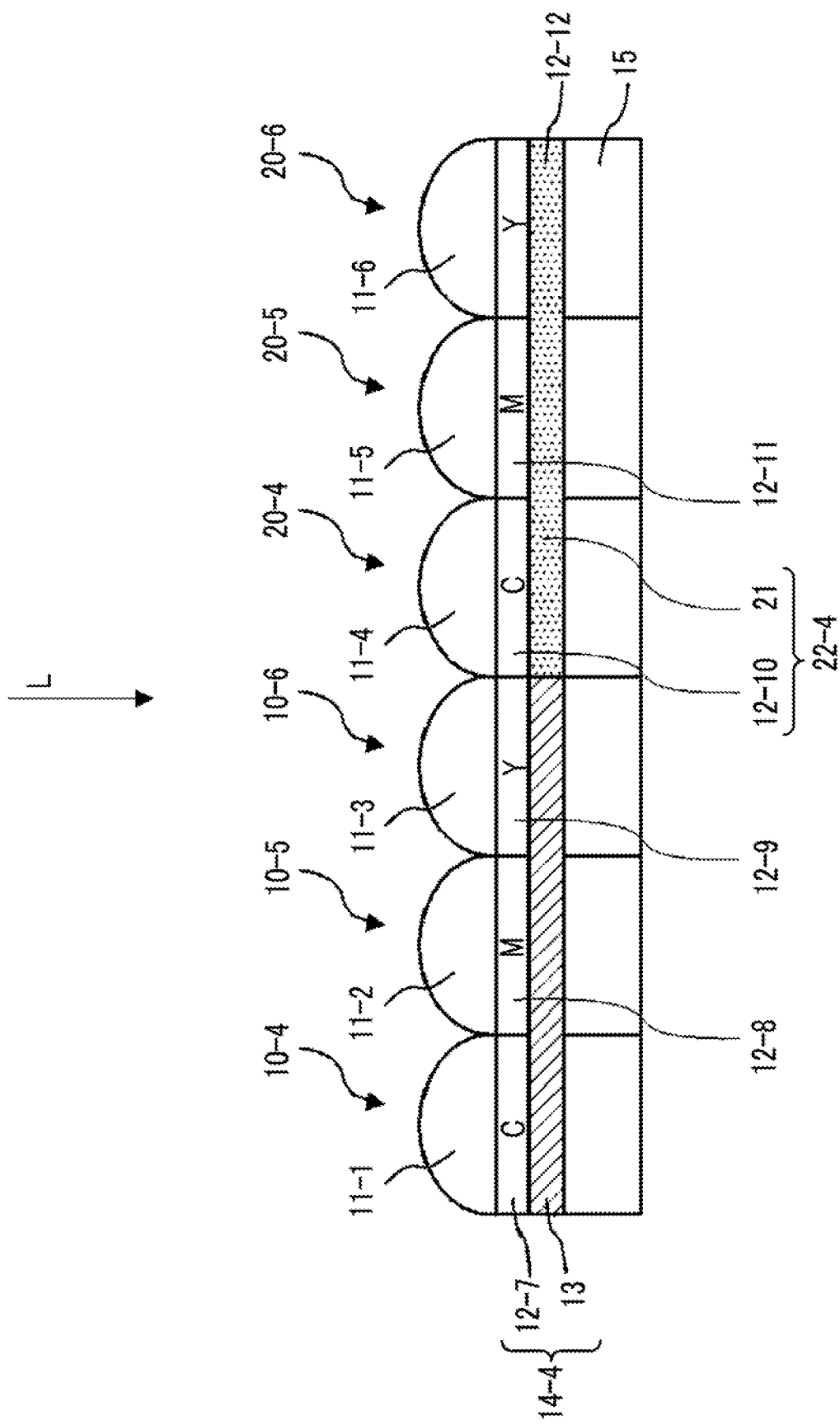
FIG. 6 is a schematic cross-sectional view showing a modification example of the combination of unit pixels in FIG. 5.

FIG. 6 is a schematic cross-sectional view showing a modification example of the combination of unit pixels in FIG. 5. The solid-state imaging element shown in FIG. 6 is the same as in FIG. 5 except that the laminating order of the colored layers 12-8 to 12-10 and the light attenuating layer 13 in the first laminate 14, and the laminating order of the colored layers 12-11 to 13 and the transparent layer 21 in the second laminate 22. The same effect can be obtained in a solid-state imaging element having a combination of unit pixels described above.

Figure 7:
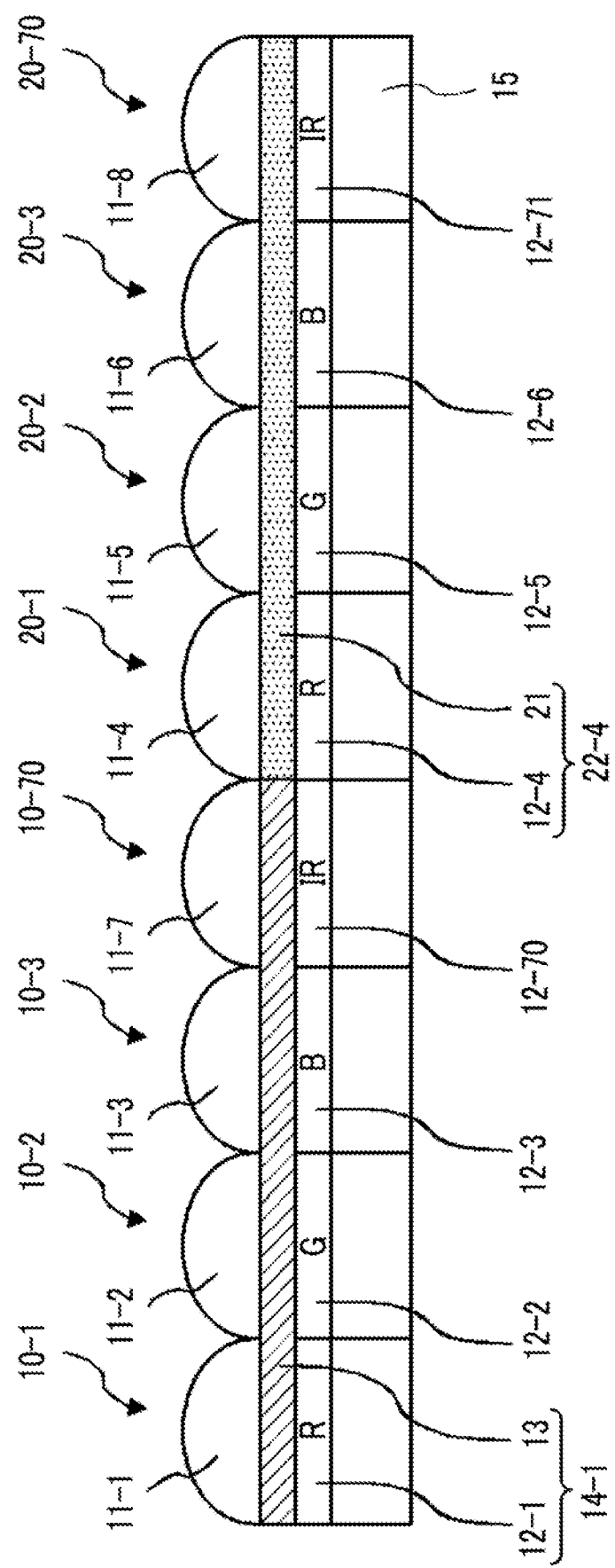
FIG. 7 is a schematic cross-sectional view of the other example of the combination of unit pixels in the solid-state imaging element having the laminate according to the embodiment of the present invention.

FIG. 7 is a schematic cross-sectional view of the other example of a combination of unit pixels in the solid-state imaging element having the laminate according to the embodiment of the present invention.

The solid-state imaging element shown in FIG. 7 is obtained by further adding a unit pixel 10-70 and a unit pixel 20-70 each having an infrared transmitting layer to the combination of unit pixels illustrated in FIG. 3.

In the unit pixel 10-70, an infrared transmitting layer 12-70, the light attenuating layer 13, and a lens 11-7 are laminated on the substrate 15.

In the unit pixel 20-70, an infrared transmitting layer 12-71, the transparent layer 21, and a lens 11-8 are laminated on the substrate 15.

Although not shown, the first photoelectric converter portion is formed on the substrate 15 of the unit pixel 10-70, and the second photoelectric converter portion is formed on the substrate 15 of the unit pixel 20-70.

In this case, a difference $\Delta T_2$ between a maximum value and a minimum value of light transmittance of the light attenuating layer 13 in a wavelength range of 700 to 1000 nm is 10% or less. Therefore, even in the region of 700 to 1000 nm detected by the unit pixel 10-70 and the unit pixel 20-70, an obtained image has more excellent color reproducibility.

Figure 8:
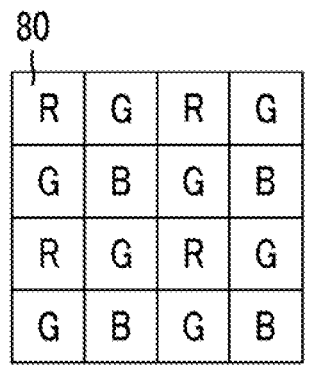
FIG. 8 is a schematic view of the other example of the combination of unit pixels in the solid-state imaging element having the laminate according to the embodiment of the present invention.

FIG. 8 is a schematic view of the other example of the combination of unit pixels in the solid-state imaging element having the laminate according to the embodiment of the present invention.

In FIG. 8, 16 unit pixels 80 are disposed in 4×4 matrix. The unit pixel 80 is either the unit pixel 10 or the unit pixel 20. The color of each colored layer 12 in the unit pixel 80 is represented by R (red), G (green), and B (blue) in the figure, and has a Bayer array. That is, in the figure, a colored layer 12 of a unit pixel 80 indicated by R is a red colored layer, a colored layer 12 of a unit pixel 80 indicated by B is a blue colored layer, and a colored layer 12 of a unit pixel 80 indicated by G is a green colored layer. The disposition of the colored layers is a so-called a Bayer array. In this case, it is preferable to have a ratio of the unit pixels 20 having the green colored layer larger than a ratio of the unit pixels having the colored layers of other colors, in the unit pixels 20 included in the entire solid-state imaging element. A ratio is not particularly limited, and the ratio of the unit pixel 20 having the red colored layer (red pixel), the unit pixel 20 having the green colored layer, and the unit pixel 20 having the blue colored layer is preferably about 1:2:1 respectively.

Here, the disposition of the colored layers is exemplified by the Bayer array, but other dispositions may be used.

Figure 9:
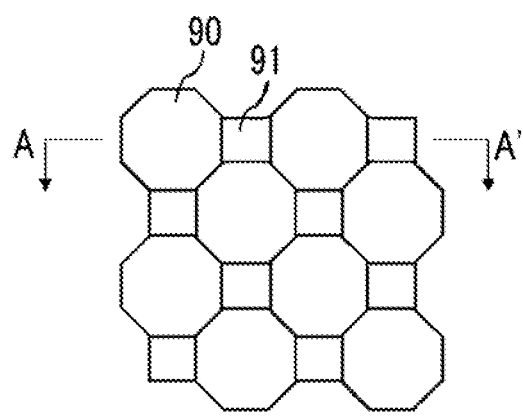
FIG. 9 is a schematic view of the other example of the combination of unit pixels in the solid-state imaging element having the laminate according to the embodiment of the present invention.

FIG. 9 is a schematic view of the other example of the combination of unit pixels in the solid-state imaging element having the laminate according to the embodiment of the present invention. In FIG. 9, a plurality of unit pixels 90 and a plurality of unit pixels 91 are disposed in a two-dimensional array.

Figure 10:
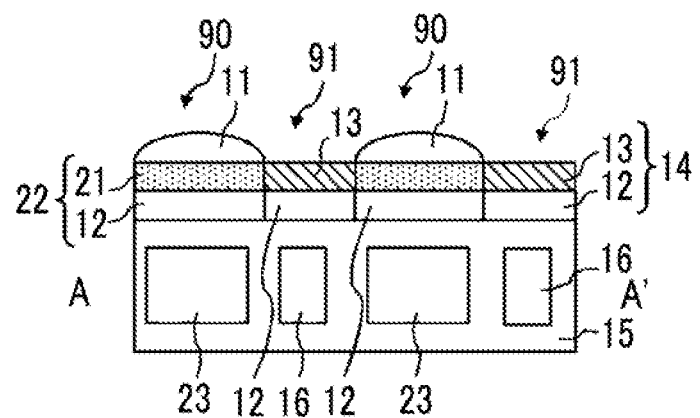
FIG. 10 is a cross-sectional view taken along line A-A' of FIG. 9.

FIG. 10 is a cross-sectional view taken along line A-A' of FIG. 9. The unit pixel 91 includes the first laminate 14 on the substrate 15, and the first laminate 14 is constituted by laminating the light attenuating layer 13 and the colored layer 12. On the other hand, the unit pixel 90 includes the second laminate 22 on the substrate 15, and the second laminate 22 is constituted by laminating the transparent layer 21 and the colored layer 12. The first photoelectric converter portion 16 is formed on the substrate 15 of the unit pixel 91, and the second photoelectric converter portion 23 is formed on the substrate 15 of the unit pixel 90.

In FIG. 10, the lens 11 is disposed only on the unit pixel 90 and is not disposed on the unit pixel 91. Thereby, since light is incident on the first photoelectric converter portion 16 without being condensed, the dynamic range of the solid-state imaging element is further expanded.

In addition, the unit pixel 91 is formed in a square shape in FIG. 9 and formed in a regular square shape in the example shown in the figure. In FIG. 10, the unit pixel 90 is an octagon circumscribing the four corners of the square-shaped pixel 91 or a nearly circular shape, and formed in a regular octagon in the example shown in the figure. In this case, an area of the unit pixel 91 is smaller than an area of the unit pixel 90, and an amount of light incident on the unit pixel 91 is smaller than an amount of light incident on the unit pixel 90. Thereby, the dynamic range of the solid-state imaging element is further expanded.

In FIG. 10, the unit pixel 90 having the second laminate is formed in a regular octagon, and the unit pixel 91 having the first laminate is formed in a smaller square than the unit pixel 90. However, the solid-state imaging element according to the embodiment of the present invention is not limited thereto. A ratio of a total area of the unit pixels on which the first laminate is disposed to a total area of the unit pixels included in the solid-state imaging element (a total of an area of the unit pixels having the first laminate and an area of the unit pixels having the second laminate) is preferably 5.0% to 30%, more preferably 10% to 20%.

In this case, it is preferable to have a ratio of the unit pixels 20 having the green colored layer larger than a ratio of the unit pixels having the colored layers of other colors, in the unit pixels on which the first laminate is disposed. A ratio is not particularly limited, and the ratio of the unit pixel 20 having the red colored layer (red pixel), the unit pixel 20 having the green colored layer, and the unit pixel 20 having the blue colored layer is preferably about 1:2:1 respectively.

Hereinafter, materials and a manufacturing method of the first laminate and the second laminate described so far will be described.

(Light Attenuating Layer)

The light attenuating layer is a layer having a function of attenuating the incident light and transmitting the attenuated light. In other words, the layer functions as a so-called light-shielding layer. A method of attenuating the incident light is not particularly limited, but includes a method of absorbing the incident light, a method of reflecting the incident light, and combinations thereof. From the viewpoint that a laminate having a more excellent effect of the present invention can be obtained, the method of absorbing the incident light is preferable. That is, the light attenuating layer is preferably a layer having a function of absorbing a part of the incident light.

In light attenuation characteristics of the light attenuating layer, the difference $\Delta T_1$ between the maximum value and the minimum value of light transmittance in the wavelength range of 400 to 700 nm is 10.0% or less. A method of measuring the difference $\Delta T_1$ is as described in Example. In addition, the above difference $\Delta T_1$ can also be adjusted by materials and a thickness of the light attenuating layer. The thickness of the light attenuating layer is not particularly limited, but generally preferably 0.1 to 1.0 μm, and more preferably 0.2 to 0.7 μm.

In addition, from the viewpoint that a laminate having a more excellent effect of the present invention can be obtained, the difference $\Delta T_1$ between the maximum value and the minimum value of the light transmittance in the wavelength range of 400 to 700 nm is more preferably 6.0% or less, and even more preferably 4.0% or less. A minimum value of the difference $\Delta T_1$ is not particularly limited, but preferably generally 0% or more.

In addition, the difference $\Delta T_2$ between the maximum value and the minimum value of the light transmittance of the light attenuating layer in the wavelength range of 700 to 1000 nm is not particularly limited. From the viewpoint that a laminate having a more excellent effect of the present invention can be obtained, the difference $\Delta T_2$ is preferably 10% or less, and more preferably 6.0% or less. In a case where the difference $\Delta T_2$ is 10% or less, an image having more excellent color reproducibility can be obtained in a case where the solid-state imaging element includes the infrared transmitting layer.

In addition, the light transmittance of the light attenuating layer at a wavelength of 550 nm is not particularly limited, but from the viewpoint that the solid-state imaging element has the more excellent dynamic range and a so-called "halation" phenomenon is hardly generated on the obtained image, the light transmittance is preferably 5.0% to 75%, and more preferably 5.0% to 20%. A method of measuring the light transmittance is as described in Example.

The light transmittance of the light attenuating layer at the wavelength of 550 nm can be adjusted by the materials and the thickness of the light attenuating layer.

The materials of the light attenuating layer are not particularly limited as long as the above optical characteristics can be obtained, and known materials can be used. As the materials of the light attenuating layer, for example, materials described in paragraphs 0028 to 0101 of JP2013-145405A and paragraphs 0008 to 0010 of JP2004-145054A can be used.

Among these, from the viewpoint of more easily obtaining the laminate having the effect of the present invention, it is preferable that the light attenuating layer contains an inorganic pigment and a colorant different from the inorganic pigment. A form in which the light-shielding layer contains the above inorganic pigment and the colorant is not particularly limited, but typically, the light attenuating layer includes a form of containing an inorganic pigment, a colorant, and a resin. Hereinbelow, each component contained in the light attenuating layer will be described.

(Inorganic Pigment)

The light attenuating layer contains an inorganic pigment. A content of the inorganic pigment in the light attenuating layer is not particularly limited, but generally 1.0% by mass or more is preferable, 5.0% by mass or more is more preferable, 10% by mass or more is even more preferable, 20% by mass or more is particularly preferable, 60% by mass or less is preferable, 50% by mass or less is more preferable, and 45% by mass or less is even more preferable with respect to a total mass of the light attenuating layer. One kind of inorganic pigment may be used alone, or two or more kinds of inorganic pigments may be used in combination. In a case where two or more kinds of inorganic pigments are used in combination, a total content is preferably within the above range.

The inorganic pigment is not particularly limited, but from the viewpoint that optical density of the light attenuating layer is easily adjusted, the inorganic pigment containing a black metal compound is preferable. As the black metal compound, for example, at least one kind selected from the group consisting of nitride containing a transition metal of the groups 3 to 11 of the periodic table, oxide containing the transition metal, and oxynitride containing the transition metal is preferable; from the viewpoint that a laminate having a more excellent effect of the present invention can be obtained, at least one kind selected from the group consisting of nitride containing at least one kind of metal selected from the group consisting of Ti, Zr, Hf, V, Nb, and Ta (hereinafter, also referred to as "specific metal"), oxide containing the specific metal, and oxynitride containing the specific metal is more preferable; and from the viewpoint that a laminate having even more excellent effect of the present invention can be obtained, at least one kind selected from the group consisting of titanium nitride, titanium oxynitride, and zirconium oxynitride is even more preferable.

Titanium nitride, titanium oxynitride, and zirconium oxynitride easily absorb light in a wide wavelength range from ultraviolet rays to infrared rays. As titanium oxynitride, titanium oxynitrides described in WO2008/123097A, JP2009-058946A, JP2010-014848A, JP2010-097210A, JP2011-227467A, and the like, and a mixture of titanium oxynitride and titanium carbide described in JP2010-095716A, and the like can be used. A surface of the inorganic pigment (particularly, titanium nitride, titanium oxynitride, and zirconium oxynitride) may be modified from the viewpoint of improving dispersibility and suppressing aggregation properties.

A method of modifying the surface of the inorganic pigment is not particularly limited, and an example thereof includes a method of coating with silicon oxide, titanium oxide, germanium oxide, aluminum oxide, magnesium oxide, and zirconium oxide. Furthermore, a method described in JP2007-302836A can also be used. In order to adjust dispersibility, colorability, and the like of the inorganic pigment (particularly, titanium nitride, titanium oxynitride, and zirconium oxynitride), complex oxides such as Cu, Fe, Mn, Ni, and the like, cobalt oxide, iron oxide, and the like may be used in combination.

(oxy)nitride of the specific metal can be easily manufactured with reference to methods such as a method of heating and reducing a mixture of titanium dioxide and metallic titanium in a reducing atmosphere (JP1974-005432A (JP-S49-005432A)), a method of reducing ultrafine titanium dioxide obtained by hydrolysis of titanium tetrachloride at high temperature in a reducing atmosphere containing hydrogen (JP1982-205322A (JP-S57-205322A)), a method of reducing titanium dioxide or titanium hydroxide at high temperature in the presence of ammonia (JP1985-065069A (JP-S60-065069A) and JP1986-201610 (JP-S61-201610)), and a method in which a vanadium compound is attached to titanium dioxide or titanium hydroxide and reduced at high temperature in the presence of ammonia (JP1986-201610 (JP-S61-201610)).

The method of manufacturing the inorganic pigment is not limited thereto.

In addition, in addition to the above inorganic pigments, well-known inorganic pigments can be used in combination. By using inorganic pigments other than the above inorganic pigments in combination, the optical density of the light attenuating layer can be adjusted more easily. Examples of such inorganic pigments include zinc oxide, white lead, lithopone, chromium oxide, iron oxide, precipitating barium sulfate, barite powder, red lead, iron oxide red, yellow lead, zinc yellow (zinc yellow type 1, zinc yellow type 2), ultramarine blue, prussian blue (iron-potassium ferricyanide), zircon gray, praseodymium yellow, chrome titanium yellow, chrome green, peacock, victoria green, iron blue (unrelated to prussian blue), vanadium zirconium blue, chrome tin pink, ceramic red, salmon pink, and the like.

(Colorant Different from Inorganic Pigment)

The light attenuating layer contains a colorant different from the inorganic pigment (hereinafter, also referred to as a "specific colorant"). Examples of the specific colorant include carbon black, organic pigments, and dyes. A content of the specific colorant in the light attenuating layer is not particularly limited, but is generally preferably 0.10% by mass or more, more preferably 1.0% by mass or more with respect to a total mass of the light attenuating layer, 2.0% by mass or more is more preferable, 3.0% by mass or more is particularly preferable, 5.0% by mass or more is most preferable, 30% by mass or less is preferable, and 20% by mass or less is more preferable. One kind of specific colorant may be used alone, or two or more kinds of specific colorants may be used in combination. In a case where two or more kinds of specific colorants are used in combination, a total content is preferably within the above range.

Examples of an organic pigment include chromatic pigments. Examples of the chromatic pigments include Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214;

C.I. Pigment Orange 2, 5, 13, 16, 17:1, 31, 34, 36, 38, 43, 46, 48, 49, 51, 52, 55, 59, 60, 61, 62, 64, 71, and 73;

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279;

C.I. Pigment Green 7, 10, 36, 37, 58, and 59;

C.I. Pigment Violet 1, 19, 23, 27, 32, 37, and 42; and

C.I. Pigment Blue 1, 2, 15, 15:1, 15:2, 15:3, 15:4, 15:6, 16, 22, 60, 64, 66, 79, and 80.

In addition, as the green pigment, a halogenated zinc phthalocyanine pigment having an average number of halogen atoms in a molecule of 10 to 14, bromine atoms of 8 to 12, and chlorine atoms of 2 to 5 can be used. Specific examples include compounds described in WO2015/118720A. One kind of organic pigment may be used alone, or two or more kinds of organic pigments may be used in combination.

As the dyes, for example, dyes described in JP1989-090403A (JP-S64-090403A), JP1989-091102A (JP-S64-091102A), JP1989-094301A (JP-H1-094301A), JP1994-011614A (JP-H6-011614A), JP2592207B, US4808501A, US5667920A, US505950A, JP1993-333207A (JP-H5-333207A), JP1994-035183A (JP-H6-035183A), JP1994-051115A (JP-H6-051115A), JP1994-194828A (JP-H6-194828A), and the like can be used.

As the dyes, compounds such as a pyrazoleazo compound, a pyromethene compound, an anilinoazo compound, a triphenylmethane compound, an anthraquinone compound, a benzylidene compound, an oxonol compound, a pyrazolotriazoleazo compound, a pyridoneazo compound, a cyanine compound, a phenothiazine compound, a pyrrolopyrazoleazomethine compound can be used.

As the dye, a dye multimer can also be used. As the dye multimer, for example, dye multimers described in JP2011-213925A and JP2013-041097A can be used.

Preferable Form of Combination of Inorganic Pigment and Colorant

A combination of the inorganic pigment and the colorant contained in the light attenuating layer is not particularly limited, but from the viewpoint that a laminate having a more excellent effect of the present invention can be obtained, the light attenuating layer contains an inorganic pigment A containing at least one kind selected from the group consisting of nitride of the specific metal, oxide of the specific metal, and oxynitride of the specific metal and a chromatic organic pigment B, and a content of the inorganic pigment A is preferably 1.0% by mass or more, more preferably 5.0% by mass, even more preferably 10% by mass or more, particularly preferably 20% by mass or more, preferably 60% by mass or less, more preferably 50% by mass or less, and even more preferably 45% by mass or less with respect to the total mass of the light attenuating layer (or with respect to a total solid content of a composition for forming a light attenuating layer described later). A content of the organic pigment B is preferably 0.10% by mass or more and more preferably 1.0% by mass or more with respect to the total mass of the light attenuating layer (or with respect to the total solid content of the composition for forming a light attenuating layer described later). In addition, 2.0% by mass or more is more preferable, and 3.0% by mass or more is particularly preferable. In addition, 5.0% by mass or more is most preferable, 30% by mass or less is preferable, and 20% by mass or less is more preferable.

In the above description, the inorganic pigment A is more preferably at least one kind selected from the group consisting of titanium nitride, titanium oxynitride, and zirconium oxynitride.

Furthermore, in the above description, the organic pigment B is more preferably at least one kind selected from the group consisting of a red pigment, an orange pigment, a violet pigment, and a yellow pigment.

The other suitable form of the combination of the inorganic pigment and the colorant includes a combination of the above described inorganic pigment A and a carbon black or an organic pigment C.

The organic pigment C is at least one kind selected from the group consisting of a yellow pigment, a violet pigment, an orange pigment, and a red pigment.

<Resin>

The light attenuating layer may contain a resin. The resin contained in the light attenuating layer is not particularly limited, and a known resin can be used. Specifically, examples thereof include a dispersant and/or binder described later. Among them, the light attenuating layer preferably contains at least one kind of resin (hereinafter, referred to as a "specific resin" in the present specification) selected from the group consisting of a methacrylic resin, an acrylic resin, a phenol resin, a melamine resin, an epoxy resin, a urea resin, an unsaturated polyester resin, and an alkyd resin.

In a case where the light attenuating layer contains a specific resin which is the same resin as the colored layer and/or the lens described later, excellent adhesiveness between the light attenuating layer and the colored layer and/or the light attenuating layer and the lens can be obtained. Furthermore, in a case of taking a methacrylic resin as an example, the same resin not only includes a resin having the same structure, but also the methacrylic resin having a different structure.

A method of forming a light attenuating layer is not particularly limited, but typically, an example includes a method of forming a light attenuating layer using a composition for forming a light attenuating layer. Hereinbelow, each component contained in the composition for forming a light attenuating layer will be described.

<Composition for Forming Light Attenuating Layer>

The composition for forming a light attenuating layer preferably contains an inorganic pigment, a specific colorant, a polymerizable compound, and a polymerization initiator. Hereinbelow, each component of the composition for forming a light attenuating layer will be described.

The composition for forming a light attenuating layer contains an inorganic pigment and a specific colorant. Examples of kinds of the inorganic pigment and the specific colorant are as already described as the kinds of the inorganic pigment and the specific colorant in the light attenuating layer, and a content thereof in the composition for forming a light attenuating layer is preferably adjusted such that the content may become an amount described as the content of each component in the light attenuating layer.

(Polymerizable Compound)

It is preferable that the composition for forming a light attenuating layer contains a polymerizable compound. The content of the polymerizable compound in the composition for forming a light attenuating layer is not particularly limited, but is generally preferably 5.0% to 40% by mass with respect to a total solid content of the composition for forming a light attenuating layer. One kind of polymerizable compound may be used alone, or two or more kinds of polymerizable compounds may be used in combination. In a case where two or more kinds of polymerizable compounds are used in combination, a total content is preferably within the above range.

In the present specification, the polymerizable compound means a compound having at least one polymerizable group in a molecule. The number of polymerizable groups is not particularly limited, but is preferably 2 or more, more preferably 3 or more, preferably 15 or less, and more preferably 6 or less.

The polymerizable group is not particularly limited, but examples thereof include an ethylenically unsaturated group, an epoxy group, a methylol group, and the like.

Among these, an ethylenically unsaturated group is preferable, and specific examples thereof include a vinyl group, a styryl group, a (meth)allyl group, a (meth)acryloyl group, a (meth)acryloyloxy group, and the like.

The polymerizable compound may be, for example, a monomer or a prepolymer, that is, in any of chemical forms such as a dimer, a trimer, an oligomer, a mixture thereof, and a multimer thereof, and a monomer is preferable. The molecular weight of the polymerizable compound is preferably 100 to 3000, and more preferably 250 to 1500. The polymerizable compound is preferably a (meth)acrylate compound having 3 to 15 functional groups and more preferably a (meth)acrylate compound having 3 to 6 functional groups.

Specific examples of the polymerizable compound include compounds described in paragraph numbers 0248 to 0251 of JP2007-269779A.

Furthermore, as the polymerizable compound, a compound (meth)acrylated after adding ethylene oxide or propylene oxide to a polyfunctional alcohol, which is described in JP1998-062986A (JP-H10-062986A), can also be used as the polymerizable compound.

As the polymerizable compound, pentaerythritol tetraacrylate (as a commercially available product, NK ESTER A-TMMT manufactured by Shin Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta(meth)acrylate (as a commercially available product, KAYARAD D-310 manufactured by Nippon Kayaku Co., Ltd.), or dipentaerythritol hexa(meth)acrylate (as a commercially available product, KAYARAD DPHA manufactured by Nippon Kayaku Co., Ltd. is preferable. Among these, pentaerythritol tetraacrylate is more preferable from the viewpoint of a pattern shape. In addition, as the polymerizable compound, Aronix TO-2349 (manufactured by TOAGOSEI CO., LTD.), NK ester A-DPH-12E (Shin Nakamura Chemical Co., Ltd.) and the like can be used.

The polymerizable compound may have an acid group such as a carboxy group, a sulfo group, or a phosphate group. Examples of a commercially available product of the polymerizable compound having an acid group include M-305, M-510, and M-520 of ARONIX series as polybasic acid-modified acrylic oligomer (manufactured by TOAGOSEI CO., LTD.). The acid value of the polymerizable compound having an acid group is not particularly limited, but preferably 0.1 to 40 mgKOH/g. The lower limit is preferably 5 mgKOH/g or higher. The upper limit is preferably 30 mgKOH/g or lower.

In addition, the polymerizable compound preferably has a caprolactone structure. An example of the polymerizable compound having the caprolactone structure includes ε-caprolactone-modified polyfunctional (meth)acrylate. The ε-caprolactone-modified polyfunctional (meth)acrylate is typically obtained by esterifying a polyhydric alcohol, (meth)acrylic acid, and ε-caprolactone. Examples of the polyhydric alcohol include trimethylolethane, ditrimethylolethane, trimethylolpropane, ditrimethylolpropane, pentaerythritol, dipentaerythritol, tripentaerythritol, glycerin, diglycerol, trimethylolmelamine, and the like.

Examples of the polymerizable compound having a caprolactone structure can be found in the description of paragraph numbers 0091 to 0107 of JP2016-006475A, the content of which is incorporated herein by reference. Examples of commercially available products include SR-494 which is tetrafunctional acrylate having four ethyleneoxy groups manufactured by Sartomer Co., Ltd., and DPCA-60 which is hexafunctional acrylate having six pentyleneoxy groups and TPA-330 which is trifunctional acrylate having three isobutyleneoxy groups, manufactured by Nippon Kayaku Co., Ltd.

As the polymerizable compound, a urethane acrylate described in JP1973-041708B (JP-S48-041708B), JP1976-037193A (JP-S51-037193A), JP1990-032293B (JP-H2-032293B), or JP1990-016765B (JP-H2-016765B), a urethane compound having an ethylene oxide skeleton described in JP1983-049860B (JP-S58-049860B), JP1981-017654B (JP-S56-017654B), JP1987-039417B (JP-S62-039417B), or JP1987-039418B (JP-S62-039418B), or the like can be used.

In addition, an addition-polymerizable compound having an amino structure or a sulfide structure in the molecules described in JP1988-277653A (JP-S63-277653A), JP1988-260909A (JP-S63-260909A), or JP1989-105238A (JP-H1-105238A) is also preferable.

As the polymerizable compound, commercially available urethane oligomers UAS-10, UAB-140 (manufactured by Sanyo Kokusaku Pulp Co., Ltd.), U-4HA, U-6LPA, UA-32P, U-10HA, U-10PA, UA-122P, UA-1100H, UA-7200 (manufactured by Shin Nakamura Chemical Co., Ltd.), DPHA-40H (manufactured by Nippon Kayaku Co., Ltd.), UA-306H, UA-306T, UA-306I, AH-600, T-600, AI-600 (manufactured by KYOEISHA CHEMICAL Co., Ltd.), UA-9050, UA-9048 (manufactured by BASF SE), 8UH-1006, 8UH-1012 (manufactured by Taisei Fine Chemical Co., Ltd.), and the like can also be used.

In addition, as the polymerizable compound, a polymerizable compound having a Si atom in a molecule is also preferable. Examples of commercially available polymerizable compounds having the Si atom in the molecule include EBECRYL 1360 (manufactured by DAICEL-ALLNEX LTD.), which is polyfunctional acrylate containing a siloxane bond, VINYLTRIISOPROPENOXYSILANE (manufactured by AZMAX Corp.), which is a polyfunctional vinyl compound containing the Si atom, and the like.

Regarding the polymerizable compounds, details of a usage method such as a structure, single use, combined use, an additive amount, and the like can be optionally set according to design of a final composition performance. For example, from the viewpoint of sensitivity, a structure having a high content of ethylenically unsaturated groups per molecule is preferable, and typically a bifunctional or higher compound is preferable. In addition, from the viewpoint of increasing strength of a cured film, a trifunctional or higher compound is preferable. Furthermore, a method of using a compound in which at least one of functionalities or polymerizable groups is different in combination to adjust both sensitivity and strength is also effective. Furthermore, it is also preferable to use a polymerizable compound having a different ethylene oxide chain length in combination as a trifunctional or higher compound. According to this, the developability of the composition for forming a light attenuating layer can be adjusted, and as a result, an excellent pattern shape is obtained. Furthermore, by selecting a polymerizable compound, compatibility and/or dispersibility with other components (for example, a polymerization initiator described later, a resin described later, and the like) contained in the composition for forming a light attenuating layer can be improved.

(Polymerization Initiator)

A composition for forming a light attenuating layer preferably contains a polymerization initiator. The polymerization initiator is not limited, but a well-known photopolymerization initiator and/or thermalpolymerization initiator can be used. Among them, a photopolymerization initiator is preferable.

The content of the polymerization initiator in the composition for forming a light attenuating layer is not particularly limited, but is generally preferably 0.1% to 10.0% by mass, and more preferably 1.0% to 6.0% by mass with respect to a total solid content of the composition for forming a light attenuating layer. One kind of polymerization initiator may be used alone, or two or more kinds of polymerization initiators may be used in combination. In a case where two or more kinds of polymerization initiators are used in combination, a total content is preferably within the above range.

(Photopolymerization Initiator)

Examples of the photopolymerization initiator include: a halogenated hydrocarbon derivative (for example, a compound having a triazine skeleton, a compound having an oxadiazole skeleton, or the like); an acylphosphine compound; a hexaarylbiimidazole compound, an oxime compound, organic peroxide, a thio compound, a ketone compound, an aromatic onium salt, an α-hydroxyketone compound, an α-aminoketone compound, and the like.

In addition, from the viewpoint of exposure sensitivity, as the photopolymerization initiator, compounds such as a trihalomethyltriazine compound, a benzyldimethylketanol compound, an α-hydroxyketone compound, an α-aminoketone compound, an acylphosphine compound, a phosphine oxide compound, a metallocene compound, an oxime compound, a triarylimidazole dimer, an onium compound, a benzothiazole compound, a benzophenone compound, an acetophenone compound, a cyclopentadiene-benzene-iron complex, a halomethyl oxadiazole compound, and a 3-aryl-substituted coumarin compound are preferable, a compound selected from the group consisting of an oxime compound, an α-hydroxyketone compound, an α-aminoketone compound, and an acylphosphine compound is more preferable, and an oxime compound is even more preferable.

Examples of the photopolymerization initiators can be found in the description of paragraph numbers 0065 to 0111 of JP2014-130173A, the content of which is incorporated herein by reference. As the photopolymerization initiator, KAYACURE DETX-S (manufactured by Nippon Kayaku Co., Ltd.) can also be used.

As a commercially available product of the α-hydroxyketone compound, for example, IRGACURE-184, DAROCUR-1173, IRGACURE-500, IRGACURE-2959, or IRGACURE-127 (all of which are manufactured by BASF SE) can be used.

As a commercially available product of the α-aminoketone compound, for example, IRGACURE-907, IRGACURE-369, IRGACURE-379, or IRGACURE-379EG (all of which are manufactured by BASF SE) can be used.

As a commercially available product of the acylphosphine compound, for example, IRGACURE-819, or DAROCUR-TPO (all of which are manufactured by BASF SE) can be used.

As the oxime compound, a compound described in JP2001-233842A, a compound described in JP2000-080068A, a compound described in JP2006-342166A, or a compound described in JP2016-021012A can be used.

Examples of the oxime compound include 3-benzoyloxy-iminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxyimino-1-phenylpropane-1-one, 3-(4-toluene sulfonyloxy) iminobutane-2-one, and 2-ethoxycarbonyloxyimino-1-phenylpropane-1-one. In addition, examples of the oxime compound including a compound described in J.C.S. Perkin II (1979), pp. 1653-1660, J.C.S. Perkin II (1979), pp. 156-162 and Journal of Photopolymer Science and Technology (1995), pp. 202-232, JP2000-066385A, JP2000-080068A, JP2004-534797A, or JP2006-342166A can be used.

As a commercially available product of the oxime compound, IRGACURE-OXE01, IRGACURE-OXE02, IRGACURE-OXE03, or IRGACURE-OXE04 (all of which are manufactured by BASF SE) can also be used. Furthermore, TR-PBG-304 (manufactured by Changzhou Tronly New Electronic Materials CO., LTD.) and Adekaoptomer N-1919 (manufactured by ADEKA CORPORATION, the photopolymerization initiator 2 described in JP2012-014052A) can also be used.

As the oxime compound, it is also preferable to use a compound having no colorability and/or a compound having high transparency and hardly being discolored. Examples of commercially available products include Adeka Arcles NCI-730, NCI-831, and NCI-930 (all of which are manufactured by ADEKA CORPORATION).

An oxime compound having a fluorene ring can also be used as the photopolymerization initiator. Specific examples of the oxime compound having a fluorene ring include a compound described in JP2014-137466A. The content is incorporated herein by reference.

An oxime compound having a fluorine atom can also be used as the photopolymerization initiator. Specific examples of the oxime compound having a fluorine atom include a compound described in JP2010-262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. The oxime compound having a nitro group may be a dimer. Specific examples of the oxime compound having a nitro group include a compound described in paragraph numbers "0031" to "0047" of JP2013-114249A and paragraph numbers "0008" to "0012" and "0070" to "0079" of JP2014-137466A, a compound described in paragraph numbers "0007" to "0025" of JP4223071B, and ADEKA ARKLS NCI-831 (manufactured by ADEKA CORPORATION).

Specific examples of the oxime compound are shown below, but the oxime compound is not limited thereto.

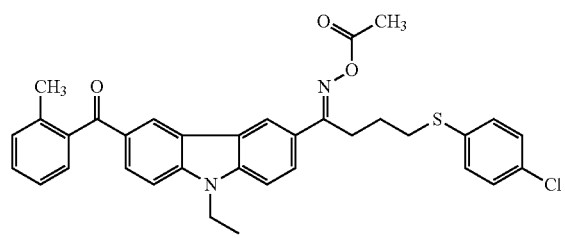

(C-1)

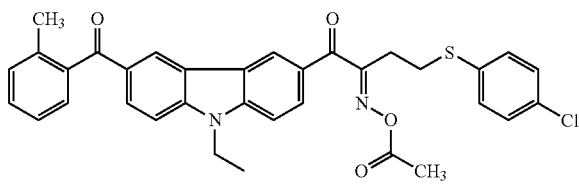

(C-2)

-continued
(C-3)
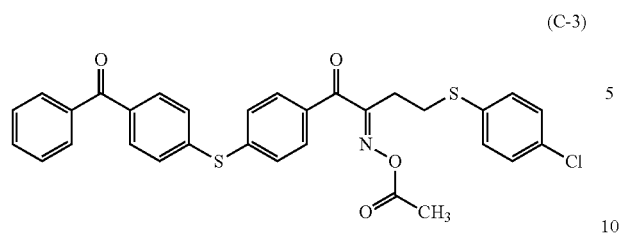
(C-4)
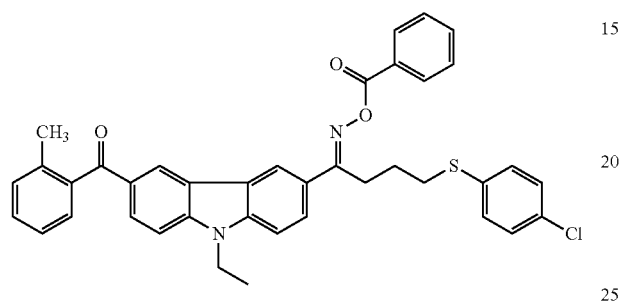
(C-5)
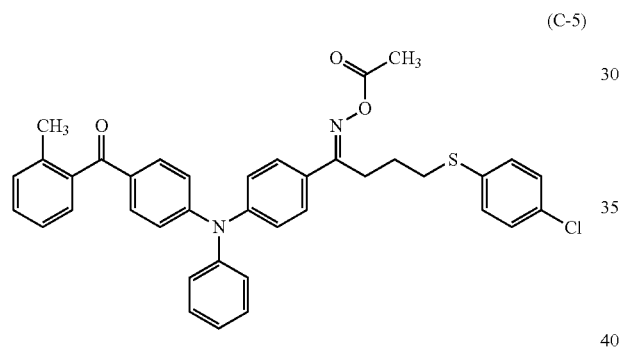
(C-6)
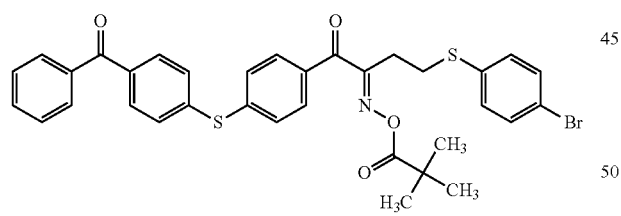
(C-7)
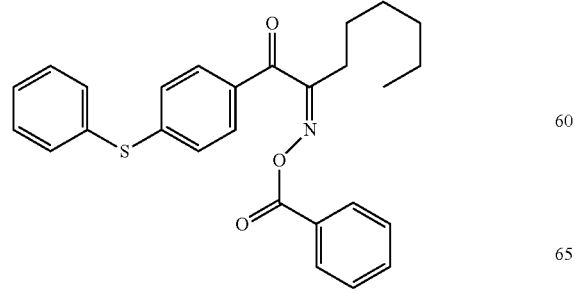
-continued
(C-8)
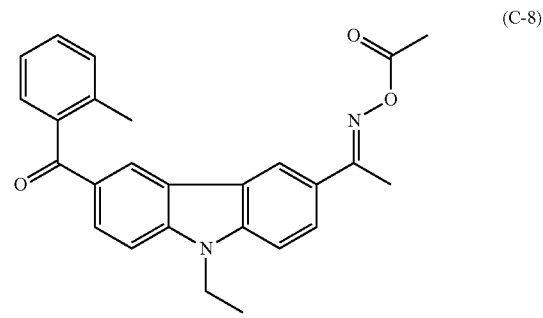
(C-9)
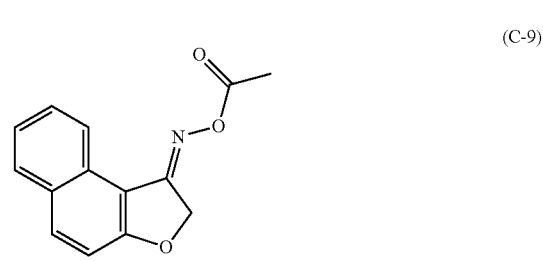
(C-10)
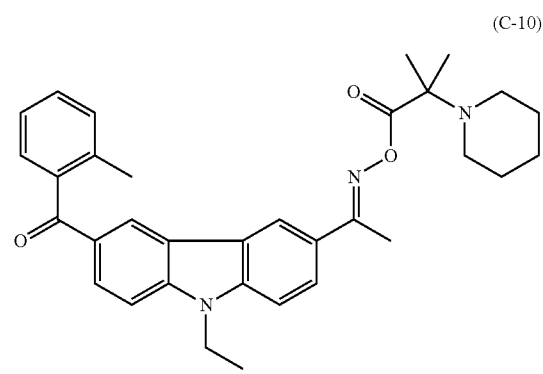
(C-11)
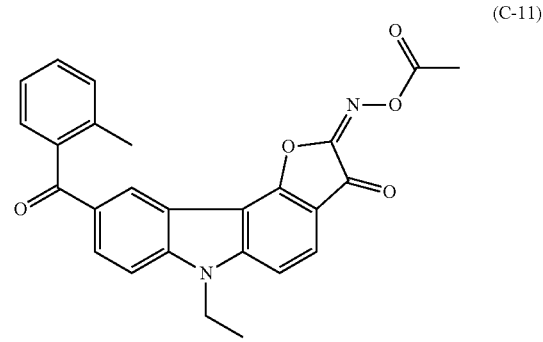
(C-12)
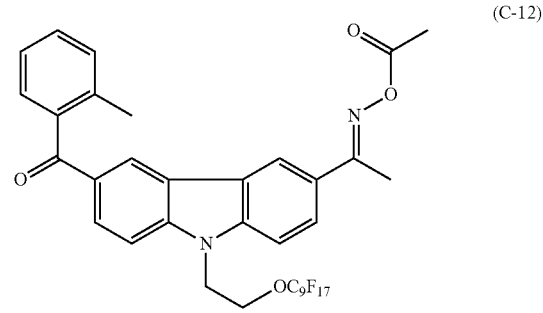

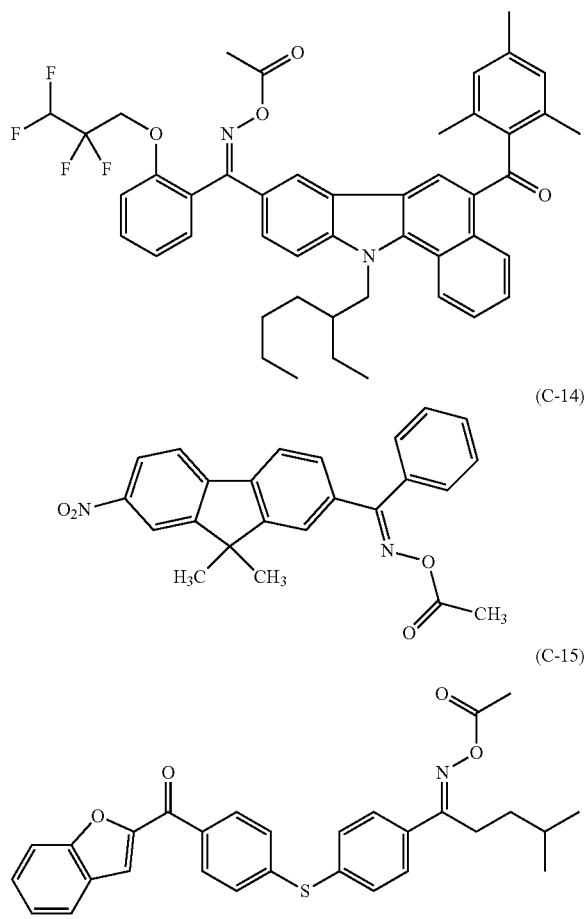

The oxime compound is preferably a compound having a maximum absorption wavelength in a wavelength range of 350 to 500 nm and more preferably a compound having a maximum absorption wavelength in a wavelength range of 360 to 480 nm. In addition, the oxime compound is preferably a compound having a high absorbance at 365 nm and 405 nm.

The molar absorption coefficient of the oxime compound at 365 nm or 405 nm is preferably 1000 to 300000, more preferably 2000 to 300000, and even more preferably 5000 to 200000 from the viewpoint of sensitivity.

The molar absorption coefficient of the compound can be measured using a well-known method. For example, it is preferable that the absorption coefficient is measured using a spectrophotometer (Cary-5 spectrophotometer, manufactured by Varian Medical Systems, Inc.) and ethyl acetate as a solvent at a concentration of 0.01 g/L.

It is also preferable to use two or more kinds of photopolymerization initiators in combination. For example, a photopolymerization initiator of which a light absorption coefficient of 365 nm in methanol is $1.0 \times 10^3$ mL/gcm or more and a photopolymerization initiator of which a light absorption coefficient of 365 nm in methanol is $1.0 \times 10^2$ mL/gcm or less and a light absorption coefficient of 254 nm is $1.0 \times 10^3$ mL/gcm or more are also preferably used in combination. A specific example includes a combination of an α-aminoketone compound and an oxime compound. According to the embodiment, a film having excellent curability can be manufactured even under a low temperature condition. In a step of forming a pattern, at a second stage before a development step and after the development step, the composition for forming a light attenuating layer is exposed, so that the composition for forming a light attenuating layer can be appropriately cured by a first exposure and the entire composition for forming a light attenuating layer can be substantially cured by the next exposure. For this reason, the curability of the composition for forming a light attenuating layer can be improved even under the low temperature condition.

As the photopolymerization initiator, a bifunctional or trifunctional or higher compound can also be used. Specific examples of such an initiator include dimers of the oxime compound described in JP2010-527339A, JP2011-524436A, WO2015/004565A, paragraphs 0417 to 0412 of JP2016-532675A, paragraphs 0039 to 0055 of WO2017/033680A, compounds (E) and (G) described in JP2013-522445A, and Cmpd 1 to 7 described in WO2016/034963A.

(Resin)

The composition for forming a light attenuating layer may contain a resin. The resin typically functions as a dispersant or binder. The dispersant has a function of dispersing the inorganic pigment and the specific colorant in the composition for forming a light attenuating layer. However, the above-described uses of the resin are merely Exampley, and the resin may be used for purposes other than the uses.

The weight-average molecular weight (Mw) of the resin is preferably 1000 to 200000, and more preferably 2000 to 100000.

The content of the resin in the composition for forming a light attenuating layer is not particularly limited, but is generally preferably 0.1% to 50% by mass with respect to a total solid content of the composition for forming a light attenuating layer. One kind of resin may be used alone, or two or more kinds of resins may be used in combination. In a case where two or more kinds of resins are used in combination, a total content is preferably within the above range.

Binder

The composition for forming a light attenuating layer preferably contains a binder as a resin. A well-known binder can be used optionally. Examples thereof include a (meth) acrylic resin, a phenol resin, a melamine resin, a urea resin, an alkyd resin, a (meth)acrylamide resin, an epoxy resin, an enethiol resin, a polycarbonate resin, a polyether resin, a polyarylate resin, a polysulfone resin, a polyethersulfone resin, a polyphenylene resin, a polyarylene ether phosphine oxide resin, a polyimide resin, a polyamide imide resin, a polyolefin resin, a cyclic olefin resin, a polyester resin (among these, an unsaturated polyester resin is preferable), a styrene resin, a siloxane resin, and the like. One kind of binder may be used alone, or a mixture of two or more kinds of binders may be used from the above resins.

Among these, the specific resins are preferable.

As the cyclic olefin resin, a norbornene resin can be preferably used from the viewpoint of improving heat resistance. Examples of commercially available norbornene resins include ARTON series (for example, ARTON F4520) manufactured by JSR Corporation. As the epoxy resins, Marproof G-0150M, G-0105SA, G-0130SP, G-0250SP, G-1005S, G-1005SA, G-1010S, G-2050M, G-01100, and G-01758. (manufactured by NOF CORPORATION, epoxy group-containing polymer) can also be used.

An alkali-soluble resin can be used as the binder. In a case of using an alkali-soluble resin, the composition for forming a light attenuating layer has more excellent developability.

The resin having an acid group can also be used as an alkali-soluble resin. Examples of the acid group include a carboxy group, a phosphate group, a sulfo group, and a phenolic hydroxy group. Among these, a carboxy group is preferable. The alkali-soluble resin may have one acid group or two or more acid groups.

The acid value of the alkali-soluble resin is not particularly limited, but generally preferably 30 to 500 mgKOH/g. The lower limit is more preferably 50 mgKOH/g or higher and even more preferably 70 mgKOH/g or higher. The upper limit is more preferably 400 mgKOH/g or lower, even more preferably 200 mgKOH/g or lower, particularly preferably 150 mgKOH/g or lower, and most preferably 120 mgKOH/g or lower.

As the alkali-soluble resin, a polymer having a carboxy group at a side chain is preferable. Specific examples of the alkali-soluble resin include an alkali-soluble phenol resin such as a methacrylic acid copolymer, an acrylic acid copolymer, an itaconic acid copolymer, a crotonic acid copolymer, a maleic acid copolymer, a partially esterified maleic acid copolymer, or a novolac resin; an acidic cellulose derivative having a carboxy group at a side chain thereof; and a resin obtained by adding an acid anhydride to a polymer having a hydroxy group.

In particular, a copolymer of (meth)acrylic acid and another monomer which is copolymerizable with the (meth) acrylic acid is preferable as the alkali-soluble resin. Examples of the monomer which is copolymerizable with the (meth)acrylic acid include alkyl (meth)acrylate, aryl (meth)acrylate, and a vinyl compound.

Examples of the alkyl (meth)acrylate and the aryl (meth) acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth) acrylate, tolyl (meth)acrylate, naphthyl (meth)acrylate, and cyclohexyl (meth)acrylate.

Examples of the vinyl compound include styrene, α-methylstyrene, vinyl toluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer.

Examples of others include an N-position-substituted maleimide monomer described in JP1998-300922A (H10-300922A) such as N-phenylmaleimide or N-cyclohexylmaleimide. Among these monomers which are copolymerizable with the (meth)acrylic acid, one kind may be used alone, or two or more kinds may be used in combination.

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer is preferable.

In addition, copolymers described in JP1995-140654A (JP-H7-140654A) obtained by copolymerization of 2-hydroxyethyl (meth)acrylate are preferable, and examples thereof include: a copolymer including 2-hydroxypropyl (meth)acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid.

As the alkali-soluble resin, an alkali-soluble resin having a polymerizable group can also be used.

Examples of the polymerizable group include a (meth) allyl group and a (meth)acryloyl group. The alkali-soluble resin having a polymerizable group is preferably an alkali-soluble resin having a polymerizable group at a side chain. Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), VISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by DAICEL-ALLNEX LTD.), and ACRYCURE RD-F8 (manufactured by Nippon Shokubai Co., Ltd.).

As the alkali-soluble resin, a polymer obtained by polymerization of monomer components including a compound represented by the following Formula (ED1) and/or a compound represented by the following Formula (ED2) (hereinafter, these compounds will also be referred to as "ether dimer") is also preferable. The details of the polymer obtained by polymerization of monomer components including the ether dimer can be found in paragraph numbers 0022 to 0031 of JP2015-034961A, the contents of which are incorporated herein by reference.

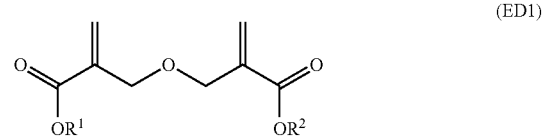

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

Specific examples of the ether dimer can be found in paragraph number "0317" of JP2013-029760A, the content of which is incorporated herein by reference. Among these ether dimers, one kind may be used alone, or two or more kinds may be used in combination.

The alkali-soluble resin may include a repeating unit which is derived from a compound represented by the following Formula (X).

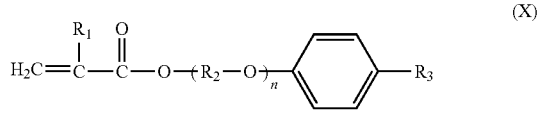

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

Specific examples of the alkali-soluble resin include the following resins. In addition, examples of the resins include resins described in a paragraph number 0037 of JP2015-034961A. Among these resins, the alkali-soluble resin having a polymerizable group such as C-2 represented below is preferable from the viewpoint of solvent resistance.

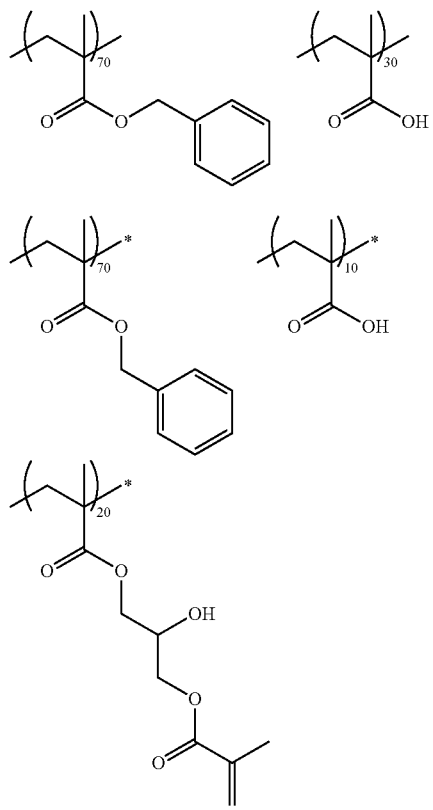

Dispersant

The composition for forming a light attenuating layer preferably contains a dispersant as a resin. The dispersant preferably contains at least one kind selected from the group consisting of an acidic resin, a basic resin, and an amphoteric resin, and more preferably contains at least one kind selected from the group consisting of an acidic resin and an amphoteric resin.

In the present specification, an acidic resin means a resin having an acid group, and having an acid value of 5 mgKOH/g or higher and an amine value of lower than 5 mgKOH/g. The acidic resin preferably does not have the basic group. Examples of the acid group included in the acidic resin include a carboxy group, a phosphate group, a sulfo group, and a phenolic hydroxy group. Among these, a phosphate group or a carboxy group is preferable. The acid value of the acidic resin is preferably 5 to 200 mgKOH/g. The lower limit is more preferably 10 mgKOH/g or higher and even more preferably 20 mgKOH/g or higher. The upper limit is more preferably 100 mgKOH/g or lower and even more preferably 60 mgKOH/g or lower. In addition, the amine value of the acidic resin is preferably 2 mgKOH/g or lower and more preferably 1 mgKOH/g or lower.

In the present specification, a basic resin means a resin having a basic group, and having an amine value of 5 mgKOH/g or higher and an acid value of lower than 5 mgKOH/g. The basic resin preferably does not have the acid group. The basic group in the basic resin is preferably amino group. An amine value of the basic resin is preferably 5 to 200 mgKOH/g, more preferably 5 to 150 mgKOH/g, and even more preferably 5 to 100 mgKOH/g.

In the present specification, an amphoteric resin means a resin having an acid group and a basic group, and having an acid value of 5 mgKOH/g or higher and an amine value of 5 mgKOH/g or higher.

The form of the acid group is the same as the above acidic resin, and a carboxy group is preferable. The form of the basic group is the same as the above basic resin, and an amino group is preferable.

The acid value of the amphoteric resin is preferably 5 to 200 mgKOH/g. The lower limit is more preferably 10 mgKOH/g or higher and even more preferably 20 mgKOH/g or higher. The upper limit is more preferably 150 mgKOH/g or lower and even more preferably 100 mgKOH/g or lower. The amine value is preferably 5 to 200 mgKOH/g. The lower limit is more preferably 10 mgKOH/g or higher and even more preferably 20 mgKOH/g or higher. The upper limit is more preferably 150 mgKOH/g or lower and even more preferably 100 mgKOH/g or lower. A ratio of the amphoteric resin between the acid value and the amine value is preferably acid value:amine value=1:4 to 4:1, and more preferably 1:3 to 3:1.

Examples of the dispersant include: a polymer dispersant such as a resin having an amine group (polyamideamine or a salt thereof), an oligoimine resin, a polycarboxylic acid or a salt thereof, a high-molecular-weight unsaturated acid ester, a modified polyurethane, a modified polyester, a modified poly(meth)acrylate, a (meth)acrylic copolymer, or a naphthalene sulfonic acid formalin polycondensate. In terms of a structure, the polymer dispersant can be further classified into a linear polymer, a terminal-modified polymer, a graft polymer, and a block polymer.

The dispersant is preferably a resin including an inorganic pigment and/or a site having adsorbing ability with respect to a specific colorant (hereinafter, also referred to as an "adsorption site"). Examples of the adsorption site include a monovalent substituent having at least one kind selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxy group. The adsorption site is preferably an acid group. Among these, the adsorption site is preferably at least one of a group containing a phosphorus atom and/or a carboxy group. Examples of the group containing a phosphorus atom include a phosphate ester group, a polyphosphate ester group, a phosphate group, and the like. The details of the adsorption site can be found in paragraph numbers "0073"

to "0080" of JP2015-034961A, the content of which is incorporated herein by reference.

In the present invention, the dispersant is preferably a compound represented by the following formula (111).

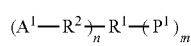
(111)

In the formula (111), $R^1$ represents a (m+n)-valent linking group, and $R^2$ represents a single bond or a divalent linking group. $A^1$ represents a monovalent substituent having at least one kind selected from the group consisting of an acid group, an urea group, an urethane group, a group having a coordinating oxygen atom, a group having a basic nitrogen atom, a heterocyclic group, an alkyloxycarbonyl group, an alkylaminocarbonyl group, a carboxy group, a sulfonamide group, an alkoxysilyl group, an epoxy group, an isocyanate group, and a hydroxy group. The n number of $A^1$'s and $R^2$'s each may be the same as or different from each other. m represents a positive integer of 8 or less, n represents an integer of 1 to 9, and m+n satisfies 3 to 10. $P^1$ represents a monovalent polymer chain. The m number of $P^1$'s may be the same as or different from each other.

The resin represented by the formula (111) can be found in the description of paragraph number 0039 of JP2007-277514A (corresponding to paragraph number 0053 of US2010/0233595A), paragraph numbers 0081 to 0117 of JP2015-034961A, JP5909468B, JP5894943B, and JP5894944, the contents of which are incorporated herein by reference.

In the present invention, as the resin (dispersant), a graft copolymer including a repeating unit represented by any one of the following Formulae (11) to (14) can be used.

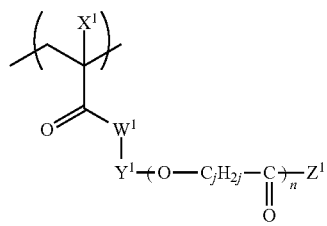
(11)

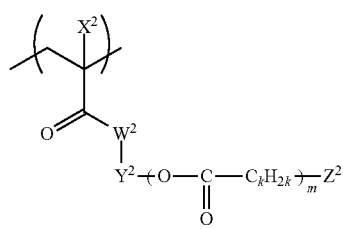
(12)

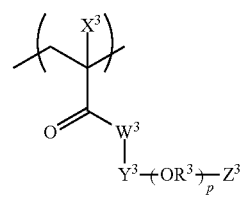
(13)

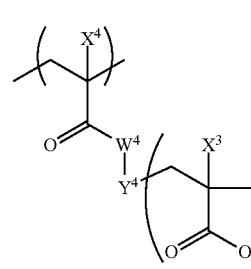
(14)

In Formulae (11) to (14), $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (13), in a case where p represents 2 to 500, a plurality of $R^3$'s may be the same as or different from each other. In Formula (14), in a case where q represents 2 to 500, a plurality of $X^5$'s and a plurality of $R^4$'s may be the same as or different from each other.

Examples of the graft copolymer can be found in the description of paragraph numbers 0025 to 0094 of JP2012-255128A, the content of which is incorporated herein by reference. In addition, specific examples of the graft copolymer include the following resins. Other examples of the graft copolymer include resins described in paragraph numbers "0072" to "0094" of JP2012-255128A, the content of which is incorporated herein by reference.

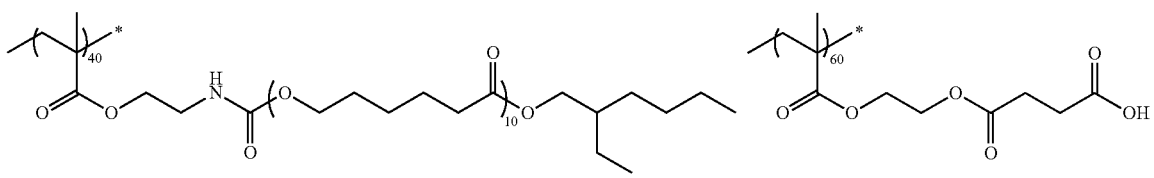

In addition, in the present invention, as the dispersant, an oligoimine dispersant containing a basic nitrogen atom in at least one selected from the group consisting of a main chain and a side chain is also preferably used. As the oligoimine dispersant, a resin, which includes a repeating unit having a partial structure X with a functional group having a pKa of 14 or lower and a side chain including an oligomer chain or a polymer chain Y having 40 to 10000 atoms and which has a basic nitrogen atom at least either a main chain or a side chain, is preferable. This dispersant interacts with the inorganic pigment and/or the specific colorant at both a nitrogen atom and the partial structure X with a functional group having the pKa of 14 or lower, and the oligomer chain or the polymer chain Y functions as a steric repulsion group. Thereby, excellent dispersibility is exhibited, so that the inorganic pigment and/or the specific colorant can be uniformly dispersed in the composition.

In the present specification, the basic nitrogen atom is not particularly limited as long as a nitrogen atom exhibits basicity, but the resin preferably contains a structure having a nitrogen atom having a pKb of 14 or less, and more preferably contains a structure having a nitrogen atom having a pKb of 10 or less. In the present invention, "pKb (base strength)" refers to pKb at a water temperature of 25° C. and is one of indexes for quantitatively expressing the base strength, and the basicity constant is also the same. The base strength pKb and the acid strength pKa have a relationship of pKb=14−pKa.

Examples of the graft copolymer can be found in the description of paragraph numbers 0025 to 0094 of JP2012-255128A, the content of which is incorporated herein by reference. In addition, specific examples of the graft copolymer include the following resins. Other examples of the graft copolymer include resins described in paragraph numbers "0072" to "0094" of JP2012-255128A, the content of which is incorporated herein by reference.

$a/b/c/d/e = 36/4/35/1/24$ (mol %) $x = 48$ $y = 12$

Examples of commercially available dispersants include Solsperse 36000 and 41000 (all of which are manufactured by The Lubrizol Corporation): Light ester P-1M and Light ester P-2M (all of which are manufactured by KYOEISHA CHEMICAL Co., Ltd.).

In addition, a pigment dispersant described in paragraph numbers "0041" to "0130" of JP2014-130338A can also be used, the content of which is incorporated herein by reference. One kind of dispersant can be used alone, or two or more kinds of dispersants can be used in combination. As the dispersant, the resins described in the above description of the binder can also be used. Furthermore, as the dispersant, a resin having a refractive index of 1.5 or less with respect to light having a wavelength of 589 nm may be used.

(Other Components)

The composition for forming a light attenuating layer preferably contains other components other than the above described components. Examples of the other components include a solvent, an ultraviolet absorber, an adhesion agent, and a surfactant.

Solvent

The composition for forming a light attenuating layer preferably contains a solvent. The content of the solvent in the composition for forming a light attenuating layer is not particularly limited, but is generally preferably 65% to 90% by mass with respect to a total mass of the composition for forming a light attenuating layer. One kind of solvent may be used alone, or two or more kinds of solvents may be used in combination. In a case where two or more kinds of solvents are used in combination, a total content is preferably within the above range.

The solvent is not particularly limited, water, an organic solvent, or a mixture thereof can be used.

Examples of the organic solvent include organic solvents containing esters, ethers, ketones, aromatic hydrocarbons, or the like. Examples of the organic solvent can be found in the description of paragraph number 0223 of WO2015/166779A, the content of which is incorporated herein by reference.

In addition, an ester solvent in which the cyclic alkyl group is substituted, and a ketone solvent in which the cyclic alkyl group is substituted can also be used.

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, cyclohexyl acetate, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate, ethyl lactate, butyl diglycol acetate, 3-methoxybutyl acetate, and the like. In addition, 3-methoxy-N,N-dimethylpropanamide and 3-butoxy-N,N-dimethylpropanamide are also preferable from the viewpoint of improving solubility. These organic solvents can be used alone or in combination. In this case, it may be preferable that the content of the aromatic hydrocarbon (for example, benzene, toluene, xylene, or ethylbenzene) as the solvent is lowered (for example, 50 mass parts per million (ppm) or lower, 10 mass ppm or lower, or 1 mass ppm or lower with respect to the total mass of the organic solvent) in consideration of environmental aspects and the like.

In the present invention, it is preferable to use a solvent having a low metal content as the solvent. The metal content of the solvent is, for example, preferably 10 mass parts per billion (ppb) or less. The mass parts per trillion (ppt) level may be used as necessary.

Examples of a method of removing impurities such as metals from the solvent include distillation, filtration, and combinations thereof.

Ultraviolet Absorber

The composition for forming a light attenuating layer may include an ultraviolet absorber.

The ultraviolet absorber is preferably a conjugated diene compound, and more preferably a compound represented by the following formula (I).

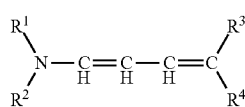

(I)

In the formula (I), $R^1$ and $R^2$ each independently represent a hydrogen atom, an alkyl group having 1 to 20 carbon atoms, or an aryl group having 6 to 20 carbon atoms, and $R^1$ and $R^2$ are the same as or different from each other, but, are not represented by the hydrogen atoms at the same time.

The details of the substituent of the ultraviolet absorber represented by the formula (I) can be found in the description of paragraph numbers 0024 to 0033 of WO2009/123109A (corresponding to paragraph numbers 0040 to 0059 of US2011/0039195A), the contents of which are incorporated herein by reference. Examples of the compounds represented by the formula (I) can be found in the description of exemplified compounds (1) to (14) in paragraph numbers 0034 to 0037 of WO2009/123109A (corresponding to paragraph number 0060 of US2011/0039195A), the contents of which are incorporated herein by reference. Specific examples of the ultraviolet absorber represented by the formula (I) include the following compounds.

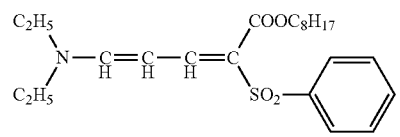

The content of the ultraviolet absorber in the composition for forming a light attenuating layer is not particularly limited, but is generally preferably 0.1% to 10% by mass with respect to a total solid content of the composition for forming a light attenuating layer. One kind of ultraviolet absorber may be used alone, or two or more kinds of ultraviolet absorbers may be used in combination. In a case where two or more kinds of ultraviolet absorbers are used in combination, a total content is preferably within the above range.

Uvinul A (manufactured by BASF SE) can also be used as the ultraviolet absorber. As the ultraviolet absorber, ultraviolet absorbers such as an aminodiene compound, a salicylate compound, a benzophenone compound, a benzotriazole compound, an acrylonitrile compound, a triazine compound, and the like can be used, specific examples thereof include the compounds described in JP2013-068814A. As the benzotriazole compound, MYUA series (manufactured by Miyoshi Oil&Fat Co., Ltd.; The Chemical Daily, Feb. 1, 2016) may be used.

Adhesion Agent

The composition for forming a light attenuating layer may contain an adhesion agent. The adhesion agent is not particularly limited, but a well-known adhesion agent can be used. An example of the adhesion agent includes a silane coupling agent. The content of the adhesion agent in the composition for forming a light attenuating layer is not particularly limited, but is generally preferably 0.01% to 10% by mass with respect to a total solid content of the composition for forming a light attenuating layer. One kind of adhesion agent may be used alone, or two or more kinds of adhesion agents may be used in combination. In a case where two or more kinds of adhesion agents are used in combination, a total content is preferably within the above range.

In the present specification, the silane coupling agent refers to a silane compound having a functional group other than a hydrolyzable group. In addition, the hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group has a group which interacts with the resin or forms a bond with the resin to exhibit affinity. Examples thereof include a (meth)acryloyl group, a phenyl group, a mercapto group, an epoxy group, an oxetanyl group, and the like, and a (meth)acryloyl group or an epoxy group is preferable. That is, the silane coupling agent is preferably a compound containing an alkoxysilyl group and at least one of a (meth)acryloyl group or an epoxy group. The number of carbon atoms of the alkoxy group in the alkoxysilyl group is preferably 1 to 5, more preferably 1 to 3, and particularly preferably 1 or 2. The number of alkoxysilyl groups is preferably 2 or more, more preferably 2 to 3 in the same molecule. In addition, examples of the silane coupling agent include a compound described in paragraph numbers 0018 to 0036 of JP2009-288703A, a compound described in paragraph numbers 0056 to 0066 of JP2009-242604A, and a compound described in paragraph numbers 0011 to 0037 of JP2009-288703A, the contents of which are incorporated herein by reference.

Surfactant

The composition for forming a light attenuating layer may include various surfactants from the viewpoint of further improving coating properties. Examples of the surfactant include a nonionic surfactant, a cationic surfactant, and an anionic surfactant, and may be a fluorine surfactant, a silicone surfactant, or the like.

By allowing the composition for forming a light attenuating layer to contain a fluorine surfactant, the liquid characteristics (particularly, fluidity) in a case of being prepared as a coating solution are further improved, and uniformity of a coating thickness and/or liquid saving properties can be further improved.

A fluorine content in the fluorine surfactant is preferably 3% to 40% by mass, more preferably 5% to 30% by mass, and even more preferably 7% to 25% by mass. The fluorine surfactant in a case where the fluorine content is in the above-described range is effective from the viewpoints of the uniformity of the thickness of a coating film and the liquid saving properties, and the solubility thereof in the composition for forming a light attenuating layer is also excellent.

Specific examples of the fluorine surfactant include surfactants described in paragraph numbers 0060 to 0064 of JP2014-041318A (corresponding to paragraph numbers "0060" to "0064" of WO2014/017669A) and surfactants described in paragraph numbers "0117" to "0132" of JP2011-132503A, the content of which is incorporated herein by reference. Examples of the commercially available fluorine surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all of which are manufactured by DIC Corporation), Fluorad FC430, Fluorad FC431, and Fluorad FC171 (all of which are manufactured by Sumitomo 3M Limited), Surflon S-382, Surflon SC-101, Surflon SC-103, Surflon SC-104, Surflon SC-105, Surflon SC-1068, Surflon SC-381, Surflon SC-383, Surflon S-393, and Surflon KH-40 (all of which are manufactured by ASAHI GLASS CO., LTD.), and PolyFox PF636, PF656, PF6320, PF6520, and PF7002 (above are manufactured by OMNOVA Solutions Inc.).

In addition, as the fluorine surfactant, an acrylic compound in which, in a case where heat is applied to a molecular structure which has a functional group having a fluorine atom, the functional group having a fluorine atom is cut and a fluorine atom is volatilized can also be preferably used. Examples of the fluorine surfactant include MEGAFACE DS series (manufactured by DIC Corporation, The Chemical Daily, Feb. 22, 2016, Nikkei Business Daily, Feb. 23, 2016), for example, MEGAFACE DS-21.

As the fluorine surfactant, a block polymer can also be used. Examples of the block polymer include a compound described in JP2011-089090A. As the fluorine surfactant, a fluorine-containing polymer compound can be used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

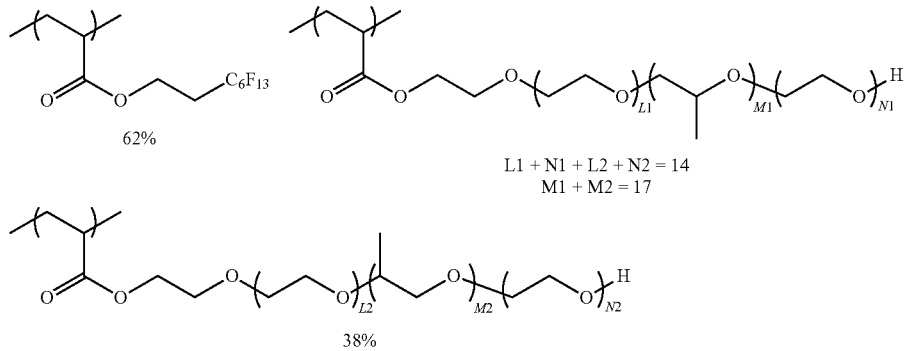

The weight-average molecular weight of the compound is preferably 3000 to 50000 and, for example, 14000. "%" representing the ratio of a repeating unit is % by mass.

In addition, as the fluorine surfactant, a fluorine-containing polymer having an ethylenically unsaturated group at a side chain can also be used. Specific examples include a compound described in paragraph numbers 0050 of 0090 and paragraph numbers 0289 to 0295 of JP2010-164965A, and MEGAFACE RS-101, RS-102, RS-718K, and RS-72-K manufactured by DIC Corporation. As the fluorine surfactant, a compound described in paragraph numbers 0015 to 0158 of JP2015-117327A can also be used.

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP-341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination. The content of the surfactant is preferably 0.001% to 2.0% by mass with respect to a total solid content of the composition for forming a light attenuating layer.

Compound Having Epoxy Group

The composition for forming a light attenuating layer may contain a compound having an epoxy group. The light attenuating layer formed by the composition for forming a light attenuating layer containing the compound having an epoxy group has better solvent resistance. Examples of the compound having an epoxy group include a monofunctional or polyfunctional glycidyl ether compound, a polyfunctional aliphatic glycidyl ether compound, and the like. In addition, a compound having an alicyclic epoxy group can also be used.

Examples of the compound having an epoxy group include a compound having one or more epoxy groups per molecule. The number of epoxy groups is preferably 1 to 100 per molecule. The upper limit can be, for example, 10 or less, or 5 or less. The lower limit is preferably 2 or more.

In the compound having an epoxy group, the epoxy equivalent (=molecular weight of compound having epoxy group/the number of epoxy groups) is preferably 500 g/equivalent or less, more preferably 100 to 400 g/equivalent, and even more preferably 100 to 300 g/equivalent.

The compound having an epoxy group may be a low molecular weight compound (for example, molecular weight: lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and even more preferably 3000 or lower. The compound having an epoxy group is preferably an aliphatic epoxy resin from the viewpoint of solvent resistance.

Examples of a commercially available product of the compound having an epoxy group include EHPE3150 (manufactured by Daicel Corporation) and EPICLON N-695 (manufactured by DIC Corporation). In addition, as the compound having an epoxy group, compounds described in paragraph numbers 0034 to 0036 of JP2013-011869A, paragraph numbers 0147 to 0156 of JP2014-043556A, and paragraph numbers 0085 to 0092 of JP2014-089408A can be used, the content of which is incorporated herein by reference.

Other Components

In addition to the above described composition for forming a light attenuating layer, a coloration inhibitor, a chain transfer agent, a sensitizer, and the like may be contained in the composition for forming a light attenuating layer. As the other components, any known compounds can be used, and the content thereof is appropriately determined.

[Colored Layer]

Examples of the colored layer include a green colored layer, a red colored layer, a blue colored layer, a cyan colored layer, a magenta colored layer, and a yellow colored layer, and these colored layers may be used alone or two or more kinds may be used in combination. Among these, a combination of at least two selected from the group consisting of the green colored layer, the red colored layer, and the blue colored layer is preferably used, and a combination of three colored layers is more preferably used.

In addition, a combination of at least two kinds or more selected from the group consisting of the cyan colored layer, the magenta colored layer, and the yellow colored layer is also preferably used, and a combination of three colored layers is more preferably used.

In a case where the red colored layer is used to form the red pixel, a wavelength at which a transmission spectrum of the red pixel (that is, the red colored layer used for the red pixel) is maximized is not particularly limited, but is generally preferably 575 nm and more preferably 575 to 670 nm.

In a case where the green colored layer is used to form the green pixel, a wavelength at which a transmission spectrum of the green pixel (that is, the green colored layer used for the green pixel) is maximized is not particularly limited, but is generally preferably 480 nm or more and less than 575 nm.

In a case where the blue colored layer is used to form the blue pixel, a wavelength at which a transmission spectrum of the blue pixel (that is, the blue colored layer used for the blue pixel) is maximized is not particularly limited, but is generally preferably less than 480 nm, and more preferably 400 nm or more and less than 480 nm.

In a case where the cyan colored layer is used to form the cyan pixel, a wavelength at which an absorption spectrum of the cyan pixel (that is, the cyan colored layer used for the cyan pixel) is maximized is not particularly limited, but is generally preferably more than 580 nm and 700 nm or less.

In a case where the magenta colored layer is used to form the magenta pixel, a wavelength at which an absorption spectrum of the magenta pixel (that is, the magenta colored layer used for the magenta pixel) is maximized is not particularly limited, but is generally preferably 500 nm to 580 nm.

In a case where the yellow colored layer is used to form the yellow pixel, a wavelength at which an absorption spectrum of the yellow pixel (that is, the yellow colored layer used for the yellow pixel) is maximized is not particularly limited, but is generally preferably 350 nm or more and less than 500 nm.

A thickness of the colored layer is not particularly limited. For example, the thickness is preferably 100 μm or less, more preferably 15 μm or less, even more preferably 5 μm or less, and particularly preferably 1 μm or less. In a case where the colored layer is formed with a plurality of layers, the thickness of each layer may be the same as or different from each other.

The colored layer is typically formed using a composition for forming a colored layer. The composition for forming a colored layer preferably contains a chromatic colorant. The chromatic colorant may be a pigment or a dye. The details of the chromatic colorant are described below. The content of the chromatic colorant is preferably 0.1% to 70% by mass with respect to a total solid content of the composition for forming a colored layer. The lower limit is preferably 0.5% by mass or higher and more preferably 1.0% by mass or higher. The upper limit is preferably 60% by mass or lower, and more preferably 50% by mass or lower.

The pigment contained in the colored layer is not particularly limited, and a known pigment can be used. One kind of pigment may be used alone, or two or more kinds of pigments may be used in combination. Examples of the pigment contained in the colored layer include a red colorant, a blue colorant, a yellow colorant, a green colorant, a violet colorant, and combinations thereof. In the present specification, the red colorant is a colorant having a maximum absorption wavelength at 450 to 600 nm, the blue colorant is a colorant having a maximum absorption wavelength at 500 to 800 nm, and the yellow colorant is a colorant having a maximum absorption wavelength at 350 to 550 nm, the green colorant is a colorant having a maximum absorption wavelength at 550 to 800 nm, and the violet colorant is a colorant having a maximum absorption wavelength at 450 to 800 nm.

As the yellow colorant, C.I. Pigment Yellow (in the present specification, also referred to as "PY") 139, 150, or 185 is preferable, PY139 or PY150 is more preferable, and PY139 is even more preferable.

As the blue colorants, C.I. Pigment Blue (in the present specification, also referred to as "PB") 15:6 or 16 is preferable.

As the violet colorant, C.I. Pigment Violet (in the present specification, also referred to as "PV") 23 is preferable.

As the red colorant, C.I, Pigment Red (in the present specification, also referred to as "PR") 122, 177, 224, 254, or 264 is preferable, PR122, PR177, PR254, or PR264 is more preferable, and PR177, PR254, or PR264 is even more preferable. As the green colorant, C.I. Pigment Green (in the present specification, also referred to as "PG") 7, 36, 58, or 59 is preferable.

Among these, in a case where the red colored layer is used to form a red pixel, the red pixel (that is, the red colored layer used for the red pixel) preferably contains at least one kind of pigment selected from the group consisting of PR254, PR264, PR177, and PY139; in a case where the green colored layer is used to form a green pixel, the green pixel (that is, the green colored layer used for the green pixel) preferably contains at least one kind of pigment selected from the group consisting of PG58, PG59, PG36, PG7, PY139, PY185, and PY150; and in a case where the blue colored layer is used to form a blue pixel, the blue pixel (that is, the blue colored layer used for the blue pixel) preferably contains at least one kind of pigment selected from the group consisting of PB15 6, PB16, and PV23.

The composition for forming a colored layer may further include additives such as a resin, a curable compound, a polymerization initiator, a solvent, a surfactant, a polymerization inhibitor, an ultraviolet absorber, a coloration inhibitor, an adhesion agent, a chain transfer agent, a sensitizer, and a co-sensitizer. Detailed materials are included in the materials used for the above described composition for forming a light attenuating layer, and the preferable range is also the same. Furthermore, a preferable content of the materials is the same as the content of the composition for forming a light attenuating layer.

Among these, a resin included in the composition for forming a colored layer and the colored layer is preferably the specific resin. In a case where the colored layer contains the light attenuating layer and/or the specific resin which is the same resin as the lens, excellent adhesiveness between the colored layer and the light attenuating layer and/or the colored layer and the lens can be obtained.

[Transparent Layer]

In a transparent layer, a minimum value of the light transmittance in a wavelength range of 400 to 700 nm is preferably 80% or higher, more preferably 90% or higher, and even more preferably 95% or higher. In addition, in the transparent layer, the minimum value of the light transmittance in a wavelength range of 700 to 1000 nm is preferably 80% or higher, more preferably 90% or higher, and even more preferably 95% or higher. Materials of the transparent layer are not particularly limited, but well-known materials can be used.

The transparent layer is typically formed using a composition for forming a transparent layer. The composition for forming a transparent layer preferably contains a resin. Examples of the resin include the materials used for the above described composition for forming a light attenuating layer, and the preferable range is also the same. Furthermore, a preferable content of the resin is the same as the content of the composition for forming a light attenuating layer. The composition for forming a transparent layer further contains oxide particles (referred to inorganic particles) containing at least one element selected from Ti, Zr, Sn, Sb, Cu, Fe, Mn, Pb, Cd, As, Cr, Hg, Zn, Al, Mg, Si, P, and S. In a case where the inorganic particles are contained, a content of the inorganic particles is preferably 20% to 70% by mass with respect to a total solid content of the composition for forming a transparent layer. The lower limit is preferably 25% by mass or higher and more preferably 30% by mass or higher. The upper limit is preferably 65% by mass or lower, and more preferably 60% by mass or lower. The composition for forming a transparent layer may further include additives such as a resin, a curable compound, a polymerization initiator, a solvent, a surfactant, a polymerization inhibitor, an ultraviolet absorber, a coloration inhibitor, an adhesion agent, a chain transfer agent, a sensitizer, and a co-sensitizer. Detailed materials are included in the materials used for the above described composition for forming a light attenuating layer, and the preferable range is also the same. Furthermore, a preferable content of the materials is the same as the content of the composition for forming a light attenuating layer.

Among these, a resin included in the composition for forming a transparent layer and the transparent layer is preferably the specific resin. In a case where the transparent layer contains the colored layer and/or the specific resin which is the same resin as the lens, excellent adhesiveness between the transparent layer and the colored layer and/or the transparent layer and the lens can be obtained. In addition, it is preferable that the transparent layer contains the specific resin which is the same resin as the light attenuating layer from the viewpoint of adhesiveness between the light attenuating layer and the transparent layer under high-temperature and high-humidity conditions.

[Infrared Transmitting Layer]

The infrared transmitting layer is preferably a layer having spectral characteristics in which visible light is shielded and at least a part of infrared rays is transmitted, and is not particularly limited thereto. In addition, the infrared transmitting layer may be one layer film (a single-layer film) or may be a laminate (a multi-layer film) having two or more layer films. Furthermore, in a case where the infrared transmitting layer includes the multi-layer film, the entire multi-layer film may have the above described spectral characteristics, and the single-layer film itself may not have the above described spectral characteristics.

Examples of the spectral characteristics of the infrared transmitting layer include that, for example, the maximum value of the light transmittance in the thickness direction in the wavelength range of 400 to 700 nm is 20% or less (preferably 15% or less, more preferably 10% or less) and the minimum value of the light transmittance in the thickness direction in the wavelength range of 700 to 1000 nm is 70% or more (preferably 75% or more, more preferably 80% or more).

The infrared transmitting layer is typically formed using a composition for forming an infrared transmitting layer. The composition for forming an infrared transmitting layer preferably contains a light-shielding material. The light-shielding material is preferably a coloring material that absorbs light in a wavelength range of violet to red. In addition, the light-shielding material is preferably a coloring material that shields light in the wavelength range of 400 to 700 nm. In addition, the light-shielding material is preferably a coloring material that allows light to be transmitted in the wavelength range of 700 to 1000 nm. An example of the light-shielding material includes a combination of a chromatic colorant and a black colorant.

In a case where an organic black colorant is used as the light-shielding material, the organic black colorant is preferably used in combination with the chromatic colorant. By using the organic black colorant and the chromatic colorant in combination, excellent spectral characteristics are easily obtained. Examples of the chromatic colorant used in combination with the organic black colorant include a red colorant, a blue colorant, and a violet colorant, and the red colorant and the blue colorant are preferable. The chromatic colorant and the organic black colorant may be used alone or in combination of two or more kinds. As mixing ratio between the chromatic colorant and the organic black colorant, the chromatic colorant is preferably 10 to 200 parts by mass and more preferably 15 to 150 parts by mass, with respect to 100 parts by mass of the organic black colorant.

A content of the pigment in the light-shielding material is preferably 95% by mass or more, more preferably 97% by mass or more, and even more preferably 99% by mass or more with respect to a total amount of the light-shielding material.

In a composition for forming an infrared transmitting layer, a content of the light-shielding material is preferably 5 to 50% by mass with respect to the total solid content of the composition for forming an infrared transmitting layer. The lower limit is preferably 9% by mass or higher and more preferably 13% by mass or higher. The upper limit is preferably 40% by mass or lower, and more preferably 30% by mass or lower.

The composition for forming an infrared transmitting layer may further include additives such as a resin, a curable compound, a polymerization initiator, a solvent, a surfactant, a polymerization inhibitor, an ultraviolet absorber, a coloration inhibitor, an adhesion agent, a chain transfer agent, a sensitizer, and a co-sensitizer. Detailed materials are included in the materials used for the above described composition for forming a light attenuating layer, and the preferable range is also the same. Furthermore, a preferable content of the materials is the same as the content of the composition for forming a light attenuating layer. Among these, a resin included in the composition for forming an infrared transmitting layer and the infrared transmitting layer is preferably the specific resin. In a case where the composition for forming an infrared transmitting layer and the infrared transmitting layer contain the light attenuating layer, the transparent layer, or the specific resin which is the same resin as the lens, excellent adhesiveness between the infrared transmitting layer and the lens can be obtained.

[Lens]

In the unit pixel, the lens is typically laminated on a light incident direction side of each laminate. Shapes and materials of the lens are not particularly limited, and known shapes and materials for the solid-state imaging element can be selected. Examples of the materials of the lens include resin or glass. In other words, the lens may be a lens containing a resin or a glass lens.

In a case where the lens contains a resin, the lens is typically formed using a composition for forming a lens containing a resin. Hereinbelow, a component of the composition for forming a lens will be described.

<Composition for Forming Lens>

A composition for forming a lens includes a resin. The resin containing the composition for forming a lens is not limited, but it is preferable to contain the specific resin already described. In a case where the lens contains a specific resin which is the same kind as the specific resin included in the light attenuating layer, the transparent layer, the colored layer, and/or the infrared transmitting layer, excellent adhesiveness between the lens and each layer can be obtained.

(Storage Container for Composition)

A storage container of each composition described above is not particularly limited, and a well-known storage container can be used. In addition, as the storage container, in order to suppress impurity incorporation into raw materials and compositions, a multi-layer bottle in which an inner wall of the container is formed in a multi-layer bottle having 6 kinds and 6 layers of resins or a bottle having 6 kinds and 7 layers of resins is also preferably used. Examples of the container include containers described in JP2015-123351A.

<Method of Preparing Composition>

Each composition described above can be prepared by mixing each component. In a case of preparing the composition, all the components may be dissolved or dispersed in a solvent at the same time to prepare the composition. Optionally, two or more solutions or dispersions to which the respective components are appropriately added may be prepared, and the solutions or dispersions may be mixed with each other during use (during application) to prepare the composition.

[Method of Manufacturing Laminate]

The laminate according to the embodiment of the present invention can be manufactured through a step of forming a composition layer by applying the composition forming each layer to a support, a step of drying the composition layer, and the like. Furthermore, a step of forming a pattern may be provided.

As a method of applying the composition to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using mold or the like; and a nanoimprint lithography method. Examples of the application method using an ink jet method include a method (in particular, pp. 115 to 133) described in "Extension of Use of Ink Jet—Infinite Possibilities in Patent-" (February, 2005, S.B. Research Co., Ltd.) and methods described in JP2003-262716A, JP2003-185831A, JP2003-261827A, JP2012-126830A, and JP2006-169325A.

In the step of drying the composition layer, it is preferable to change drying conditions depending on the type and amount of each component. The drying conditions are preferably, for example, a heating temperature of 60° C. to 150° C. and a heating time of 30 seconds to 15 minutes.

A step of forming a pattern may be further performed with respect to the composition layer after drying as necessary. Examples of a pattern forming method include a pattern forming method using a photolithography method and a pattern forming method using a dry etching method. Examples of the pattern forming method using the photolithography method include a method including a step of exposing a composition layer to a pattern shape and a step of developing and removing a non-exposed portion to form a pattern. In addition, it is preferable that the pattern forming method using the dry etching method includes: a step of curing a composition layer to form a cured composition layer; a step of forming a photoresist layer on the cured composition layer; a step of patterning the photoresist layer by exposure and development to obtain a resist pattern; and a step of forming a pattern by dry-etching the cured composition layer by using the resist pattern as an etching mask.

When pattern formation is performed by photolithography, the composition layer is then exposed to a pattern shape. For example, the composition layer is exposed in a pattern shape using an exposure device such as a stepper through a mask having a predetermined mask pattern, so that the composition layer is exposed to the pattern shape. As a result, an exposed portion can be cured. As radiation (light) used during the exposure, in particular, ultraviolet rays such as g-rays or i-rays are preferable (i-rays are particularly preferably used). The irradiation dose (exposure dose) is preferably, for example, 0.03 to 2.5 J/cm$^2$, and more preferably 0.05 to 1.0 J/cm$^2$. The oxygen concentration during exposure can be appropriately selected. The exposure may be performed not only in air but also in a low-oxygen atmosphere having an oxygen concentration of 19 vol % or lower (for example, 15 vol % or less, further 5 vol % or less, particularly substantially 0 vol %) or in a high-oxygen atmosphere having an oxygen concentration of higher than 21 vol % (for example, 22 vol % or more, further 30 vol % or more, or particularly 50 vol % or more). In addition, the exposure illuminance can be appropriately set and typically can be selected in a range of 1000 W/m² to 100000 W/m² (for example, 5000 W/m² or more, further 15000 W/m² or more, or particularly 35000 W/m² or more). Conditions of the oxygen concentration and conditions of the exposure illuminance may be appropriately combined. For example, conditions are oxygen concentration: 10 vol % and illuminance: 10000 W/m², or oxygen concentration: 35 vol % and illuminance: 20000 W/m².

Next, a pattern is formed by removing a non-exposed portion by development. The non-exposed portion can be removed by development using a developer. As a result, a non-exposed portion of the composition layer is eluted into the developer, and only the photocured portion remains. As the developer, an alkali developer which does not cause damages to a circuit or the like of a base is desired. As the developer, the solvent described in the present specification is used to perform the development. For example, the temperature of the developer is preferably 20° C. to 30° C. The development time is preferably 20 to 180 seconds, more preferably 20 to 90 seconds.

As the developer, an alkaline aqueous solution in which the above alkaline agent is diluted with pure water is preferably used. Examples of the alkaline agent include: an organic alkaline compound such as ammonia water, ethylamine, diethylamine, dimethylethanolamine, diglycolamine, diethanolamine, hydroxyamine, ethylenediamine, tetramethylammonium hydroxide, tetraethyl ammonium hydroxide, tetrapropylammonium hydroxide, tetrabutylammonium hydroxide, ethyltrimethylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene; and an inorganic alkaline compound such as sodium hydroxide, potassium hydroxide, sodium carbonate, sodium bicarbonate, sodium silicate, or sodium metasilicate. As the alkaline agent, a compound having a large molecular weight is preferable in terms of environment and safety. A concentration of the alkaline agent in the alkaline aqueous solution is preferably 0.001 to 10% by mass and more preferably 0.01 to 1% by mass.

In addition, a surfactant may be further contained in the developer. Examples of the surfactant include the surfactants described above regarding the composition.

The developer may be once manufactured as a concentrated solution and diluted to a required concentration at the time of use from the viewpoint of convenience of transportation and storage. A dilution magnification is not particularly limited, but can be set, for example, in a range of 1.5 to 100 times. In a case where a developer including the alkaline aqueous solution is used, it is preferable that the layer is rinsed with pure water after development.

After development, at least one of heating (post-baking) or exposure may be further performed. According to this aspect, the film can be further cured to manufacture a film which is further firmly cured. In a case performing post-baking, the heating temperature is preferably 100° C. to 260° C. The lower limit is more preferably 120° C. or higher and even more preferably 160° C. or higher. The upper limit is more preferably 240° C. or lower and even more preferably 220° C. or lower. In a case where the heating temperature is in the above range, a film having excellent strength is easily obtained. The heating time is preferably 1 to 180 minutes. The lower limit is more preferably 3 minutes or longer. The upper limit is more preferably 120 minutes or shorter. A heating device is not particularly limited, and a well-known device such as a dry oven, a hot plate, or an infrared heater is suitably selected.

The pattern formation using the dry etching method can be performed by curing the composition layer on the support to form a cured composition layer, forming a patterned photoresist layer on the cured composition layer, and then performing dry etching the cured composition layer with etching gas with respect to the cured composition layer by using the patterned photoresist layer as a mask. It is preferable that pre-baking is further performed in order to form the photoresist layer. In particular, in a preferable aspect, as a process of forming the photoresist, baking after exposure or baking after development (post-baking) is performed. The details of the pattern formation using the dry etching method can be found in the description of paragraph numbers 0010 to 0067 of JP2013-064993A, the content of which is incorporated herein by reference.

EXAMPLES

Hereinafter, the present invention will be described in detail based on the following examples. Materials, used amounts, ratios, treatment details, treatment procedures, and the like shown in the following examples can be appropriately changed within a range not departing from the scope of the present invention. Accordingly, the scope of the present invention is not limited to the following examples.

<Measurement of Weight-Average Molecular Weight (Mw)>

The weight-average molecular weight (Mw) of the resin is measured by the following method.

Column type: Column development solvent obtained by connecting TOSOH TSKgel Super HZM-H, TOSOH TSKgel Super HZ4000, and TOSOH TSKgel Super HZ2000: Tetrahydrofuran Column temperature: 40° C., Flow rate (sample injection rate): 1.0 µL (sample concentration: 0.1% by mass)

Device name: HLC-8220 GPC detector manufactured by Tosoh Corporation: RI (refractive index) detector calibration curve base resin: Polystyrene <Method of Measuring Acid Value>

The acid value represents the mass of potassium hydroxide required to neutralize acidic components per gram of the solid content. The measured sample was dissolved in a mixed solvent of tetrahydrofuran/water=9/1 (a mass ratio), and the obtained solution was subjected to neutralizing titration in 0.1 mol/L sodium hydroxide aqueous solution at 25° C. by using a potentiometric titrator (product name: AT-510, manufactured by Kyoto Electronics Industry Co., Ltd.). An acid value was calculated by the following formula using the inflection point of the titration pH curve as the titration end point.

$$A = 56.11 \times Vs \times 0.5 \times f/w$$

A: Acid value (mgKOH/g)

Vs: Used amount of 0.1 mol/L sodium hydroxide aqueous solution required for titration (mL)

f: Titer of 0.1 mol/L sodium hydroxide aqueous solution w: Measured sample mass (g) (solid content conversion)

Preparation of Composition for Forming Light Attenuating Layer (Manufacturing Inorganic Pigment Dispersion)

An inorganic pigment dispersion was manufactured using Ultra Apex Mill manufactured by KOTOBUKI KOGYOU CO., LTD. as a circulation type dispersion device (a beads mill) with respect to the mixed solution containing each component described in the following table.

TABLE 1

|  | Inorganic pigment | | Dispersant | | Solvent | |
| --- | --- | --- | --- | --- | --- | --- |
|  | Kind | Additive amount (Parts by mass) | Kind | Additive amount (Parts by mass) | Kind | Additive amount (Parts by mass) |
| Inorganic pigment dispersion 1 | A-1 | 24.2 | H-1 | 7.3 | PGMEA | 68.5 |
| Inorganic pigment dispersion 2 | A-1 | 24.2 | H-2 | 7.3 | PGMEA | 68.5 |
| Inorganic pigment dispersion 3 | A-1 | 24.2 | H-3 | 7.3 | PGMEA | 68.5 |
| Inorganic pigment dispersion 4 | A-1 | 24.2 | H-4 | 7.3 | PGMEA | 68.5 |
| Inorganic pigment dispersion 5 | A-2 | 24.2 | H-3 | 7.3 | PGMEA | 68.5 |
| Inorganic pigment dispersion 6 | A-3 | 24.2 | H-3 | 7.3 | PGMEA | 68.5 |
| Inorganic pigment dispersion 7 | A-4 | 24.2 | H-3 | 7.3 | PGMEA | 68.5 |
| Inorganic pigment dispersion 8 | A-1 | 24.2 | H-3 | 7.3 | PGMEA | 48.5 |
|  |  |  |  |  | PGME | 20.0 |
| Inorganic pigment dispersion 9 | A-1 | 24.2 | H-3 | 7.3 | PGMEA | 38.5 |
|  |  |  |  |  | PGME | 20.0 |
|  |  |  |  |  | Butyl acetate | 10.0 |
| Inorganic pigment dispersion 10 | A-1 | 24.2 | H-3 | 7.3 | Cyclopentanone | 48.5 |
|  |  |  |  |  | PGME | 20.0 |

The abbreviations described in "Kind" column of the above inorganic pigments represent the inorganic pigments described in Table 2.

TABLE 2

| | Kind of inorganic pigment | Product No. | Manufacturer |
| --- | --- | --- | --- |
| A-1 | Titanium oxynitride | FS-2 | Mitsubishi Materials Corporation |
| A-2 | Titanium oxynitride | 13M-T | Mitsubishi Materials Corporation |
| A-3 | Titanium nitride | — | Hefei Kai'er |
| A-4 | Zirconium oxynitride | — | Mitsubishi Materials Corporation |

In addition, the abbreviations described in "Kind" column of the above dispersants represent the following dispersants.

H-1 (acid value=100 mgKOH/g, weight-average molecular weight=39000)

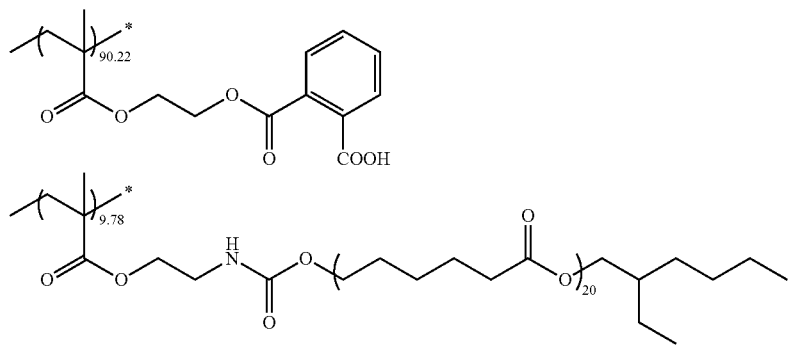

H-2 (acid value=60 mgKOH/g, weight-average molecular weight=33000)

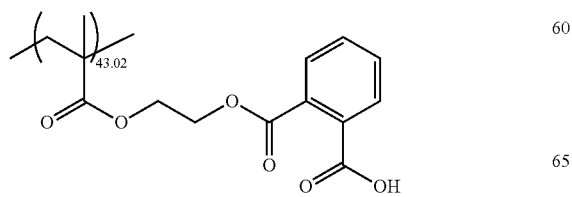

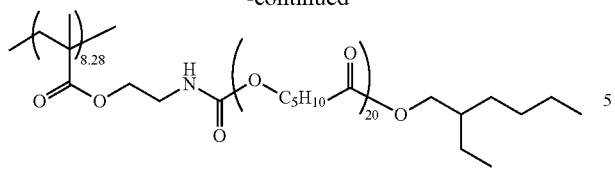

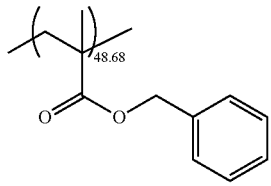

H-3 (acid value=90 mgKOH/g, weight-average molecular weight=17000)

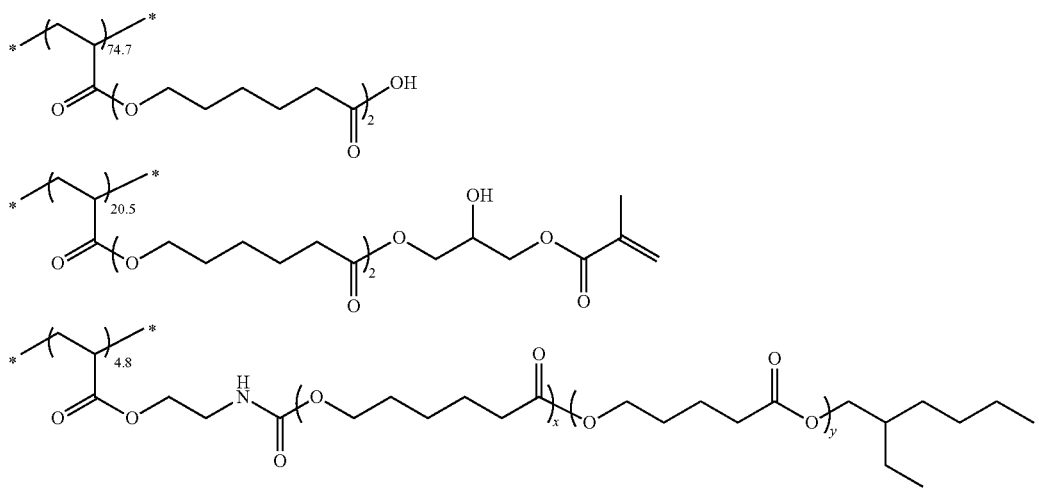

x:y = 83.2:16.8 (mol ratio)

H-4 (acid value=33 mgKOH/g, weight-average molecular weight=23000)

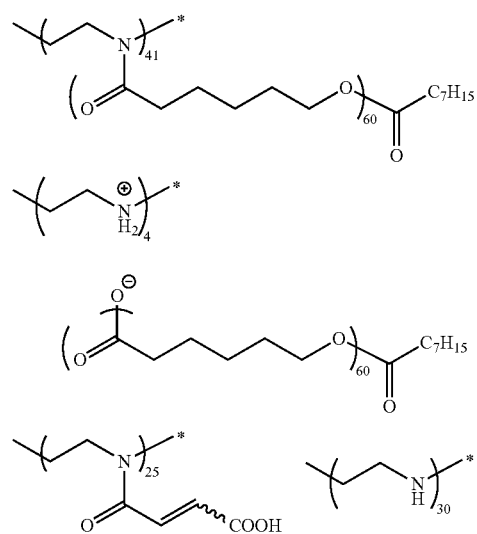

In addition, the abbreviations described in "Kind" column of the above solvents represent the following solvents.

PGMEA: Propylene glycol 1-monomethyl ether 2-acetate
PGME: Propylene glycol monomethyl ether Preparation of Composition for Forming Light Attenuating Layer The components described in the table below were mixed to prepare a composition for forming a light attenuating layer. In the table below, the "composition" is an abbreviation for the composition for forming a light attenuating layer. Table 3 is divided into 1 to 3 thereof, and components of each composition are described in each row of Table (3-1) to Table (3-3). For example, in the case of "Composition for forming light attenuating layer GY-1," 25.3 parts by mass of the inorganic pigment dispersion 3, 13 parts by mass of the yellow dispersion-A, 7.4 parts by mass of the violet dispersion, 0.3 parts by mass of the alkali-soluble resin C-1, 3 parts by mass of the polymerizable compound D-1, 0.7 parts by mass of the photopolymerization initiator E-1, 50.3 parts by mass of PGMEA as a solvent, and 0.01 parts by mass of the surfactant W-1 are contained. Note that, blanks and "–" in the table indicate that nothing is contained.

TABLE 3

| Table (3-1) | Inorganic pigment dispersion Kind | Parts by mass | Other dispersion Kind | Parts by mass | Other dispersion Kind | Parts by mass |
|---|---|---|---|---|---|---|
| Composition GY-1 | Inorganic pigment dispersion 3 | 25.3 | Yellow dispersion-A | 13 | Violet dispersion | 7.4 |
| Composition GY-2 | Inorganic pigment dispersion 3 | 25.3 | Yellow dispersion-A | 13 | Violet dispersion | 7.4 |
| Composition GY-3 | Inorganic pigment dispersion 3 | 25.3 | Yellow dispersion-A | 13 | Violet dispersion | 7.4 |
| Composition GY-4 | Inorganic pigment dispersion 3 | 25.3 | Yellow dispersion-A | 13 | Violet dispersion | 7.4 |
| Composition GY-5 | Inorganic pigment dispersion 3 | 25.3 | Yellow dispersion-A | 13 | Violet dispersion | 7.4 |
| Composition GY-6 | Inorganic pigment dispersion 3 | 25.3 | Yellow dispersion-A | 13 | Violet dispersion | 7.4 |
| Composition GY-7 | Inorganic pigment dispersion 3 | 25.3 | Yellow dispersion-A | 13 | Violet dispersion | 7.4 |
| Composition GY-8 | Inorganic pigment dispersion 3 | 25.3 | Yellow dispersion-A | 13 | Violet dispersion | 7.4 |
| Composition GY-9 | Inorganic pigment dispersion 3 | 25.3 | Yellow dispersion-A | 13 | Violet dispersion | 7.4 |
| Composition GY-10 | Inorganic pigment dispersion 3 | 25.3 | Yellow dispersion-A | 13 | Violet dispersion | 7.4 |
| Composition GY-11 | Inorganic pigment dispersion 3 | 25.3 | Yellow dispersion-A | 13 | Violet dispersion | 7.4 |
| Composition GY-12 | Inorganic pigment dispersion 1 | 25.3 | Yellow dispersion-A | 13 | Violet dispersion | 7.4 |
| Composition GY-13 | Inorganic pigment dispersion 2 | 25.3 | Yellow dispersion-A | 13 | Violet dispersion | 7.4 |
| Composition GY-14 | Inorganic pigment dispersion 4 | 25.3 | Yellow dispersion-A | 13 | Violet dispersion | 7.4 |
| Composition GY-15 | Inorganic pigment dispersion 5 | 25.3 | Yellow dispersion-A | 13 | Violet dispersion | 7.4 |
| Composition GY-16 | Inorganic pigment dispersion 6 | 25.3 | Yellow dispersion-A | 13 | Violet dispersion | 7.4 |
| Composition GY-17 | Inorganic pigment dispersion 7 | 25.3 | Yellow dispersion-A | 13 | Violet dispersion | 7.4 |
| Composition GY-18 | Inorganic pigment dispersion 8 | 25.3 | Yellow dispersion-A | 13 | Violet dispersion | 7.4 |
| Composition GY-19 | Inorganic pigment dispersion 9 | 25.3 | Yellow dispersion-A | 13 | Violet dispersion | 7.4 |
| Composition GY-20 | Inorganic pigment dispersion 10 | 25.3 | Yellow dispersion-A | 13 | Violet dispersion | 7.4 |
| Composition GY-21 | Inorganic pigment dispersion 3 | 26.8 | Yellow dispersion-A | 12.6 | Violet dispersion | 9 |
| Composition GY-22 | Inorganic pigment dispersion 3 | 22.1 | Yellow dispersion-B | 4.6 | Violet dispersion | 5.9 |
| Composition GY-23 | Inorganic pigment dispersion 3 | 22.1 | Yellow dispersion-C | 5.1 | Violet dispersion | 5.9 |
| Composition GY-24 | Inorganic pigment dispersion 3 | 19.3 | IR dispersion | 7.8 | Orange dispersion | 13.6 |
| Composition GY-25 | Inorganic pigment dispersion 3 | 19.4 | CB dispersion | 13 | | |
| Composition GY-26 | Inorganic pigment dispersion 3 | 7.7 | Yellow dispersion-A | 3.4 | Violet dispersion | 1.9 |
| Composition GY-27 | Inorganic pigment dispersion 3 | 7.8 | Yellow dispersion-B | 1.9 | Violet dispersion | 2.4 |
| Composition GY-28 | Inorganic pigment dispersion 3 | 8.5 | Yellow dispersion-C | 2.6 | Violet dispersion | 2.9 |
| Composition GY-29 | Inorganic pigment dispersion 3 | 8.3 | IR dispersion | 3.3 | Orange dispersion | 5.8 |
| Composition GY-30 | Inorganic pigment dispersion 3 | 6.1 | CB dispersion | 3.7 | | |
| Comparative composition GY-1 | Inorganic pigment dispersion 3 | 43.1 | | | | |
| Comparative composition GY-2 | Inorganic pigment dispersion 3 | 29.1 | | | | |
| Comparative composition GY-3 | Inorganic pigment dispersion 3 | 11.6 | | | | |

TABLE 4

| Table (3-2) | Other dispersion Kind | Parts by mass | Alkali-soluble resin Kind | Parts by mass | Polymerizable compound Kind | Parts by mass | Photopolymerization initiator Kind | Parts by mass |
|---|---|---|---|---|---|---|---|---|
| Composition GY-1 | | | C-1 | 0.3 | D-1 | 3 | E-1 | 0.7 |
| Composition GY-2 | | | C-2 | 0.3 | D-1 | 3 | E-1 | 0.7 |
| Composition GY-3 | | | C-2 | 0.3 | D-2 | 3 | E-1 | 0.7 |
| Composition GY-4 | | | C-2 | 0.3 | D-2 | 3 | E-2 | 0.7 |
| Composition GY-5 | | | C-2 | 0.3 | D-2 | 3 | E-3 | 0.7 |
| Composition GY-6 | | | C-2 | 0.3 | D-2 | 3 | E-4 | 0.7 |
| Composition GY-7 | | | C-2 | 0.3 | D-2 | 3 | E-1 | 0.7 |
| Composition GY-8 | | | C-2 | 0.3 | D-2 | 3 | E-1 | 0.7 |
| Composition GY-9 | | | C-2 | 0.3 | D-2 | 3 | E-1 | 0.7 |
| Composition GY-10 | | | C-2 | 0.3 | D-2 | 3 | E-1 | 0.7 |
| Composition GY-11 | | | C-1/C-2 | 0.1/0.2 | D-1/D-2 | 1/2 | E-1/E-4 | 0.6/0.1 |
| Composition GY-12 | | | C-2 | 0.3 | D-2 | 3 | E-1 | 0.7 |
| Composition GY-13 | | | C-2 | 0.3 | D-2 | 3 | E-1 | 0.7 |
| Composition GY-14 | | | C-2 | 0.3 | D-2 | 3 | E-1 | 0.7 |
| Composition GY-15 | | | C-2 | 0.3 | D-2 | 3 | E-1 | 0.7 |
| Composition GY-16 | | | C-2 | 0.3 | D-2 | 3 | E-1 | 0.7 |
| Composition GY-17 | | | C-2 | 0.3 | D-2 | 3 | E-1 | 0.7 |
| Composition GY-18 | | | C-2 | 0.3 | D-2 | 3 | E-1 | 0.7 |
| Composition GY-19 | | | C-2 | 0.3 | D-2 | 3 | E-1 | 0.7 |
| Composition GY-20 | | | C-2 | 0.3 | D-2 | 3 | E-1 | 0.7 |
| Composition GY-21 | Red dispersion | 5.3 | C-2 | 0.3 | D-2 | 2 | E-1 | 0.7 |
| Composition GY-22 | Orange dispersion | 12.7 | C-2 | 1.3 | D-2 | 3.3 | E-1 | 0.7 |
| Composition GY-23 | Orange dispersion | 12.7 | C-2 | 1.3 | D-2 | 3.3 | E-1 | 0.7 |

TABLE 4-continued

| Table (3-2) | Other dispersion Kind | Parts by mass | Alkali-soluble resin Kind | Parts by mass | Polymerizable compound Kind | Parts by mass | Photopolymerization initiator Kind | Parts by mass |
|---|---|---|---|---|---|---|---|---|
| Composition GY-24 | | | C-2 | 2.2 | D-2 | 3.6 | E-1 | 0.9 |
| Composition GY-25 | | | C-2 | 2.2 | D-2 | 3.6 | E-1 | 0.9 |
| Composition GY-26 | | | C-2 | 6.2 | D-2 | 5.8 | E-1 | 1.5 |
| Composition GY-27 | Orange dispersion | 4.4 | C-2 | 5.9 | D-2 | 5.6 | E-1 | 1.3 |
| Composition GY-28 | Orange dispersion | 4.9 | C-2 | 5.5 | D-2 | 5.4 | E-1 | 1.3 |
| Composition GY-29 | | | C-2 | 5.8 | D-2 | 5.5 | E-1 | 1.3 |
| Composition GY-30 | | | C-2 | 6.6 | D-2 | 5.9 | E-1 | 1.4 |
| Comparative composition GY-1 | | | C-2 | 2.4 | D-2 | 4.3 | E-1 | 0.8 |
| Comparative composition GY-2 | | | C-2 | 5 | D-2 | 5.8 | E-1 | 0.8 |
| Comparative composition GY-3 | | | C-2 | 6.4 | D-2 | 5.7 | E-1 | 0.7 |

TABLE 5

| Table (3-3) | Solvent Kind | Parts by mass | Compound having epoxy group Kind | Parts by mass | Ultraviolet absorber Kind | Parts by mass | Adhesion agent Kind | Parts by mass | Surfactant Kind | Parts by mass |
|---|---|---|---|---|---|---|---|---|---|---|
| Composition GY-1 | PGMEA | 50.3 | — | | — | | — | | W-1 | 0.01 |
| Composition GY-2 | PGMEA | 50.3 | — | | — | | — | | W-1 | 0.01 |
| Composition GY-3 | PGMEA | 50.3 | — | | — | | — | | W-1 | 0.01 |
| Composition GY-4 | PGMEA | 50.3 | — | | — | | — | | W-1 | 0.01 |
| Composition GY-5 | PGMEA | 50.3 | — | | — | | — | | W-1 | 0.01 |
| Composition GY-6 | PGMEA | 50.3 | — | | — | | — | | W-1 | 0.01 |
| Composition GY-7 | PGMEA | 49.8 | G-1 | 0.5 | — | | — | | W-1 | 0.01 |
| Composition GY-8 | PGMEA | 49.8 | G-2 | 0.5 | — | | — | | W-1 | 0.01 |
| Composition GY-9 | PGMEA | 50.0 | — | | G-3 | 0.3 | — | | W-1 | 0.01 |
| Composition GY-10 | PGMEA | 49.8 | — | | — | | G-4 | 0.5 | W-1 | 0.01 |
| Composition GY-11 | PGMEA/CyPe | 30.3/20.0 | — | | — | | — | | W-1 | 0.01 |
| Composition GY-12 | PGMEA | 50.3 | — | | — | | — | | W-1 | 0.01 |
| Composition GY-13 | PGMEA | 50.3 | — | | — | | — | | W-1 | 0.01 |
| Composition GY-14 | PGMEA | 50.3 | — | | — | | — | | W-1 | 0.01 |
| Composition GY-15 | PGMEA | 50.3 | — | | — | | — | | W-1 | 0.01 |
| Composition GY-16 | PGMEA | 50.3 | — | | — | | — | | W-1 | 0.01 |
| Composition GY-17 | PGMEA | 50.3 | — | | — | | — | | W-1 | 0.01 |
| Composition GY-18 | PGMEA | 50.3 | — | | — | | — | | W-1 | 0.01 |
| Composition GY-19 | PGMEA | 50.3 | — | | — | | — | | W-1 | 0.01 |
| Composition GY-20 | PGMEA | 50.3 | — | | — | | — | | W-1 | 0.01 |
| Composition GY-21 | PGMEA | 43.3 | — | | — | | — | | W-1 | 0.01 |
| Composition GY-22 | PGMEA | 49.4 | — | | — | | — | | W-1 | 0.01 |
| Composition GY-23 | PGMEA | 48.9 | — | | — | | — | | W-1 | 0.01 |
| Composition GY-24 | PGMEA | 52.6 | — | | — | | — | | W-1 | 0.01 |
| Composition GY-25 | PGMEA | 60.9 | — | | — | | — | | W-1 | 0.01 |
| Composition GY-26 | PGMEA | 72.5 | — | | G-3 | 1 | — | | W-1 | 0.01 |
| Composition GY-27 | PGMEA | 69.7 | — | | G-3 | 1 | — | | W-1 | 0.01 |
| Composition GY-28 | PGMEA | 67.9 | — | | G-3 | 1 | — | | W-1 | 0.01 |
| Composition GY-29 | PGMEA | 69.0 | — | | G-3 | 1 | — | | W-1 | 0.01 |
| Composition GY-30 | PGMEA | 75.3 | — | | G-3 | 1 | — | | W-1 | 0.01 |
| Comparative composition GY-1 | PGMEA | 49.2 | — | | G-3 | 0.2 | — | | W-1 | 0.01 |
| Comparative composition GY-2 | PGMEA | 58.9 | — | | G-3 | 0.4 | — | | W-1 | 0.01 |
| Comparative composition GY-3 | PGMEA | 74.5 | — | | G-3 | 1.1 | — | | W-1 | 0.01 |

Regarding the abbreviations described in "Kind" column of the solvent, CyPe represents cyclopentanone.

In addition, the abbreviations described in "Kind" column of the alkali-soluble resin represent the following alkali-soluble resins.

C-1

BzMA / MAA

Acid value=110 mg KOH/g weight-average molecular weight=33000

C-2

Acid value=70 mg KOH/g weight-average molecular weight=11000

In addition, the abbreviations described in "Kind" column of the polymerizable compound represent the following polymerizable compounds.
- D-1: KAYARAD DPHA (manufactured by Nippon Kayaku Co., Ltd.)
- D-2: NK Ester A-TMMT (manufactured by Shin Nakamura Chemical Co., Ltd.)

In addition, the abbreviations described in "Kind" column of the photopolymerization initiator represent the following photopolymerization initiators.
- E-1: IRGACURE OXE 02 (manufactured by BASF SE)
- E-2: IRGACURE OXE 03 (manufactured by BASF SE)
- E-3: IRGACURE 369 (manufactured by BASF SE)
- E-4: IRGACURE 379 (manufactured by BASF SE)

In addition, the abbreviations described in "Kind" column of the compound having an epoxy group represent the following compounds.
- G-1: EHPE 3150 (manufactured by Daicel Corporation)
- G-2: EPICLON N-695 (manufactured by DIC Corporation)

In addition, the abbreviation described in "Kind" column of the ultraviolet absorber represents the following ultraviolet absorber.

G-3

In addition, the abbreviation described in "Kind" column of the adhesion agent represents the following adhesion agent.

G-4

In addition, the abbreviation described in "Kind" column of the surfactant represents the following surfactant.

W-1

62%

38%

$L1 + N1 + L2 + N2 = 14$
$M1 + M2 = 17$

Preparation of Dispersion Such as Colorant

In addition, each dispersion such as the colorants described in the other dispersion column causes the following components to be dispersed respectively. "H-4" has already been described.

Resin 6: "Solsperse 36000" manufactured by The Lubrizol Corporation

Resin 7 (weight-average molecular weight: 21000, acid value 77 mgKOH/g)

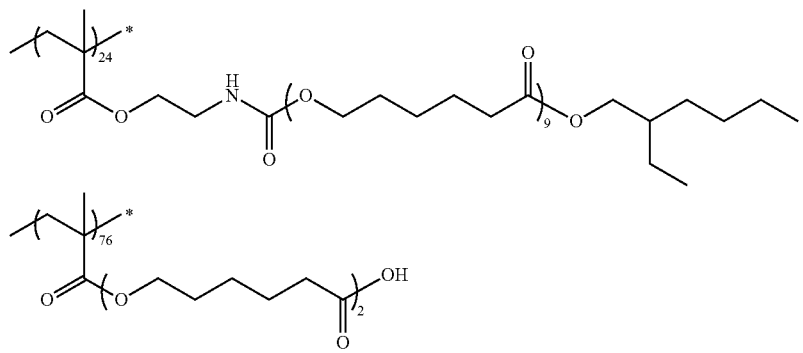

Pigment Derivative 1

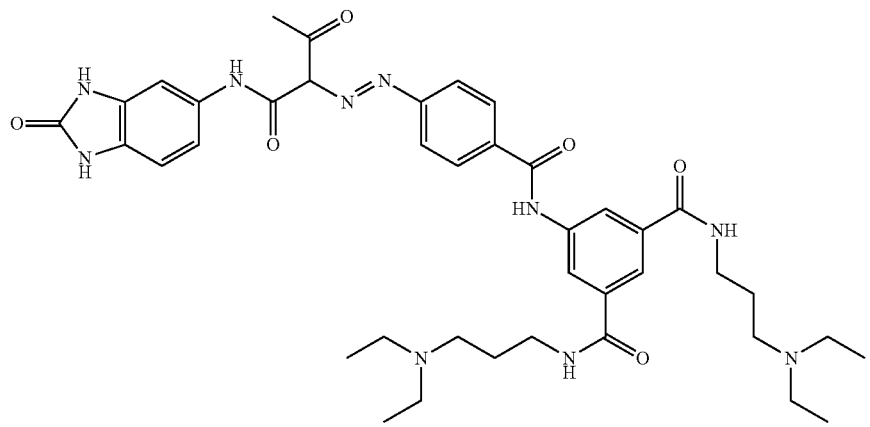 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Yellow dispersion-A

| | |
|---|---|
| C.I. Pigment Yellow 139 (PY139) | 11.3 parts by mass |
| Resin 7 | 3.9 parts by mass |
| Pigment derivative 1 | 1.6 parts by mass |
| PGMEA | 83.2 parts by mass |

Yellow dispersion-B

| | |
|---|---|
| C.I. Pigment Yellow 150 (PY150) | 11.3 parts by mass |
| Resin 7 | 8.4 parts by mass |
| PGMEA | 68.3 parts by mass |
| Cyclohexanone | 12.0 parts by mass |

Yellow dispersion-C

| | |
|---|---|
| C.I. Pigment Yellow 185 (PY185) | 10.0 parts by mass |
| Resin 7 | 7.6 parts by mass |
| PGMEA | 71.7 parts by mass |
| Cyclohexanone | 10.6 parts by mass |

Violet dispersion

| | |
|---|---|
| C.I. Pigment Violet 23 (PV23) | 14.9 parts by mass |
| Resin 6 | 5.3 parts by mass |
| PGMEA | 79.8 parts by mass |

CB dispersion (CB is the abbreviation of "carbon black")

| | |
|---|---|
| Carbon black | 19.0 parts by mass |
| Resin 7 | 7.3 parts by mass |

-continued

| | |
|---|---|
| Pigment derivative 1 | 1.1 parts by mass |
| PGMEA | 38.3 parts by mass |
| Cyclohexanone | 16.4 parts by mass |
| Ethyl-3-ethoxypropionate | 17.9 parts by mass |

IR dispersion (IR is the abbreviation of "Infrared")

| | |
|---|---|
| Irgafore Black | 13.0 parts by mass |
| H-4 | 5.2 parts by mass |
| PGMEA | 81.8 parts by mass |

Red dispersion

| | |
|---|---|
| C.I. Pigment Red 254 (PR254) | 11.3 parts by mass |
| Resin 7 | 4.5 parts by mass |
| Pigment derivative 1 | 1.4 parts by mass |
| PGMEA | 82.8 parts by mass |

Orange dispersion

| | |
|---|---|
| C.I. Pigment Orange 71 | 10.8 parts by mass |
| Resin 7 | 5.0 parts by mass |
| Pigment derivative 1 | 1.4 parts by mass |
| PGMEA | 82.8 parts by mass |

[Evaluation of Composition for Forming Light Attenuating Layer]

Each composition for forming a light attenuating layer is evaluated by the following method.

Each composition for forming a light attenuating layer was applied to an 8-inch glass wafer with an undercoat layer ("CT-4000L", a film thickness of 0.1 FUJIFILM Electronic Materials Co., Ltd.) by using a spin coater so that the film thickness after drying became 0.5 µm and baking (pre-baking) was performed by using a hot plate at 110° C. for 120 seconds.

Next, using an i-ray stepper exposure device FPA-3000 i5+(manufactured by Canon Inc.), the obtained composition layer was exposed through a mask having a 2 cm×2 cm pattern with 1000 mJ/cm² in a wavelength light of 365 nm.

Thereafter, the glass wafer on which the exposed coating film is formed is placed on a horizontal rotating table of a spin shower developing machine (DW-30 type, manufactured by CHEMITRONICS CO., LTD.), and by using tetramethylammonium hydroxide (TMAH) 0.3% aqueous solution, the puddle development was performed at 23° C. for 60 seconds to form a light attenuating layer on the glass wafer.

The glass wafer on which the light attenuating layer was formed was fixed to the horizontal rotating table by a vacuum chuck system. While the glass wafer was rotated at a rotation speed of 50 rpm by a rotating device, pure water was provided from an upper side of a rotation center by an ejection nozzle in a shower-like state so as to be rinsed. Thereafter spray drying was performed. Then, baking was performed using a hot plate at 200° C. for 5 minutes (post-baking; 200° C./8 minutes).

A spectrum of the light attenuating layer obtained as described above was measured using MCPD-3700 (manufactured by Otsuka Electronics Co., Ltd.), a difference between a maximum value and a minimum value of light transmittance at a wavelength of 400 to 700 nm was denoted as $T_1$ (%), and a difference between a maximum value and a minimum value of light transmittance at a wavelength of 700 to 1000 nm was denoted as $T_2$ (%).

<Developability>

The composition for forming a light attenuating layer was applied to an 8-inch silicon wafer with an undercoat layer using a spin coating method such that the thickness after the application was 0.5 and then was heated using a hot plate at 110° C. for 2 minutes. As a result, a composition layer for forming a light attenuating layer was obtained.

Next, using an i-ray stepper exposure device FPA-3000 i5+(manufactured by Canon Inc.), the obtained composition layer for forming a light attenuating layer was exposed (exposure dose 50 to 1700 mJ/cm²) through a 1.0 µm square island pattern mask. Next, the developability with respect to the exposed composition layer for forming a light attenuating layer was evaluated using a developing device (Act-8 manufactured by Tokyo Electron Limited). Next, as the developer, tetramethylammonium hydroxide (TMAH) 0.3% aqueous solution was used to perform shower development at 23° C. for 60 seconds. Thereafter, the rinsing was performed by spin showering using pure water to obtain a patterned light attenuating layer. An obtained pattern size was evaluated by observation with a scanning electron microscope (SEM) (S-4800H, manufactured by Hitachi High-Technologies Corporation) (magnification: 20000 times), and exposure dose at which the pattern size became 1.0 µm was set to exposure dose of each composition for forming a light attenuating layer (Eopt). Then, the evaluation was performed according to the following criteria, and the results are shown in "Developability" column of Table 4.

A: Eopt was 50 mJ/cm² or more and less than 200 mJ/cm².

B: Eopt was 200 mJ/cm² or more and less than 300 mJ/cm².

C: Eopt was 300 mJ/cm² or more and less than 500 mJ/cm².

D: Eopt was 500 mJ/cm² or more.

E: Eopt was less than 50 mJ/cm².

<Heat Resistance>

The composition for forming a light attenuating layer was applied to an 8-inch glass wafer with an undercoat layer ("CT-4000L" manufactured by FUJIFILM Electronic Materials Co., Ltd.; a film thickness of 0.1 µm) by using a spin coater so that the film thickness after drying became 0.5 µm, and baking (pre-baking) was performed by using a hot plate at 110° C. for 120 seconds.

Next, using an i-ray stepper exposure device FPA-3000i5+(manufactured by Canon Inc.), the obtained composition layer was exposed through a mask having a pattern of 2 cm×2 cm with 1000 mJ/cm² in a wavelength light of 365 nm.

Thereafter, the glass wafer on which the exposed composition layer for forming a light attenuating layer is formed is placed on a horizontal rotating table of a spin shower developing machine (DW-30 type, manufactured by CHEMITRONICS CO., LTD.), and by using tetramethylammonium hydroxide (TMAH) 0.3% aqueous solution, the puddle development was performed at 23° C. for 60 seconds to form a patterned light attenuating layer on the glass wafer.

The glass wafer on which the patterned light attenuating layer was formed was fixed to the horizontal rotating table by a vacuum chuck system. While the glass wafer was rotated at a rotation speed of 50 rpm by a rotating device, pure water was provided from an upper side of a rotation center by an ejection nozzle in a shower-like state so as to be rinsed. Thereafter spray drying was performed. Then, baking was performed using a hot plate at 200° C. for 5 minutes (post-baking; 200° C./8 minutes).

The light attenuating layer was baked at 150° C./500 hours using a hot plate. Spectral variation (ΔT %) of light transmittance at a wavelength of 400 to 700 nm before and after baking was measured by MCPD-3000 (manufactured by Otsuka Electronics Co., Ltd.), variation at a wavelength in which the largest spectral variation was exhibited was denoted as ΔT % max, and the results were evaluated according to the following criteria and were shown in "Heat resistance" column of Table 4. In the following evaluation criteria, it is preferable in order from A to E. Other evaluation criteria in the present embodiment are the same.

A: ΔT % max was less than 1.0%.
B: ΔT % max was 1.0% or more and less than 3.0%.
C: ΔT % max was 3.0% or more and less than 7.0%.
D: ΔT % max was 7.0% or more and less than 10.0%.
E: ΔT % max was 10.0% or more.

<Light Resistance>

The composition for forming a light attenuating layer was applied to an 8-inch glass wafer with an undercoat layer ("CT-4000L" manufactured by FUJIFILM Electronic Materials Co., Ltd.; a film thickness of 0.1 μm) by using a spin coater so that the film thickness after drying became 0.5 μm, and baking (pre-baking) was performed by using a hot plate at 110° C. for 120 seconds.

Next, using an i-ray stepper exposure device FPA-3000i5+(manufactured by Canon Inc.), the obtained composition layer was exposed through a mask having a pattern of 2 cm×2 cm with 1000 mJ/cm² in a wavelength light of 365 nm.

Thereafter, the glass wafer on which the exposed composition layer for forming a light attenuating layer is formed is placed on a horizontal rotating table of a spin shower developing machine (DW-30 type, manufactured by CHEMITRONICS CO., LTD.), and by using tetramethylammonium hydroxide (TMAH) 0.3% aqueous solution, the puddle development was performed at 23° C. for 60 seconds to form a patterned light attenuating layer on the glass wafer.

The glass wafer on which the patterned light attenuating layer was formed was fixed to the horizontal rotating table by a vacuum chuck system. While the glass wafer was rotated at a rotation speed of 50 rpm by a rotating device, pure water was provided from an upper side of a rotation center by an ejection nozzle in a shower-like state so as to be rinsed. Thereafter spray drying was performed. Then, baking was performed using a hot plate at 200° C. for 5 minutes (post-baking; 200° C./8 minutes).

The light attenuating layer was irradiated with illuminance of 100000 lux for 50 hours using Super Xenon Weather Meter SX75 manufactured by Suga Test Instruments Co., Ltd. Spectral variation (ΔT %) of light transmittance at a wavelength of 400 to 700 nm before and after irradiated was measured by MCPD-3000(manufactured by Otsuka Electronics Co., Ltd.), variation at a wavelength in which the largest spectral variation was exhibited was denoted as ΔT % max2, and the results were evaluated according to the following criteria. In addition, the results were shown in "Light resistance" column of Table 4.

A: ΔT % max2 was less than 1.0%.
B: ΔT % max2 was 1.0% or more and less than 3.0%.
C: ΔT % max2 was 3.0% or more and less than 7.0%.
D: ΔT % max2 was 7.0% or more and less than 10.0%.
E: ΔT % max2 was 10.0% or more.

<Moisture Resistance>

The composition for forming a light attenuating layer was applied to a glass wafer with an undercoat layer by using a spin coater so that the film thickness after drying became 0.5 μm, and baking (pre-baking) was performed by using a hot plate at 110° C. for 120 seconds.

Next, using an i-ray stepper exposure device FPA-3000 i5+(manufactured by Canon Inc.), the obtained composition layer was exposed through a mask having a 2 cm×2 cm pattern with 1000 mJ/cm² in a wavelength light of 365 nm.

Thereafter, the glass wafer on which the exposed composition layer for forming a light attenuating layer is formed is placed on a horizontal rotating table of a spin shower developing machine (DW-30 type, manufactured by CHEMITRONICS CO., LTD.), and by using a 60% diluted solution of CD-2000 (manufactured by FUJIFILM Electronic Materials Co., Ltd.), the puddle development was performed at 23° C. for 60 seconds to form a patterned light attenuating layer on the glass wafer.

The glass wafer on which the patterned light attenuating layer was formed was fixed to the horizontal rotating table by a vacuum chuck system. While the glass wafer was rotated at a rotation speed of 50 rpm by a rotating device, pure water was provided from an upper side of a rotation center by an ejection nozzle in a shower-like state so as to be rinsed. Thereafter spray drying was performed. Then, baking (post-baking: 200° C./8 minutes) was performed using a hot plate.

The light attenuating layer was left to stand for 500 hours in an atmosphere in which the temperature is 130° C. and the relative humidity is 85% in HAST tester (EHS-221M) manufactured by ESPEC CORP. Spectral variation (ΔT %) of light transmittance at a wavelength of 400 to 700 nm before and after left to stand was measured by MCPD-3000 (manufactured by Otsuka Electronics Co., Ltd.), variation at a wavelength in which the largest spectral variation was exhibited was denoted as ΔT % max3, and the results were evaluated according to the following criteria and were shown in "Moisture resistance" column of Table 4.

A: ΔT % max3 was less than 1.0%.
B: ΔT % max3 was 1.0% or more and less than 3.0%.
C: ΔT % max3 was 3.0% or more and less than 7.0%.
D: ΔT % max3 was 7.0% or more and less than 10.0%.
E: ΔT % max3 was 10.0% or more.

<Solvent Resistance>

The composition for forming a light attenuating layer was applied to an 8-inch glass wafer with an undercoat layer by using a spin coater so that the film thickness after drying became 0.5 and baking (pre-baking) was performed by using a hot plate at 110° C. for 120 seconds.

Next, using an i-ray stepper exposure device FPA-3000i5+(manufactured by Canon Inc.), the obtained composition layer was exposed through a mask having a pattern of 2 cm×2 cm with 1000 mJ/cm² in a wavelength light of 365 nm.

Thereafter, the glass wafer on which the exposed composition layer for forming a light attenuating layer is formed is placed on a horizontal rotating table of a spin shower developing machine (DW-30 type, manufactured by CHEMITRONICS CO., LTD.), and by using tetramethylammonium hydroxide (TMAH) 0.3% aqueous solution, the puddle development was performed at 23° C. for 60 seconds to form a patterned light attenuating layer on the glass wafer.

The glass wafer on which the patterned light attenuating layer was formed was fixed to the horizontal rotating table by a vacuum chuck system. While the glass wafer was rotated at a rotation speed of 50 rpm by a rotating device, pure water was provided from an upper side of a rotation center by an ejection nozzle in a shower-like state so as to be rinsed. Thereafter spray drying was performed. Then, baking was performed at 200° C. for 5 minutes using a hot plate (post-baking: 200° C./8 minutes).

The light attenuating layer was immersed in N-methyl-2-pyrrolidinone for 5 minutes. Spectral variation (ΔT %) of light transmittance at a wavelength of 400 to 700 nm before and after immersed was measured by MCPD-3000(manufactured by Otsuka Electronics Co., Ltd.), variation at a wavelength in which the largest spectral variation was exhibited was denoted as ΔT % max4, and the results were evaluated according to the following criteria and were shown in "Solvent resistance" column of Table 4.

A: ΔT % max4 was less than 1.0%.
B: ΔT % max4 was 1.0% or more and less than 3.0%.
C: ΔT % max4 was 3.0% or more and less than 7.0%.
D: ΔT % max4 was 7.0% or more and less than 10.0%.
E: ΔT % max4 was 10.0% or more.

Surfactant 1: 0.01 parts by mass
Green dispersion: 72 parts by mass
Composition for Forming a Red Colored Layer (Red Composition)
PGMEA: 47.29 parts by mass
Resin 1: 0.6 parts by mass
Polymerizable compound 3: 0.7 parts by mass
Photopolymerization Initiator 1: 0.4 parts by mass
Surfactant 1: 0.01 parts by mass
Red dispersion: 51 parts by mass
Composition for Forming a Blue Colored Layer (Blue Composition)
PGMEA: 51.19 parts by mass
Resin 1: 0.8 parts by mass
Polymerizable compound 1: 1.4 parts by mass
Polymerizable compound 3: 0.7 parts by mass

TABLE 6

| Table 4 | Composition for forming light-shielding layer | 550 nm Light transmittance (%) | 400 to 700 nm ΔT$_1$ (%) | 700 to 1000 nm ΔT$_2$ (%) | 400 to 1000 nm ΔT (%) | Developability | Heat resistance | Light resistance | Temperature resistance | Solvent resistance |
|---|---|---|---|---|---|---|---|---|---|---|
| Example 1 | Composition GY-1 | 9.3% | 3.4% | 4.4% | 6.4% | C | B | B | B | B |
| Example 2 | Composition GY-2 | 9.4% | 3.4% | 4.3% | 6.2% | B | B | B | B | B |
| Example 3 | Composition GY-3 | 9.3% | 3.6% | 4.4% | 6.4% | B | B | B | B | B |
| Example 4 | Composition GY-4 | 9.2% | 3.6% | 4.5% | 6.6% | A | B | B | B | B |
| Example 5 | Composition GY-5 | 9.5% | 3.4% | 4.4% | 6.4% | C | B | B | B | B |
| Example 6 | Composition GY-6 | 9.3% | 3.2% | 4.6% | 6.2% | C | B | B | B | B |
| Example 7 | Composition GY-7 | 9.3% | 3.4% | 4.5% | 6.4% | B | A | A | A | A |
| Example 8 | Composition GY-8 | 9.5% | 3.4% | 4.4% | 6.2% | B | A | A | A | A |
| Example 9 | Composition GY-9 | 9.4% | 3.2% | 4.5% | 6.4% | C | B | B | B | B |
| Example 10 | Composition GY-10 | 9.3% | 3.4% | 4.4% | 6.4% | A | B | B | A | A |
| Example 11 | Composition GY-11 | 9.4% | 3.6% | 4.2% | 6.2% | B | B | B | B | B |
| Example 12 | Composition GY-12 | 9.5% | 3.4% | 4.4% | 6.4% | B | B | B | B | B |
| Example 13 | Composition GY-13 | 9.3% | 3.4% | 4.3% | 6.4% | B | B | B | B | B |
| Example 14 | Composition GY-14 | 9.3% | 3.4% | 4.4% | 6.6% | B | B | B | B | B |
| Example 15 | Composition GY-15 | 9.0% | 3.2% | 4.4% | 6.6% | B | B | B | B | B |
| Example 16 | Composition GY-16 | 7.4% | 7.4% | 5.7% | 7.4% | B | B | B | B | B |
| Example 17 | Composition GY-17 | 10.6% | 5.0% | 9.1% | 10.2% | B | B | B | B | B |
| Example 18 | Composition GY-18 | 9.2% | 3.6% | 4.2% | 6.6% | B | B | B | B | B |
| Example 19 | Composition GY-19 | 9.5% | 3.4% | 4.4% | 6.4% | B | B | B | B | B |
| Example 20 | Composition GY-20 | 9.3% | 3.2% | 4.3% | 6.2% | B | B | B | B | B |
| Example 21 | Composition GY-21 | 6.7% | 4.2% | 4.3% | 6.4% | B | B | B | B | B |
| Example 22 | Composition GY-22 | 16.2% | 5.2% | 5.7% | 5.0% | B | A | A | A | A |
| Example 23 | Composition GY-23 | 16.1% | 4.2% | 5.0% | 5.0% | B | B | B | A | A |
| Example 24 | Composition GY-24 | 21.9% | 4.8% | 5.5% | 5.8% | B | A | A | A | A |
| Example 25 | Composition GY-25 | 11.1% | 4.4% | 4.3% | 5.0% | B | A | A | A | A |
| Example 26 | Composition GY-26 | 50.2% | 5.4% | 6.2% | 7.6% | A | B | B | A | A |
| Example 27 | Composition GY-27 | 52.7% | 5.6% | 5.7% | 6.2% | A | A | A | A | A |
| Example 28 | Composition GY-28 | 48.8% | 4.8% | 5.9% | 6.4% | A | B | B | A | A |
| Example 29 | Composition GY-29 | 53.1% | 5.2% | 5.9% | 6.4% | A | A | A | A | A |
| Example 30 | Composition GY-30 | 52.4% | 6.4% | 6.2% | 6.4% | A | A | A | A | A |
| Example 31 | Comparative composition GY-1 | 11.3% | 12.8% | 2.0% | 13.6% | B | B | A | B | B |
| Example 32 | Comparative composition GY-2 | 20.2% | 17.4% | 3.5% | 18.6% | B | B | A | B | B |
| Example 33 | Comparative composition GY-3 | 49.7% | 20.0% | 6.0% | 21.8% | A | B | A | B | B |

In the above table, a "composition" is referred to as the composition for forming a light attenuating layer.

[Preparation of Other Compositions]<Composition for Forming Colored Layer>

The following raw materials were mixed to prepare a composition for forming a colored layer.

Composition for Forming a Green Colored Layer (Green Composition)
PGMEA: 25.49 parts by mass
Resin 1: 0.2 parts by mass
Polymerizable compound 1: 0.9 parts by mass
Polymerizable compound 2: 0.3 parts by mass
Photopolymerization Initiator 1: 0.7 parts by mass
Ultraviolet absorber 1: 0.4 parts by mass Photopolymerization Initiator 1: 0.9 parts by mass
Surfactant 1: 0.01 parts by mass
Blue dispersion: 45 parts by mass
Composition for Forming a Cyan Colored Layer (Cyan Composition)
PGMEA: 58.88 parts by mass
Resin 2: 5.6 parts by mass
Polymerizable compound 4: 7.5 parts by mass
Photopolymerization Initiator 1: 1.2 parts by mass
Ultraviolet absorber 1: 0.3 parts by mass
Surfactant 1: 0.01 parts by mass
Surfactant 2: 0.01 parts by mass
Cyan dispersion: 26.5 parts by mass
Composition for Forming a Magenta Colored Layer (Magenta Composition)

PGMEA: 80.99 parts by mass
Resin 1: 7 parts by mass
Polymerizable compound 4: 8.4 parts by mass
Photopolymerization Initiator 1: 2.3 parts by mass
Ultraviolet absorber 1: 1.3 parts by mass
Surfactant 1: 0.01 parts by mass
Magenta dispersion: 21 parts by mass
Composition for Forming a Yellow Colored Layer (Yellow Composition)
PGMEA: 45.69 parts by mass
Resin 2: 5.6 parts by mass
Polymerizable compound 4: 6.9 parts by mass
Photopolymerization Initiator 1: 1.1 parts by mass
Ultraviolet absorber 1: 1 part by mass
Surfactant 1: 0.01 parts by mass
Surfactant 2: 0.7 parts by mass
Yellow dispersion: 39 parts by mass The following components were mixed to prepare a composition for forming an infrared transmitting layer (IR-Pass composition).

Composition for Forming an Infrared Transmitting Layer
PGMEA: 14.79 parts by mass
Resin 2: 1.3 parts by mass
Polymerizable compound 4: 1.9 parts by mass
Photopolymerization Initiator 1: 1 part by mass
Surfactant 1: 0.01 part by mass
Red dispersion: 44 parts by mass
Blue dispersion: 37 parts by mass The following components were mixed to prepare a composition for forming a transparent layer.

Composition for Forming a Transparent Layer (Clear Composition)
PGMEA: 75.89 parts by mass
Resin 1: 8.3 parts by mass
Polymerizable compound 5: 12.5 parts by mass
Photopolymerization Initiator 1: 1.3 parts by mass
Ultraviolet absorber 1: 2 parts by mass
Surfactant 1: 0.01 parts by mass The following components were mixed to prepare a composition for forming a base layer.

Composition for Forming a Base Layer
PGMEA: 87.99 parts by mass
Resin 3: 12 parts by mass
Surfactant 1: 0.01 parts by mass The raw materials used in the compositions are as follows.

Green dispersion, Red dispersion, Blue dispersion, Magenta dispersion, Cyan dispersion, and Yellow dispersion: Each raw material described below was mixed in parts by mass described in "Dispersion" column of the table below, and 230 parts by mass of zirconia beads having a diameter of 0.3 mm were dispersed using a paint shaker for 5 hours, and the beads were separated by filtration. As a result, a dispersion was manufactured.

(Green Dispersion)
PGMEA: 83 parts by mass
C.I. Pigment Green 36 (PG36): 8 parts by mass
C.I. Pigment Yellow 150 (PY150): 5.5 parts by mass
Resin 4: 3 parts by mass
Resin 1: 0.5 parts by mass
(Red Dispersion)
PGMEA: 77.7 parts by mass
C.I. Pigment Red 254 (PR254): 8.5 parts by mass
C.I. Pigment Yellow 139 (PY139): 3.8 parts by mass
Pigment derivative 1: 2 parts by mass
Resin 5: 6 parts by mass
Resin 1: 2 parts by mass
(Blue Dispersion)
PGMEA: 82.7 parts by mass
C.I. Pigment Blue 15:6 (PB15:6): 11 parts by mass
C.I. Pigment Violet 23 (PV23): 3 parts by mass
Resin 6: 2 parts by mass
Resin 1: 1.3 parts by mass
(Cyan Dispersion)
PGMEA: 77.6 parts by mass
C.I. Pigment Green 7 (PG7): 14 parts by mass
Pigment derivative 1: 1.4 parts by mass
Resin 4: 7 parts by mass
(Magenta Dispersion)
PGMEA: 69.6 parts by mass
C.I. Pigment Red 177 (PR177): 19 parts by mass
Pigment derivative 1: 1.9 parts by mass
Resin 5: 9.5 parts by mass
(Yellow Dispersion)
PGMEA: 74.4 parts by mass
C.I. Pigment Yellow 150 (PY150): 16 parts by mass
Pigment derivative 1: 1.6 parts by mass
Resin 5: 8 parts by mass Resin 1: a resin having the following structure (acid value=32 mgKOH/g, Mw=11000). The numerical value written together with each repeating unit represents a molar ratio (mol %) of each repeating unit in a case where a total repeating unit is 100 mol %.

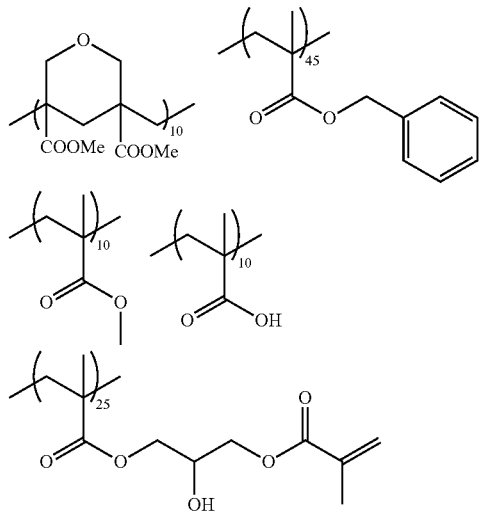

Resin 2: a resin having the following structure (acid value=112 mgKOH/g, Mw=30000). The numerical value written together with each repeating unit represents a molar ratio of each repeating unit.

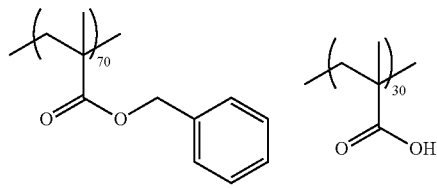

Resin 3: CYCLOMER P (manufactured by DAICEL-ALLNEX LTD.)
Resin 4: a resin having the following structure (acid value=36 mgKOH/g, Mw=21000). The numerical value written together with each repeating unit represents a molar ratio of each repeating unit. The numerical value written together with the repeating site on the side chain indicates the repeating number of repeating sites.

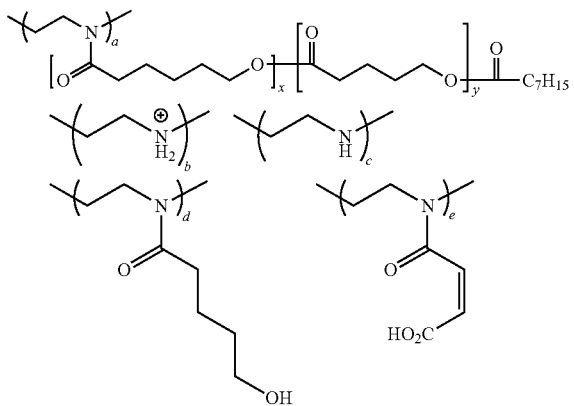

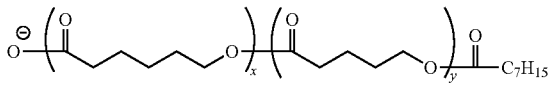

a/b/c/d/e = 36/4/35/1/24 (mol %)
x = 48
y = 12

Resin 5: a resin having the following structure (acid value=77 mgKOH/g, Mw=20000). The numerical value written together with each repeating unit represents a molar ratio of each repeating unit. The numerical value written together with the repeating site on the side chain indicates the repeating number of repeating sites.

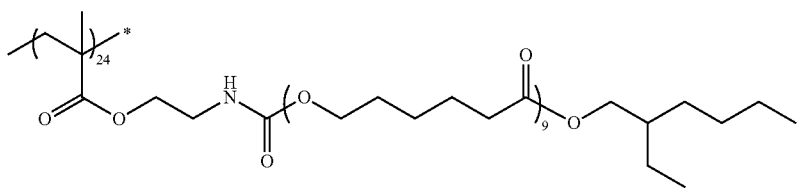

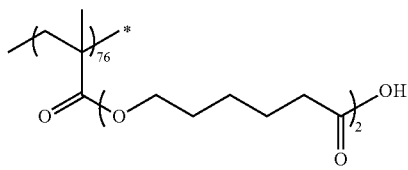

Resin 6: "Solsperse 36000" manufactured by The Lubrizol Corporation

Pigment derivative 1: Compounds having the following structure

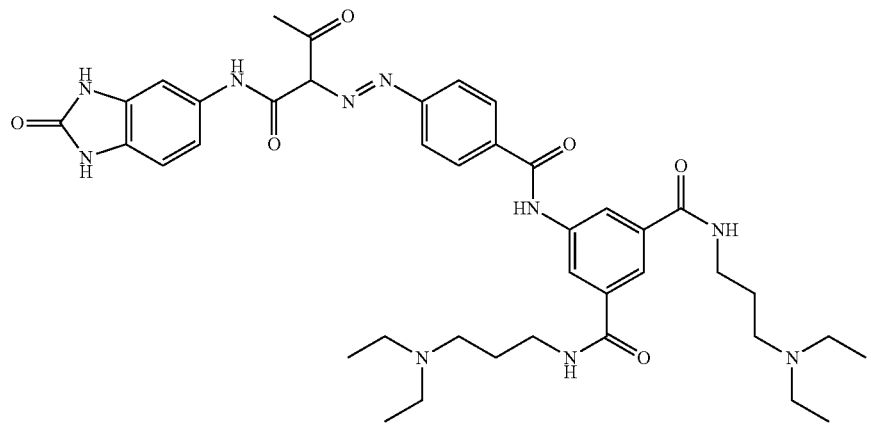 [SMILES: CCN(CC)CCCNC(=O)c1cc(NC(=O)c2ccc(/N=N/C(C(C)=O)C(=O)Nc3ccc4[nH]c(=O)[nH]c4c3)cc2)cc(C(=O)NCCCN(CC)CC)c1]

Polymerizable compound 1: ARONIX TO-2349 (manufactured by TOAGOSEI CO., LTD.)
Polymerizable compound 2: NK OLIGO UA-7200 (manufactured by Shin Nakamura Chemical Co., Ltd.)
Polymerizable compound 3: NK Ester A-DPH-12E (manufactured by Shin Nakamura Chemical Co., Ltd.)
Polymerizable compound 4: KAYARAD DPHA (manufactured by Nippon Kayaku Co., Ltd.)
Polymerizable compound 5: ARONIX M-510 (manufactured by TOAGOSEI CO., LTD.)
Photopolymerization initiator 1: IRGACURE OXE-01 (manufactured by BASF SE)
Ultraviolet absorber 1: Ultraviolet absorber (G-3) described above
Surfactant 1: The following mixture (Mw=14000, % indicating the ratio of repeating units is % by mass)

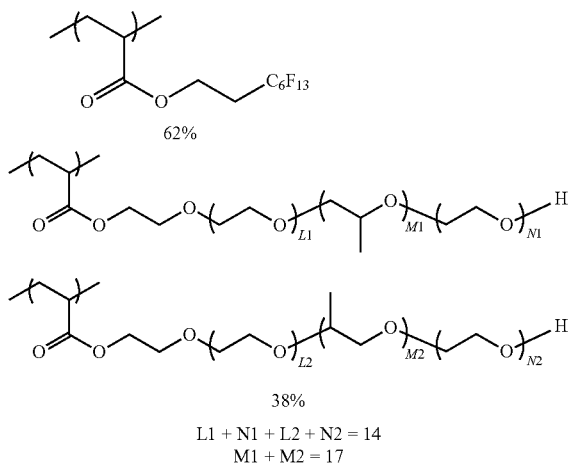

$L1 + N1 + L2 + N2 = 14$
$M1 + M2 = 17$

Surfactant 2: Pionin D6315 (manufactured by TAKEMOTO OIL&FAT Co., Ltd.)

[Manufacturing Laminate and Solid-State Imaging Element Having Laminate]

The composition for forming a base layer was applied to a silicon wafer that is partitioned into a two-dimensional array and has a photoelectric converter portion formed in each unit partition by using a spin coater so that the film thickness after drying is 0.1 µm, and the obtained composition layer was baked at 230° C. for 10 minutes to form a base layer. The solid-state imaging element having the laminate provided with the colored layer, the transparent layer, the light attenuating layer, and the lens was manufactured so that by using each composition, the dispositions according to any of FIGS. 3 to 6 were formed on the silicon wafer on which the base layer is formed. Each of the above compositions was used for forming the colored layer, the transparent layer, and the light attenuating layer, and the pattern was formed using the photolithography method. The thickness of each colored layer was 0.6 µm, the thickness of the transparent layer was 0.1 µm, and the thickness of the light attenuating layer was 0.5 µm. The used composition for forming a light attenuating layer and the evaluation results are shown in Table 5.

[Evaluation of Solid-State Imaging Element]
<Dynamic Range>

Regarding dynamic range of a solid-state imaging element, a method of subjectively evaluating an image print obtained by an actual image using the solid-state imaging element was implemented.

Photography was performed in a photo studio, and two tungsten type reflective photographic light bulbs having a general color temperature of 3200K were used as illumination.

The fineness of gradation of the obtained image print was evaluated by 10 panels. Each image print was evaluated in 10 stages, and the dynamic range of the solid-state imaging element of each Example was evaluated according to the following criteria by averaging the evaluation values of each panel. The results are shown in Table 5. A: The average evaluation value was 8.0 or more.

B: The average evaluation value was 6.0 or more and less than 8.0.

C: The average evaluation value was 4.0 or more and less than 6.0.

D: The average evaluation value was 2.0 or more and less than 4.0.

E: The average evaluation value was less than 2.0.

<Color Reproducibility>

Regarding color reproducibility of a solid-state imaging element, a method of subjectively evaluating an image print obtained by an actual image using the solid-state imaging element was implemented. Photography was carried out under the same conditions as described above, and the obtained image print was evaluated by the 10 panels in terms of whether or not the color of the subject is reproduced. Each image print was evaluated in 10 stages, and the color reproducibility of the solid-state imaging element of each Example was evaluated according to the following criteria by averaging the evaluation values of each panel. The results are shown in Table 5.

A: The average evaluation value was 8.0 or more.

B: The average evaluation value was 6.0 or more and less than 8.0.

C: The average evaluation value was 4.0 or more and less than 6.0.

D: The average evaluation value was 2.0 or more and less than 4.0.

E: The average evaluation value was less than 2.0.

TABLE 7

| Table 5 | Structure | Composition for forming light attenuating layer | Dynamic range | Color reproducibility |
| --- | --- | --- | --- | --- |
| Example 1 | FIG. 3 | Composition GY-1 | A | A |
| Example 2 | FIG. 3 | Composition GY-2 | A | A |
| Example 3 | FIG. 3 | Composition GY-3 | A | A |
| Example 4 | FIG. 3 | Composition GY-4 | A | A |
| Example 5 | FIG. 3 | Composition GY-5 | A | A |
| Example 6 | FIG. 3 | Composition GY-6 | A | A |
| Example 7 | FIG. 3 | Composition GY-7 | A | A |
| Example 8 | FIG. 3 | Composition GY-8 | A | A |
| Example 9 | FIG. 3 | Composition GY-9 | A | A |
| Example 10 | FIG. 3 | Composition GY-10 | A | A |
| Example 11 | FIG. 3 | Composition GY-11 | A | A |
| Example 12 | FIG. 3 | Composition GY-12 | A | A |
| Example 13 | FIG. 3 | Composition GY-13 | A | A |
| Example 14 | FIG. 3 | Composition GY-14 | A | A |
| Example 15 | FIG. 3 | Composition GY-15 | A | A |
| Example 16 | FIG. 3 | Composition GY-16 | A | C |
| Example 17 | FIG. 3 | Composition GY-17 | A | B |
| Example 18 | FIG. 3 | Composition GY-18 | A | A |
| Example 19 | FIG. 3 | Composition GY-19 | A | A |
| Example 20 | FIG. 3 | Composition GY-20 | A | A |
| Example 21 | FIG. 3 | Composition GY-21 | A | B |
| Example 22 | FIG. 3 | Composition GY-22 | B | B |
| Example 23 | FIG. 3 | Composition GY-23 | B | B |
| Example 24 | FIG. 3 | Composition GY-24 | B | B |
| Example 25 | FIG. 3 | Composition GY-25 | A | B |
| Example 26 | FIG. 3 | Composition GY-26 | C | B |

TABLE 7-continued

| Table 5 | Structure | Composition for forming light attenuating layer | Dynamic range | Color reproducibility |
|---|---|---|---|---|
| Example 27 | FIG. 3 | Composition GY-27 | C | B |
| Example 28 | FIG. 3 | Composition GY-28 | C | B |
| Example 29 | FIG. 3 | Composition GY-29 | C | B |
| Example 30 | FIG. 3 | Composition GY-30 | C | C |
| Example 31 | FIG. 4 | Composition GY-3 | A | A |
| Example 32 | FIG. 5 | Composition GY-3 | A | A |
| Example 33 | FIG. 6 | Composition GY-3 | A | A |
| Example 34 | FIG. 4 | Composition GY-26 | C | B |
| Example 35 | FIG. 5 | Composition GY-26 | C | B |
| Example 36 | FIG. 6 | Composition GY-26 | C | B |
| Comparative Example 1 | FIG. 3 | Comparative composition GY-1 | B | E |
| Comparative Example 2 | FIG. 3 | Comparative composition GY-2 | C | E |
| Comparative Example 3 | FIG. 3 | Comparative composition GY-3 | D | E |
| Comparative Example 4 | FIG. 4 | Comparative composition GY-1 | B | E |
| Comparative Example 5 | FIG. 4 | Comparative composition GY-2 | C | E |
| Comparative Example 6 | FIG. 4 | Comparative composition GY-3 | D | E |
| Comparative Example 7 | FIG. 5 | Comparative composition GY-3 | D | E |
| Comparative Example 8 | FIG. 6 | Comparative composition GY-3 | D | E |

As described in Table 5, the solid-state imaging elements of Examples 1 to 36 having the laminate, in which the colored layer and the light attenuating layer are laminated, and the difference $\Delta T_1$ between the maximum value and the minimum value of light transmittance of the light attenuating layer in the wavelength range of 400 to 700 nm is 10% or less, had excellent color reproducibility. On the other hand, the effect of the present invention was not obtained in the solid-state imaging element which does not have the above laminate according to each Comparative Example.

The solid-state imaging element of Example 1 in which the difference $\Delta T_1$ between the maximum value and the minimum value of light transmittance of the light attenuating layer in the wavelength range of 400 to 700 nm is 6.0% or less, had more excellent color reproducibility than the solid-state imaging element of Example 16.

Example 37

The composition for forming a base layer was applied to a silicon wafer that is partitioned into a two-dimensional array and has a photoelectric converter portion formed in each unit partition by using a spin coater so that the film thickness after drying is 0.1 μm, and the obtained composition layer was baked at 230° C. for 10 minutes to form a base layer. The solid-state imaging element having the laminate provided with the colored layer, the transparent layer, the light attenuating layer (composition for forming a light attenuating layer GY-1), the infrared transmitting layer, and the lens was manufactured so that by using each composition, the disposition according to FIG. 7 was formed on the silicon wafer on which the base layer is formed. Each of the above compositions was used for forming the colored layer, the transparent layer, and the infrared transmitting layer, and the pattern was formed using the photolithography method. The thickness of each colored layer was 0.6 μm, the thickness of the transparent layer was 0.1 μm, and the thickness of the light attenuating layer was 0.5 μm.

In a case where the dynamic range and the color reproducibility were measured using the solid-state imaging element, the evaluation was the same as in Example 1.

EXPLANATION OF REFERENCES 10, 20, 80, 90, 91: unit pixel
11: lens
12: colored layer
13: light attenuating layer
14: first laminate
15: substrate
16: first photoelectric converter portion
21: transparent layer
22: second laminate
23: second photoelectric converter portion

What is claimed is:
1. A solid-state imaging element comprising:
a plurality of disposed unit pixels,
wherein each of the unit pixels has a first photoelectric converter portion and a second photoelectric converter portion,
a laminate is disposed on a side of the first photoelectric converter portion to which light is incident,
the laminate includes a colored layer and a light attenuating layer laminated to each other,
each of the colored layer and the light attenuating layer contains the same resin selected from the group consisting of a methacrylic resin, an acrylic resin, a phenol resin, a melamine resin, an epoxy resin, a urea resin, an unsaturated polyester resin, and an alkyd resin, and
a difference $\Delta T_1$ between a maximum value and a minimum value of light transmittance of the light attenuating layer in a wavelength range of 400 to 700 nm is 10% or less.
2. The solid-state imaging element according to claim 1, wherein the difference $\Delta T_1$ is 6.0% or less.
3. The solid-state imaging element according to claim 1, wherein a difference $\Delta T_2$ between a maximum value and a minimum value of light transmittance of the light attenuating layer in a wavelength range of 700 to 1000 nm is 10% or less.
4. The solid-state imaging element according to claim 3, wherein the difference $\Delta T_2$ is 6.0% or less.
5. The solid-state imaging element according to claim 1, wherein light transmittance of the light attenuating layer at a wavelength of 550 nm is 5.0% to 75%.
6. The solid-state imaging element according to claim 5, wherein light transmittance of the light attenuating layer at a wavelength of 550 nm is 5.0% to 20%.
7. The solid-state imaging element according to claim 1, wherein the light attenuating layer contains an inorganic pigment and a colorant different from the inorganic pigment.
8. The solid-state imaging element according to claim 7, wherein the inorganic pigment is at least one selected from the group consisting of nitride containing at least one of metal selected from the group consisting of Ti, Zr, Hf, V, Nb, and Ta; oxide containing the metal; and oxynitride containing the metal.
9. The solid-state imaging element according to claim 8, wherein the inorganic pigment is at least one selected from the group consisting of titanium nitride, titanium oxynitride, and zirconium oxynitride.

10. The solid-state imaging element according to claim 8, wherein
the colorant is a carbon black or an organic pigment, and
the organic pigment is at least one selected from the group consisting of a yellow pigment, a violet pigment, an orange pigment, and a red pigment.

11. The solid-state imaging element according to claim 10, wherein the organic pigment is a yellow pigment and a violet pigment.

12. The solid-state imaging element according to claim 1, wherein the first photoelectric converter portion is less sensitive than the second photoelectric converter portion.

13. The solid-state imaging element according to claim 12, wherein a lens for condensing incident light is not formed on the first photoelectric converter portion.

14. The solid-state imaging element according to claim 1, further comprising:
a second laminate in which a colored layer and a transparent layer are laminated,
wherein the second laminate is disposed on a side of the second photoelectric converter portion to which light is incident.

15. The solid-state imaging element according to claim 14, wherein each of the light attenuating layer and the transparent layer contains the same resin selected from the group consisting of a methacrylic resin, an acrylic resin, a phenol resin, a melamine resin, an epoxy resin, a urea resin, an unsaturated polyester resin, and an alkyd resin.

16. The solid-state imaging element according to claim 1, wherein an area of the unit pixels having the second photoelectric converter portion is larger than an area of the unit pixels having the first photoelectric converter portion.

17. The solid-state imaging element according to claim 1, wherein a ratio of a total area of the unit pixels in which the laminate is disposed to a total area of the unit pixels included in the solid-state imaging element is in a range of 5.0% to 30%.

18. The solid-state imaging element according to claim 1, wherein a lens for condensing incident light is formed on the first photoelectric converter portion.

19. The solid-state imaging element according to claim 18, wherein the lens contains at least one of a resin selected from the group consisting of a methacrylic resin, an acrylic resin, a phenol resin, a melamine resin, an epoxy resin, a urea resin, an unsaturated polyester resin, and an alkyd resin.

20. The solid-state imaging element according to claim 19, wherein the light attenuating layer further contains the same resin as the lens.

21. The solid-state imaging element according to claim 19, wherein the colored layer further contains the same resin as the lens.

22. The solid-state imaging element according to claim 18, wherein the colored layer, the light attenuating layer, and the lens contain the same resin selected from the group consisting of a methacrylic resin, an acrylic resin, a phenol resin, a melamine resin, an epoxy resin, a urea resin, an unsaturated polyester resin, and an alkyd resin.

23. The solid-state imaging element according to claim 18, wherein the lens is a glass lens.

24. The solid-state imaging element according to claim 1, wherein the unit pixel includes at least one selected from the group consisting of a red pixel, a green pixel, and a blue pixel.

25. The solid-state imaging element according to claim 24, wherein
the red pixel contains at least one of pigment selected from the group consisting of PR254, PR264, PR177, and PY139,
the green pixel contains at least one of pigment selected from the group consisting of PG58, PG59, PG36, PG7, PY139, PY185, and PY150, and
the blue pixel contains at least one of pigment selected from the group consisting of PB15:6, PB16, and PV23.

26. A solid-state imaging element comprising:
a plurality of disposed unit pixels,
wherein each of the unit pixels has a first photoelectric converter portion and a second photoelectric converter portion,
a laminate is disposed on a side of the first photoelectric converter portion to which light is incident,
the laminate includes a colored layer and a light attenuating layer laminated to each other,
each of the colored layer and the light attenuating layer contains the same resin selected from the group consisting of a methacrylic resin, an acrylic resin, a phenol resin, a melamine resin, an epoxy resin, a urea resin, an unsaturated polyester resin, and an alkyd resin,
the colored layer is at least one selected from the group consisting of a green colored layer, a red colored layer, a blue colored layer, a cyan colored layer, a magenta colored layer, and a yellow colored layer; and
the light attenuating layer contains an inorganic pigment and a colorant different from the inorganic pigment.

27. The solid-state imaging element according to claim 26, wherein the difference $\Delta T_1$ between a maximum value and a minimum value of light transmittance of the light attenuating layer in a wavelength range of 400 to 700 nm is 10% or less.

28. A laminate comprising:
a colored layer and a light attenuating layer laminated to each other,
wherein each of the colored layer and the light attenuating layer contains the same resin selected from the group consisting of a methacrylic resin, an acrylic resin, a phenol resin, a melamine resin, an epoxy resin, a urea resin, an unsaturated polyester resin, and an alkyd resin,
a difference $\Delta T1$ between a maximum value and a minimum value of light transmittance of the light attenuating layer in a wavelength range of 400 to 700 nm is 10% or less, and
the light transmittance of the light attenuating layer at a wavelength of 550 nm is 5.0% to 45%.

* * * * *